United States Patent
Barton et al.

(10) Patent No.: US 9,912,303 B2
(45) Date of Patent: Mar. 6, 2018

(54) RF-INPUT / RF-OUTPUT OUTPHASING AMPLIFIER

(71) Applicant: Massachusetts Institute of Technology, Cambridge, MA (US)

(72) Inventors: Taylor W. Barton, Boston, MA (US); David J. Perreault, Andover, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/823,220

(22) Filed: Aug. 11, 2015

(65) Prior Publication Data

US 2015/0365052 A1 Dec. 17, 2015

Related U.S. Application Data

(63) Continuation-in-part of application No. 13/837,009, filed on Mar. 15, 2013, now Pat. No. 9,141,832.
(Continued)

(51) Int. Cl.
*H03F 3/68* (2006.01)
*H03F 3/19* (2006.01)
(Continued)

(52) U.S. Cl.
CPC .............. *H03F 3/19* (2013.01); *H03F 1/025* (2013.01); *H03F 1/0266* (2013.01);
(Continued)

(58) Field of Classification Search
CPC .......... H03F 3/19; H03F 1/025; H03F 1/0266; H03F 1/0294; H03F 1/3241; H03F 1/56;
(Continued)

(56) References Cited

U.S. PATENT DOCUMENTS

| | | | |
|---|---|---|---|
| 4,129,839 A | 12/1978 | Galani et al. | |
| 4,835,493 A | 5/1989 | Walsh, Jr. | |

(Continued)

FOREIGN PATENT DOCUMENTS

| | | | |
|---|---|---|---|
| EP | 1 583 228 B1 | 10/2005 | |
| WO | WO 2005/106613 A1 | 11/2005 | |

(Continued)

OTHER PUBLICATIONS

U.S. Appl. No. 15/149,491, filed May 9, 2016, Perreault, et al.
(Continued)

*Primary Examiner* — Khanh V Nguyen
(74) *Attorney, Agent, or Firm* — Daly, Crowley, Mofford & Durkee, LLP

(57) ABSTRACT

A power combining and outphasing system and related techniques for simultaneously providing both wide-bandwidth linear amplification and high average efficiency is described. Providing linear amplification encompasses the ability to dynamically control an RF output power level over a wide range while still operating over a wide frequency bandwidth. The system and techniques described herein also operate to maintain high efficiency across a wide range of output power levels, such that a high average efficiency can be achieved for highly modulated output waveforms.

19 Claims, 53 Drawing Sheets

Related U.S. Application Data which is a continuation-in-part of application No. 13/020,568, filed on Feb. 3, 2011, now Pat. No. 8,451,053.

(60) Provisional application No. 61/300,963, filed on Feb. 3, 2010, provisional application No. 62/036,228, filed on Aug. 12, 2014.

(51) Int. Cl.
| | | |
|---|---|---|
| H03F 1/02 | (2006.01) | |
| H03F 1/56 | (2006.01) | |
| H03F 1/32 | (2006.01) | |
| H03F 3/24 | (2006.01) | |
| H03F 3/60 | (2006.01) | |
| H03F 3/21 | (2006.01) | |

(52) U.S. Cl.
CPC ......... *H03F 1/0294* (2013.01); *H03F 1/3241* (2013.01); *H03F 1/56* (2013.01); *H03F 3/245* (2013.01); *H03F 3/211* (2013.01); *H03F 3/602* (2013.01); *H03F 3/68* (2013.01); *H03F 2200/06* (2013.01); *H03F 2200/09* (2013.01); *H03F 2200/451* (2013.01); *H03F 2200/541* (2013.01); *H03F 2203/211* (2013.01)

(58) Field of Classification Search
CPC . H03F 3/245; H03F 3/60; H03F 3/602; H03F 3/68; H03F 3/211; H03F 3/605; H03F 2200/451; H03F 3/24; H03F 1/0205; H03F 2200/336; H03F 3/193; H03F 2200/387; H03F 3/195; H03F 1/0227; H03F 1/32; H03F 1/02
USPC ...................... 330/124 R, 286, 295
See application file for complete search history.

(56) References Cited

U.S. PATENT DOCUMENTS

| | | | |
|---|---|---|---|
| 5,012,200 A | 4/1991 | Meinzer | |
| 5,111,157 A * | 5/1992 | Komiak | H03F 3/604 330/286 |
| 5,162,756 A | 11/1992 | Taniguchi et al. | |
| 5,528,209 A * | 6/1996 | Macdonald | H01L 27/0605 257/691 |
| 5,955,926 A * | 9/1999 | Uda | H03F 3/604 330/295 |
| 6,825,719 B1 | 11/2004 | Barak et al. | |
| 7,279,971 B2 | 10/2007 | Hellberg et al. | |
| 7,411,449 B2 | 8/2008 | Klingberg et al. | |
| 7,474,156 B2 * | 1/2009 | Fujii | H03F 3/602 330/124 R |
| 7,535,133 B2 | 5/2009 | Perreault et al. | |
| 7,589,605 B2 | 9/2009 | Perreault et al. | |
| 7,629,844 B2 | 12/2009 | Elmala | |
| 7,724,839 B2 * | 5/2010 | Chen | H03F 1/0205 375/296 |
| 7,729,445 B2 * | 6/2010 | Ravi | H03F 1/0294 375/297 |
| 7,889,519 B2 | 2/2011 | Perreault et al. | |
| 7,929,923 B2 | 4/2011 | Elmala | |
| 7,956,572 B2 | 6/2011 | Zane et al. | |
| 8,005,445 B2 * | 8/2011 | Kuriyama | H03F 1/0205 330/124 R |
| 8,026,763 B2 | 9/2011 | Dawson et al. | |
| 8,164,384 B2 | 4/2012 | Dawson et al. | |
| 8,212,541 B2 | 7/2012 | Perreault et al. | |
| 8,354,882 B2 * | 1/2013 | Blednov | H03F 1/0288 330/124 R |
| 8,451,053 B2 | 5/2013 | Perreault et al. | |
| 8,718,188 B2 | 5/2014 | Balteanu et al. | |
| 8,824,978 B2 | 9/2014 | Briffa et al. | |
| 8,829,993 B2 | 9/2014 | Briffa et al. | |
| 8,830,710 B2 | 9/2014 | Perreault et al. | |
| 2005/0248401 A1 | 11/2005 | Hellberg et al. | |
| 2005/0286278 A1 | 12/2005 | Perreault et al. | |
| 2006/0006938 A1 | 1/2006 | Burns et al. | |
| 2008/0290948 A1 * | 11/2008 | Fujii | H03F 3/602 330/295 |
| 2011/0135035 A1 | 6/2011 | Bose et al. | |
| 2011/0187437 A1 | 8/2011 | Perreault | |
| 2012/0176195 A1 | 7/2012 | Dawson et al. | |
| 2012/0313602 A1 | 12/2012 | Perreault et al. | |
| 2012/0326684 A1 | 12/2012 | Perreault et al. | |
| 2013/0241625 A1 | 9/2013 | Perreault et al. | |
| 2013/0343106 A1 | 12/2013 | Perreault et al. | |
| 2013/0343107 A1 | 12/2013 | Perreault | |
| 2014/0118063 A1 | 5/2014 | Briffa et al. | |
| 2014/0118065 A1 | 5/2014 | Briffa et al. | |
| 2014/0118072 A1 | 5/2014 | Briffa et al. | |
| 2014/0120854 A1 | 5/2014 | Briffa et al. | |
| 2014/0125412 A1 | 5/2014 | Dawson et al. | |
| 2014/0132354 A1 | 5/2014 | Briffa et al. | |
| 2014/0167513 A1 | 6/2014 | Chang et al. | |
| 2014/0225581 A1 | 8/2014 | Guiliano et al. | |
| 2014/0226378 A1 | 8/2014 | Perreault | |
| 2014/0313781 A1 | 10/2014 | Perreault et al. | |
| 2014/0335805 A1 | 11/2014 | Briffa et al. | |
| 2014/0339918 A1 | 11/2014 | Perreault et al. | |
| 2014/0355322 A1 | 12/2014 | Perreault et al. | |
| 2015/0023063 A1 | 1/2015 | Perreault et al. | |
| 2015/0084701 A1 | 3/2015 | Perreault et al. | |
| 2015/0155895 A1 | 6/2015 | Perreault et al. | |
| 2015/0171768 A1 | 6/2015 | Perreault | |
| 2015/0188448 A1 | 6/2015 | Perreault | |
| 2015/0194940 A1 | 7/2015 | Briffa et al. | |

FOREIGN PATENT DOCUMENTS

| | | | |
|---|---|---|---|
| WO | WO 2006/119362 A2 | 11/2006 | |
| WO | WO 2007/082090 A2 | 7/2007 | |
| WO | WO 2007/094921 A1 | 8/2007 | |
| WO | WO 2009/153218 A1 | 12/2009 | |
| WO | WO 2010/056646 A1 | 5/2010 | |
| WO | WO 2011/097387 A1 | 8/2011 | |
| WO | WO 2013/109719 A1 | 7/2013 | |
| WO | WO 2013/109743 A2 | 7/2013 | |
| WO | WO 2013/109797 A1 | 7/2013 | |
| WO | WO 2013/134573 A1 | 9/2013 | |
| WO | WO 2013/191757 A1 | 12/2013 | |
| WO | WO 2014/004241 A2 | 1/2014 | |
| WO | WO 2014/028441 A2 | 2/2014 | |
| WO | WO 2014/070474 A1 | 5/2014 | |
| WO | WO 2014/070475 A1 | 5/2014 | |
| WO | WO 2014/070998 A1 | 5/2014 | |
| WO | WO 2014/085097 A1 | 6/2014 | |

OTHER PUBLICATIONS

U.S. Appl. No. 14/934,760, filed Nov. 6, 2015, Briffa, et al.
U.S. Appl. No. 14/920,031, filed Oct. 22, 2015, Briffa, et al.
U.S. Appl. No. 14/435,914, filed Apr. 15, 2015, Perreault et al.
U.S. Appl. No. 14/758,033, filed Jun 26, 2015, Perreault et al.
U.S. Appl. No. 14/791,685, filed Jul. 6, 2015, Perreault et al.
H. Chireix, "High Power Outphasing Modulation;" Proceedings of the Institute of Radio Engineers (IRE), vol. 23, No. 11; Nov. 1935; 23 Pages.
D.C. Cox, "Linear Amplification with Nonlinear Components;" Proceedings of the IEEE Transactions on Communications Conference, vol. COM-22; Dec. 1974; 4 Pages.
Liang et al., "Transmitter Linearization by Beamforming;" Ph.D Dissertation, University of California Los Angeles; Proceedings of the IEEE Journal of Solid-State Circuits, vol. 46, No. 9; Sep. 2011; 14 Pages.
Goel et al., "Secret Communication in Presence of Colluding Eavesdroppers;" Proceedings of the IEEE Military Communications Conference (MILCOM 2005), Oct. 2005; 6 Pages.

(56) References Cited

OTHER PUBLICATIONS

Pellegrini et al., "Cryptographically Secure Radios Based on Directional Modulation;" Proceedings of the IEEE International Conference on Acoustics, Speech and Signal Processing (ICASSP); May 2014; 5 Pages.
Hur et al., "Highly Efficient Uneven Multi-Level LINC Transmitter;" Electronics Letters, vol. 45, No. 16; Jul. 30, 2009; 2 Pages.
Michael P. Daly, "Physical Layer Encryption Using Fixed and Reconfigurable Antennas;" Ph.D. Dissertation, University of Illinois at Urbana-Champaign; 2012; 119 Pages.
Tyler, "A New High-Efficiency High-Power Amplifier;" The Marconi Review, No. 130 vol. XXI; $3^{rd}$ Quarter 1958; Aug. 27, 1958; 15 Pages.
Beltran, et al.; "HF Outphasing Transmitter Using Class-E Power Amplifiers;" Microwave Symposium Digest, IEEE; Jun. 2009; 4 Pages.
Bifrane, et al.; "On the Linearity and Efficiency of Outphasing Microwave Amplifiers;" IEEE Transactions on Microwave Theory and Techniques; vol. 52; No. 7; Jul. 2004; 7 Pages.
Chen, et al.; "A High Efficiency Outphasing Transmitter Structure for Wireless Communications;" Digital Signal Processing Workshop, IEEE; Jan. 2009; 5 Pages.
El-Hamamsy; "Design of High-Efficiency RF Class-D Power Amplifier;" IEEE Transactions on Power Electronics; vol. 9; No. 3; May 1994; 12 Pages.
Eun, et al.; "A High Linearity Chireix Outphasing Power Amplifier Using Composite Right/Left-Handed Transmission Lines;" Proceedings of the $37^{th}$ European Microwave Conference; Oct. 2007; 12 Pages.
Everitt, et al.; "Chapter 11: Impedance Transformation;" Communication Engineering, $3^{rd}$ Edition; New York: McGraw-Hill; 1956; 25 Pages.
Gerhard, et al.; "Improved Design of Outphasing Power Amplifier Combiners;" 2009 German Microwave Conference; Mar. 2009; 4 Pages.
Godoy, et al.; "Outphasing Energy Recovery Amplifier With Resistance Compression for Improved Efficiency;" IEEE Transactions on Microwave Theory and Techniques; vol. 57; No. 12; Dec. 2009; 12 Pages.
Hakala, et al., "A 2.14-GHz Chireix Outphasing Transmitter;" IEEE Transactions on Microwave Theory and Techniques; vol. 53; No. 6; Jun. 2005; 10 Pages.
Hakala, et al.; Chireix Power Combining with Saturated Class-B Power Amplifiers; $12^{th}$ GAAS Symposium; Oct. 2004; 4 Pages.
Hamill; "Impedance Plan Analysis of Class DE Amplifier;" Electronics Letters; vol. 30; No. 23; Nov. 10, 1994; 2 Pages.
Hamill; "Time Reversal Duality Between Linear Networks;" IEEE Transactions on Circuits and Systems-I: Fundamental Theory and Applications; vol. 43; No. 1; Jan. 1996; 3 Pages.
Hamill; "Time Reversal Duality in Dc-Dc Converters;" Power Electronics Specialists Conference, IEEE; vol. 1; Jun. 1997; 7 Pages.
Han, et al.; "Analysis and Design of High Efficiency Matching Networks;" IEEE Transactions on Power Electronics; vol. 21; No. 5, Sep. 2006; 8 Pages.
Han, et al.; "Resistance Compression Networks for Radio-Frequency Power Conversion;" IEEE Transactions on Power Electronics; vol. 22; No. 1; Jan. 2007; 13 Pages.
Honjo; "A Simple Circuit Synthesis Method for Microwave Class-F Ultra-High-Efficiency Amplifiers with Reactance-Compensation Circuits;" Solid-State Electronics 44; Feb. 2000; 6 Pages.
Hur, et al.; "A Multi-Level and Multi-Band Class-D CMOS Power Amplifier for the LINC System in the Cognitive Radio Application;" IEEE Microwave and Wireless Components Letters; vol. 20; Issue 6; Jun. 2010; 3 Pages.
Hur, et al.; "Highly Efficient and Linear Level Shifting Digital LINC Transmitter with a Phase Offset Cancellation;" Radio & Wireless Symposium; Jan. 2009; 4 Pages.

Kee, et al.; "The Class-E/F Family of ZVS Switching Amplifiers;" IEEE Transactions on Microwave Theory and Techniques; vol. 51; No. 6; Jun. 2003; 14 Pages.
Kruass, et al.; "Chapter 14: High-Efficiency Power Amplifiers;" Solid State Radio Engineering; New York: Wiley; 1980; 23 Pages.
Langridge, et al.; "A Power Re-Use Technique for Improved Efficiency of Outphasing Microwave Power Amplifiers;" IEEE Transactions on Microwave Theory and Techniques; vol. 47; No. 8; Aug. 1999; 4 Pages.
Lee, "Chapter 20: RF Power Amplifiers;" Planar Microwave Engineering; New York: Cambridge University Press, 2004; 58 Pages.
Lepine, et al.; "L-Band LDMOS Power Amplifiers Based on an Inverse Class-F Architecture;" IEEE Transactions on Microwave Theory and Techniques; vol. 53; No. 6; Jun. 2005; 6 Pages.
Ni, et al.; "A New Impedance Match Method in Serial Chireix Combiner;" 2008 Asia-Pacific Microwave Conference; Dec. 2008; 4 Pages.
Perreault; A New Power Combining and Outphasing Modulation System for High-Efficiency Power Amplification; Circuits and Systems (MWSCAS), $53^{rd}$ IEEE, International Midwest Symposium; Aug. 2010; 14 Pages.
Phinney, et al.; "Radio-Frequency Inverters with Transmission-Line Input Networks;" IEEE Transactions on Power Electronics; vol. 22; No. 4; Jul. 2007; 8 Pages.
Qureshi, et al.; "A 90-W Peak Power GaN Outphasing Amplifier with Optimum Input Signal Conditioning;" IEEE Transactions on Microwave Theory and Techniques; vol. 57; No. 8; Aug. 2009; 11 Pages.
Raab; "Class-F Power Amplifiers with Maximally Flat Waveforms;" IEEE Transactions on Microwave Theory and Techniques; vol. 45; No. 11; Nov. 1997; 6 Pages.
Raab; "Efficiency of Outphasing RF Power-Amplifier Systems;" IEEE Transactions on Communications; vol. Com-33; No. 10; Oct. 1985; 6 Pages.
Raab, et al.; "RF and Microwave Power Amplifier and Transmitter Technologies—Part 3;" High Frequency Electronics; Sep. 2003; 9 Pages.
Rivas, et al.; "A High-Frequency Resonant Inverter Topology with Low-Voltage Stress;" IEEE Transactions on Power Electronics; vol. 23; No. 4; Jul. 2008; 13 Pages.
Sokal, et al.; "Class E-A New Class of High-Efficiency Tuned Single-Ended Switching Power Amplifiers;" IEEE Journal of Solid-State Circuits; vol. SC-10; No. 3; Jun. 1975; 9 Pages.
Sokal; "Class-E RF Power Amplifiers;" QEX; Jan./Feb. 2001; 12 Pages.
Yao, et al.; "Power Amplifier Selection for LINC Applications;" IEEE Transactions on Circuits and Systems—II: Express Briefs; vol. 53; No. 8; Aug. 2006; 5 Pages.
Zhang, et al.; "Analysis of Power Recycling Techniques for RF and Microwave Outphasing Power Amplifiers;" IEEE Transactions on Circuits and Systems—II: Analog and Digital Signal Processing; vol. 49; No. 5; May 2002; 9 Pages.
Zhukov, et al.; "Push-pull switching oscillator without commutating losses;"Poluprovodnikovye Pribory v. Tekhnike Elektrosvyazi, No. 15, Jan. 1975, 8 Pages.
Xu, et al.; "A 28.1dBm class-D outphasing power amplifier in 45nm LP digital CMOS;" Symposium on VLSI Circuits Digest of Technical Papers; Jun. 16, 2009; 2 Pages.
Zhou, et al.; "A Distributed Active Transformer Coupled Outphasing Power Combiner;" Microwave Conference, IEEE; Dec. 7, 2009; 4 Pages.
PCT International Search Report and Written Opinion for International Application No. PCT/US2011/023613 dated May 30, 2011; 12 Pages.
PCT International Preliminary Report and Written Opinion for International Application No. PCT/US2011/023613 dated Aug. 16, 2012; 7 Pages.
U.S. Appl. No. 13/020,568; 200 Pages.
U.S. Appl. No. 13/020,568; 126 Pages.
U.S. Appl. No. 13/837,009; 200 Pages.
U.S. Appl. No. 13/837,009; 61 Pages.
U.S. Appl. No. 14/837,616, filed Aug. 27, 2015, Briffa, et al.
U.S. Appl. No. 14/968,045, filed Dec. 14, 2015, Perreault et al.

(56) References Cited

OTHER PUBLICATIONS

U.S. Appl. No. 14/974,563, filed Dec. 18, 2015, Perreault et al.
U.S. Appl. No. 14/975,742, filed Dec. 19, 2015, Perreault et al.
U.S. Appl. No. 15/290,402, filed Oct. 11, 2016, Perreault, et al.
U.S. Appl. No. 15/287,068, filed Oct. 6, 2016, Briffa, et al.
U.S. Appl. No. 15/354,170, filed Nov. 17, 2016, Briffa, et al.
Communication pursuant to Article 94(3) EPC dated Dec. 19, 2016 for Application No. 11 705 335.5; 5 Pages.
Response to the communication dated Dec. 19, 2016 for European Pat. App. No. EP11705335.5 as filed on Mar. 17, 2017; 6 Pages.
Communication pursuant to Article 94(3) EPC dated Sep. 27, 2017 from Application No. 11705335.5; 5 Pages.

* cited by examiner

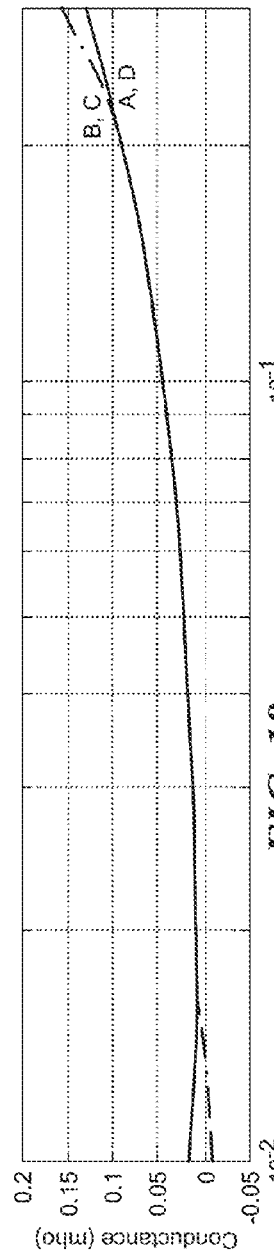
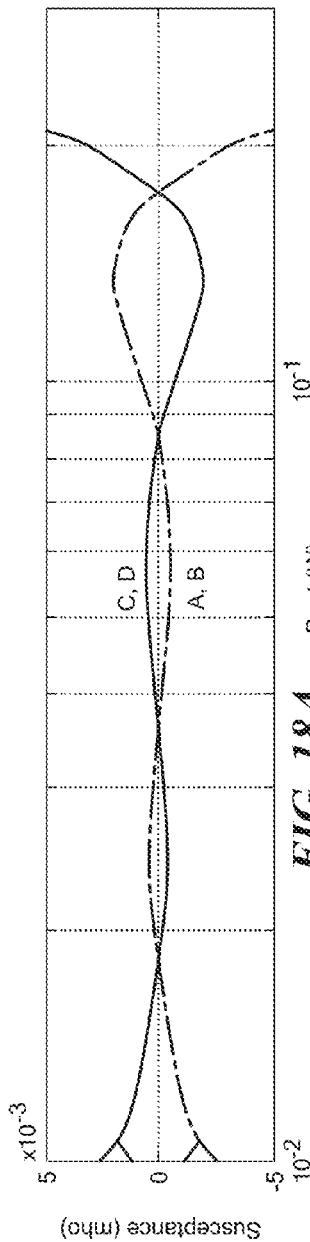
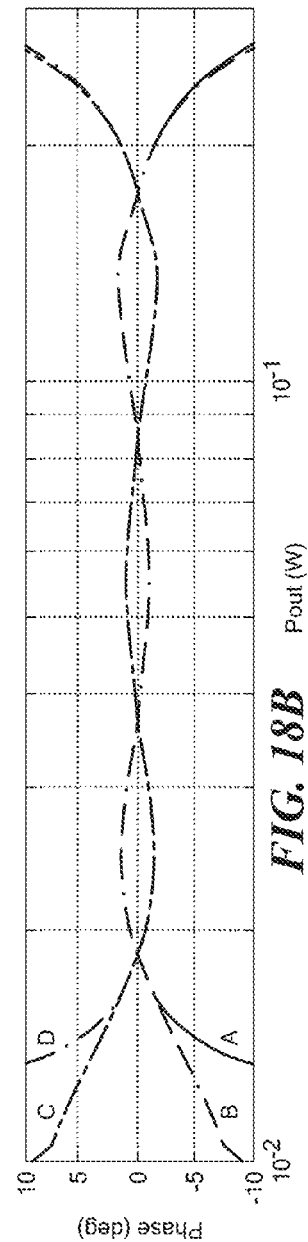
FIG. 18
FIG. 18A
FIG. 18B

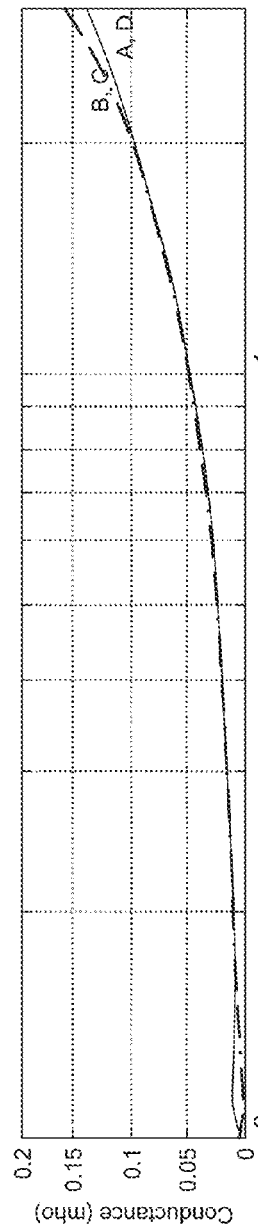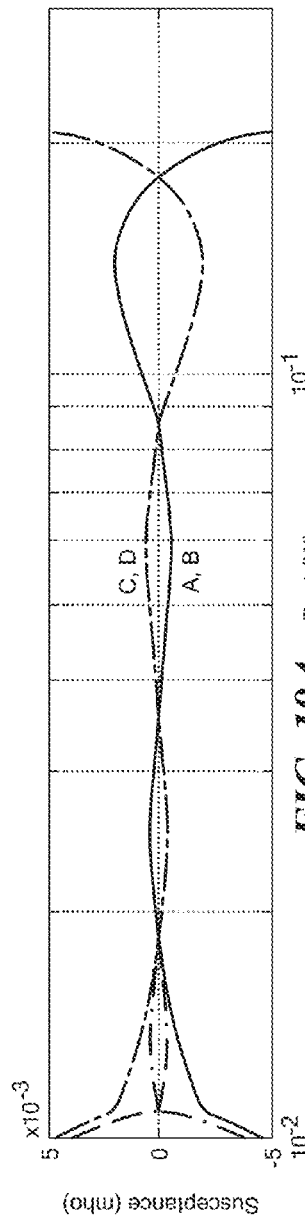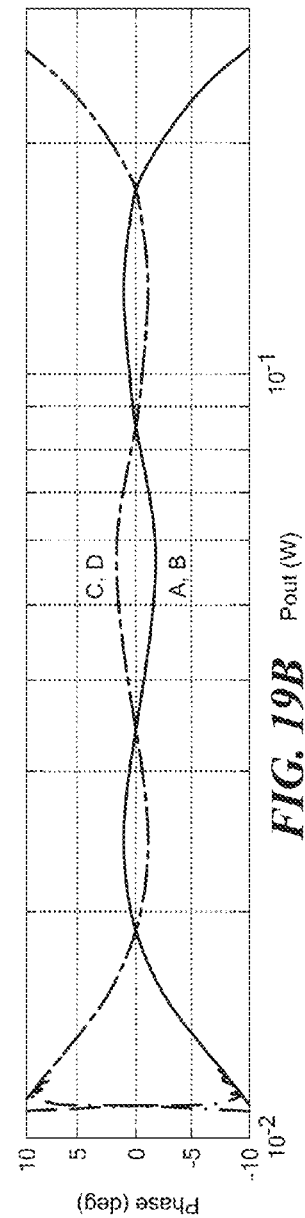

(B)

(C)

(D)

(E)

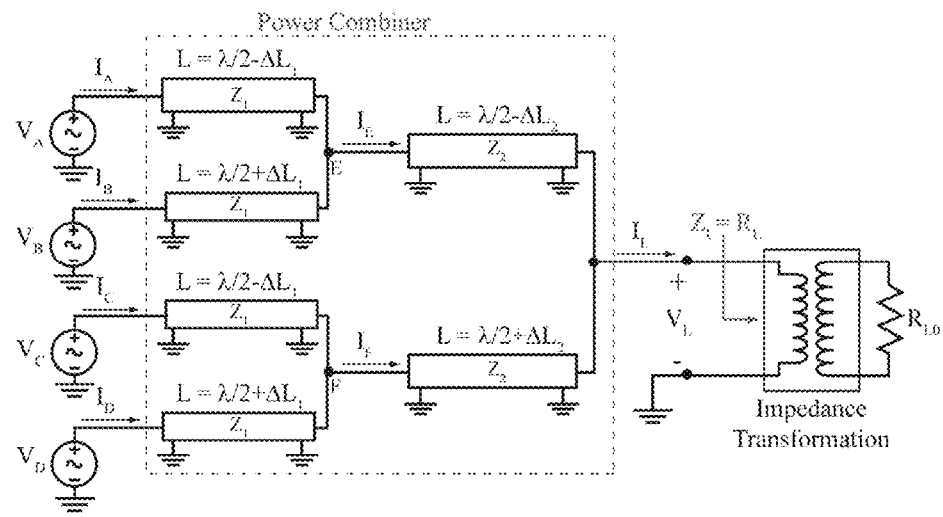
Fig. 40
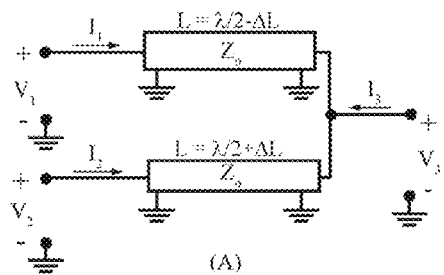
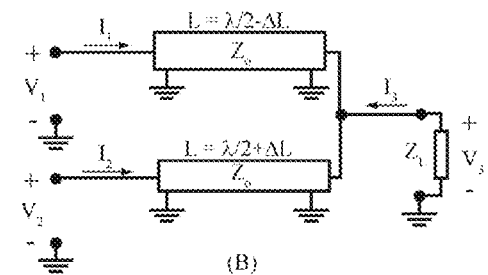
Fig. 41A
Fig. 41B

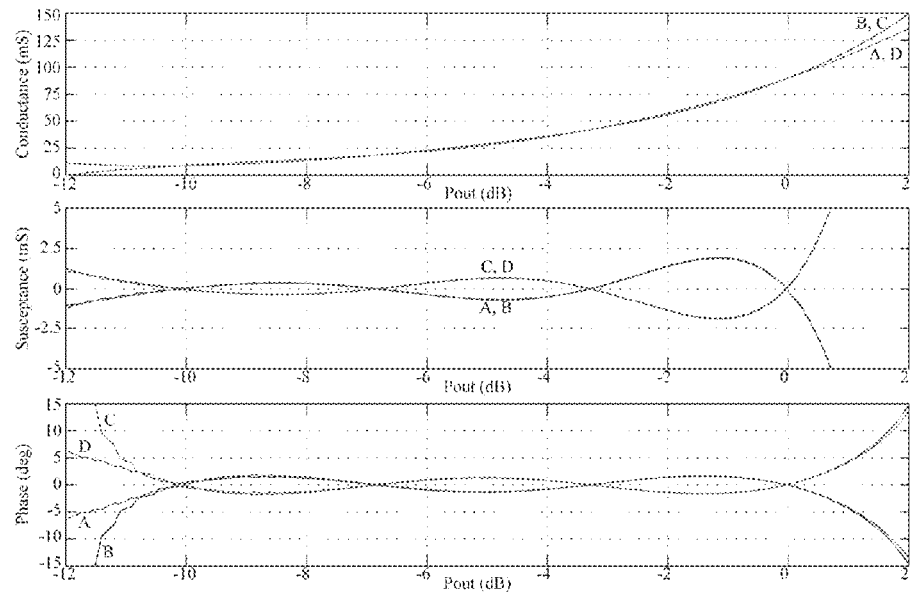
Fig. 43A
Fig. 43B
Fig. 43C
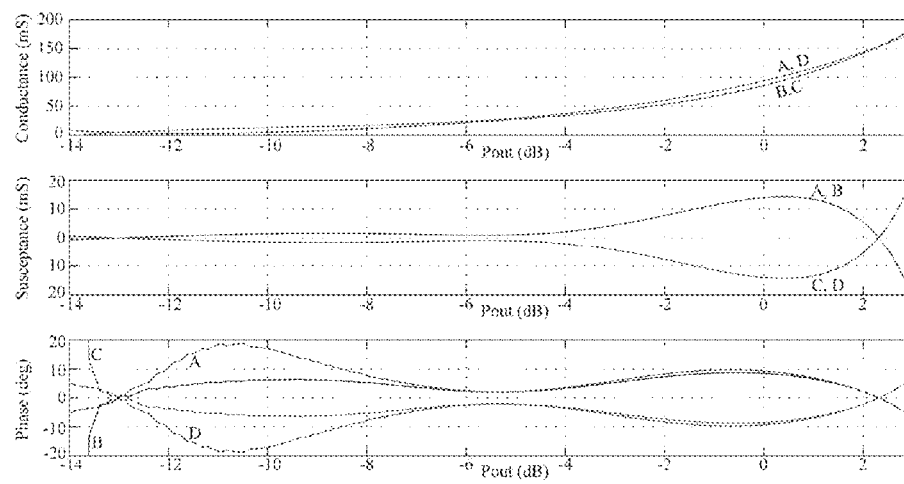
Fig. 44A
Fig. 44B
Fig. 44C

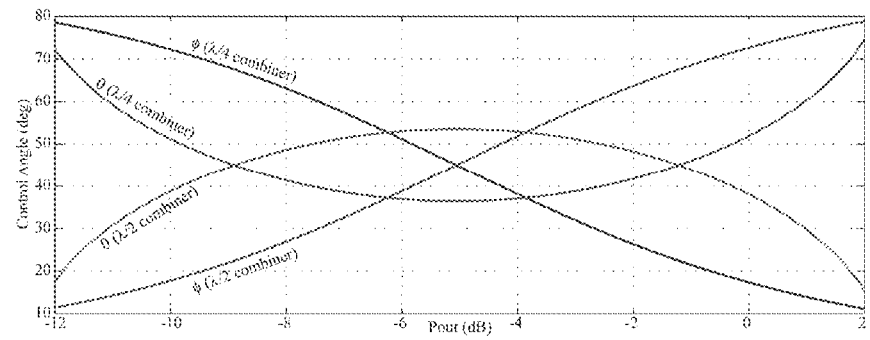
Fig. 50
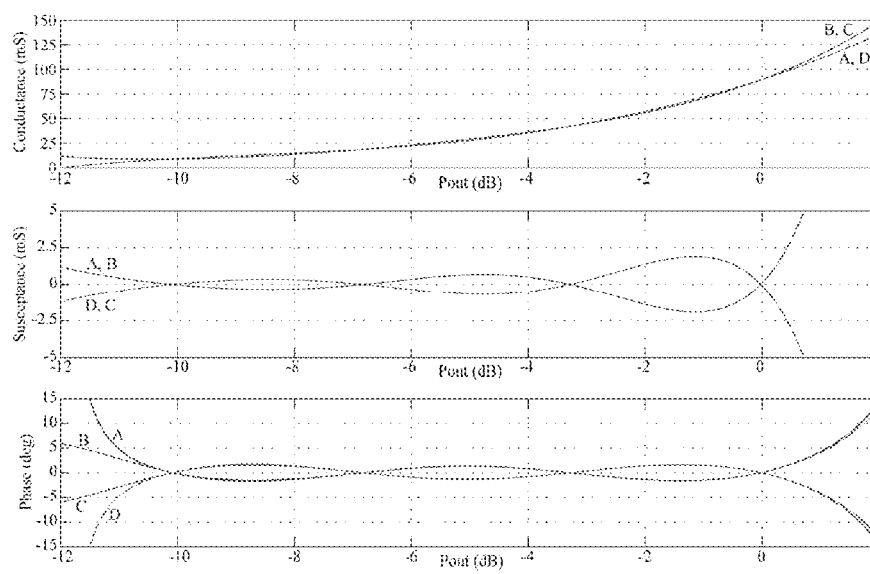
Fig. 51A
Fig. 51B
Fig. 51C

RF-INPUT / RF-OUTPUT OUTPHASING AMPLIFIER

CROSS REFERENCE TO RELATED APPLICATIONS

This application is a continuation-in-part (CIP) of and claims the benefit of co-pending U.S. patent application Ser. No. 13/837,009 filed on Mar. 15, 2013, which application is a CIP of and claims the benefit of U.S. patent application Ser. No. 13/020,568 filed on Feb. 3, 2011, which application claims the benefit under 35 U.S.C. § 119(e) of U.S. Provisional Patent Application No. 61/300,963 filed on Feb. 3, 2010, which applications are all hereby incorporated herein by reference in their entireties. This application also claims the benefit under 35 U.S.C. § 119(e) of U.S. Provisional Patent Application No. 62/036,228 filed on Aug. 12, 2014, which application is incorporated herein by reference in its entirety.

FIELD OF THE INVENTION

The concepts described herein relate to radio-frequency (RF) amplifiers, and more particularly to power combining and outphasing modulation systems and techniques.

BACKGROUND OF THE INVENTION

As is known in the art, radio-frequency (RF) power amplifiers (PAs) are important in numerous applications, including RF communications, medical imaging, industrial heating and processing, and dc-dc power conversion among many others. PAs are often required to provide linear amplification, which encompasses the ability to dynamically control an RF output power over a wide range. This becomes particularly challenging when wide-bandwidth control of an output signal is required. It is also often desired to maintain high efficiency across a wide range of output power levels, such that high average efficiency can be achieved for highly modulated output waveforms. Simultaneously achieving both of these requirements—wide-bandwidth linear amplification and high average efficiency—has been a longstanding challenge.

As is also known, one concept that has been explored for achieving both linear operation and high efficiency is referred to as outphasing. This technique is also sometimes referred to as "Linear Amplification with Nonlinear Components" or LINC. As shown in FIG. 1, in conventional outphasing, a time-varying input signal $S_{in}(t)$ is decomposed into two constant-amplitude signals $S_1(t)$, $S_2(t)$ which can be summed to provide a desired output signal $S_{out}(t)$. A variable envelope output signal is created as the sum of two constant-envelope signals $S_1(t)$, $S_2(t)$ by outphasing of the two constant envelope signals. Because the two signals $S_1(t)$, $S_2(t)$ are of constant amplitude, they can be synthesized with highly-efficient PAs including partially- and fully-switched-mode designs such as classes D, E, F, E/F and current-mode D, Inverse F, φ, etc. These amplifiers can be made highly efficient in part because they needn't have the capability to provide linear output control. Combining the two constant-amplitude outputs $S_1(t)$, $S_2(t)$ in a power combining network enables the net output amplitude to be controlled via the relative phase of the two constituent components $S_1(t)$, $S_2(t)$.

One important consideration with outphasing is how the power combining is done, particularly because many high-efficiency power amplifiers are highly sensitive to load impedance, and their performance and efficiency can heavily degrade due to interactions between the power amplifiers. As shown in FIG. 2, one conventional approach is to combine the constant-amplitude signals $S_1(t)$, $S_2(t)$ using an isolating combiner. An isolating combiner provides a constant (resistive) loading impedance to each PA independent of the outphasing angle, eliminating any interactions. A consequence of this, however, is that each PA operates at a constant output power level. Power that is not delivered to the output must instead be delivered elsewhere, usually to an "isolation" resistor R which dissipates power in the form of heat. Thus, a portion of the total constant output power from the PAs is delivered to the output (at the sum port of the combiner); the remainder is delivered to the difference port and is lost as heat in the isolation resistor. This leads to a rapid degradation of efficiency as output power is decreased, diminishing the attractiveness of this approach. This problem can be partially offset by recovering power not delivered to the output through a rectifier. Thus, in some implementations, power not delivered to the output is instead recovered back to the dc supply via a rectifier.

Referring now to FIG. 3, a different conventional approach is to use a lossless combiner, such as a Chireix combiner or related methods. (By "lossless" we mean a combiner including only reactive components or energy storage components such that ideally there would be no loss, while recognizing that all real components have some degree of loss. We also refer to a "lossless" combiner as a reactive combiner.) Benefits of the Chireix combining technique, which is non-isolating, include the fact that the combiner is ideally lossless, and that the real components of the effective load admittances seen by the individual power amplifiers vary with outphasing (and power delivery) such that power amplifier conduction losses can be reduced as output power reduces. However, the reactive portions of the effective load admittances ($Y_{in,1}$, $Y_{in,2}$) are only zero at two outphasing angles, and become large outside of a limited power range (see the example plots in FIG. 3). This limits efficiency, due both to loss associated with added reactive currents and to degradation of power amplifier performance with (variable) reactive loading. Stated differently, the reactive impedances $+jX_c$, $-jX_c$ of the combiner compensate for the effective reactive loading on the PAs due to interactions between them. However, because the effective reactive loading due to PA interactions depends upon operating point (outphasing angle), compensation is imperfect over most of the operating range. This can thus lead to loss of efficiency and PA degradation when operating over wide ranges.

Accordingly, the above-described challenges with power combining are among the principal reasons that outphasing is not a more dominant architecture in RF applications.

It would, therefore, be desirable to provide a power combining and outphasing modulation system for use in RF applications that overcomes the loss and reactive loading problems of previous outphasing approaches by providing ideally lossless power combining, along with substantially resistive loading of the individual power amplifiers over a very wide output power range, enabling high average efficiency to be achieved even for large peak-to-average power ratios (PAPR).

Some outphasing amplification systems generate phase-modulated branch drive signals using an outphasing modulator having a baseband signal as an input. Such systems can be classified as baseband-input/RF-output systems. For example, existing four-way outphasing systems may include an upconverting modulator coupled to each branch signal path that generates RF drive signals for branch amplifiers (e.g., power amplifiers) based on the desired output power (i.e. a baseband command) according to the control law. Using upconverting modulators may incur excessive cost and complexity as compared to a system with a single input, and can complicate digital correction schemes.

In many applications, a preferred solution would be an RF-input/RF-output amplification system that could function as a drop-in replacement for other RF-input/RF-output amplifiers, such as conventional single-transistor amplifier designs (e.g., class A, NB, B, F, inverse F), RF-input Doherty amplifiers, etc. An efficient RF-input/RF-output design can be used in applications requiring direct amplification of modulated RF inputs. Further, in systems that convert a baseband input to a modulated RF output, computation and baseband-to-RF conversion can be simplified down to a single path (i.e., to generate a single modulated RF output for amplification by the RF amplifier system). Advantages in this case include reduced baseband signal processing, data conversion and upconversion expense and loss, simplicity, and the ability to work with many calibration and digital pre-distortion schemes, which are set up for a single RF path.

One manner in which an RF-input/RF-output outphasing power amplifier can be realized is by having a system element that takes in a modulated RF input, recovers the RF carrier from this input and extracts the baseband input from the modulated RF input (e.g., as a receiver). This carrier and baseband information could then be used (via a conventional outphasing modulator) to synthesize the plurality of phase modulated RF waveforms to drive the branch amplifiers. Although such a scheme does enable the use of an outphasing system from RF inputs, it may have relatively high latency, complexity, and/or cost. A simpler, lower loss and lower cost approach is desirable.

SUMMARY OF THE INVENTION

According to one aspect of the disclosure, an outphasing amplification system comprises: a radio-frequency signal decomposition network (RFSDN) having an input port coupled to receive an RF input signal, N branch signal paths, at least one nonlinear component, each of the at least one nonlinear components coupled to a respective one of the branch signal paths, and N output ports, each of the output ports coupled to a respective one of the branch signal paths, where N is an integer greater than or equal to two; and N branch amplifiers, each of the branch amplifiers having an input port coupled to receive a respective one of the RFSDN output ports and having an output port; and a combiner network having N inputs ports, each of the combiner network inputs port coupled to an respective one of the branch amplifier output ports. In some embodiments, $N=2^M$ (M is an integer greater than or equal to one). In certain embodiments, the RFSDN has two or more nonlinear components.

In some embodiments, the at least one nonlinear component is provided as a one-port device having a nonlinear impedance characteristic to radio-frequency (RF) signals provided thereto.

The outphasing amplification system may be configured to provide phase modulation at the output ports in response to amplitude modulation at the input port. Moreover, the system may be configured to provide phase modulation at the output ports that is fixed if amplitude at the input port is below a given threshold value. In particular embodiments, the nonlinear components may cause this behavior.

In various embodiments, the RFSDN comprises a resistance compression network (RCN). The RCN may be provided as an N-way RCN coupled to N nonlinear components.

In some embodiments, the RFSDN N and the combiner network have a substantially inverse structural relationship.

In addition to an RFSDN, the system may include N driver amplifiers, each of the driver amplifiers having an input port coupled a to receive a respective one of the RFSDN output ports and having an output port coupled to a respective one of the branch amplifiers.

In certain embodiments, the at least one nonlinear component comprises an input node, an output node, a parallel resistor coupled between the input node and a ground, and two opposing diodes coupled between the output node and the ground.

According to another aspect of the invention, an outphasing amplification system comprises a radio-frequency signal decomposition network (RFSDN) having an input port and N output ports, wherein amplitude modulation at the input port causes relative phase modulation at the N output ports, where N is an integer greater than or equal to two. The system may further include N branch amplifiers, each of the branch amplifiers having an input port coupled to receive a respective one of the RFSDN output ports and having an output port; and a combiner network having N inputs ports, each of the combiner network inputs port coupled to an respective one of the branch amplifier output ports.

BRIEF DESCRIPTION OF THE DRAWINGS

The foregoing features of this invention, as well as the invention itself, may be more fully understood from the following description of the drawings in which:

FIG. 18 is a plot of effective input conductance vs. Pout as seen by each of the Power Amplifiers (A-D) driving the 4-way combiner of FIG. 4 with $V_S=1$V, $R_L=50\Omega$ and k=1.05 as a result of optimal susceptance outphasing control;

FIG. 18A is a plot of effective susceptance vs. Pout as seen by each of the Power Amplifiers (A-D) driving the 4-way combiner of FIG. 4 with $V_S=1$V, $R_L=50\Omega$ and k=1.05 as a result of optimal susceptance outphasing control;

FIG. 18B is a plot of effective phase vs. Pout for the system of FIG. 4 as seen by each of the Power Amplifiers (A-D) driving the 4-way combiner of FIG. 4 with $V_s=1$V, $R_L=50\Omega$ and k=1.05 as a result of optimal susceptance outphasing control;

FIG. 19 is a plot of effective input conductance vs. Pout as seen by each of the Power Amplifiers (A-D) driving the 4-way combiner of FIG. 4 with $V_S=1$V, $R_L=50\Omega$ and k=1.05 as a result of optimal phase outphasing control;

FIG. 19A is a plot of effective susceptance vs. Pout as seen by each of the Power Amplifiers (A-D) driving the 4-way combiner of FIG. 4 with $V_S=1$V, $R_L=50\Omega$ and k=1.05 as a result of optimal phase outphasing control;

FIG. 19B is a plot of effective phase vs. Pout for the system of FIG. 4 as seen by each of the Power Amplifiers (A-D) driving the 4-way combiner of FIG. 4 with $V_S=1$V, $R_L=50\Omega$ and k=1.05 as a result of optimal phase outphasing control;

FIG. 40 is a schematic diagram of a transmission-line implementation of the four-way combiner of FIG. 39 using transmission lines having characteristic impedance values of $Z_1$ and $Z_2$;

FIG. 41A is a schematic diagram of a transmission-line network for deriving the effective input admittance matrix of the transmission line combiner of FIG. 40;

FIG. 41B is a schematic diagram of a transmission line network for deriving an effective input admittance matrix of the combiner of FIG. 40;

FIGS. 43A, 43B, 43C are plots of effective input conductance (FIG. 43A) susceptance (FIG. 43B), and phase (FIG. 43C) seen by each of the PAs (A-D) driving the four-way TL combiner of FIG. 40 with $Z_1$=$Z_2$=567Ω, $\sigma_1$=0.0628, $\sigma_2$=0.0861, and $R_L$=50Ω as a result of the OS outphasing control;

FIGS. 44A, 44B, 44C are plots of effective input conductance (FIG. 44A), susceptance (FIG. 44B), and phase (FIG. 44C) seen by each of the power amplifiers driving the four-way transmission line combiner of FIG. 40 with $Z_1$=$Z_2$=100Ω, $\sigma_1$=0.3640,02 $\sigma_2$=0.5096, and $R_L$=50Ω as a result of the OS outphasing control;

FIG. 50 is plot of control angle (in degrees) vs. output power $P_{out}$ (in dB) for outphasing control angles θ and φ for the Optimal Phase (OS) control method for the four-way λ/2-combiner of FIG. 40 ($Z_1$=$Z_2$=567Ω, $\sigma_1$=0.0628, $\sigma_2$=0.0861, $R_L$=50Ω) and the λ/4-combiner of FIG. 17 ($Z_1$=$Z_2$=567Ω, $\sigma_1$=1.5080, $\sigma_2$=1.4847, $R_L$=50Ω);

FIGS. 51A, 51B, 51C are plots of effective input conductance (FIG. 51A), susceptance (FIG. 51B), and phase (FIG. 51C) seen by each of the power amplifiers (A-D) driving the four-way λ/4 TL combiner of FIG. 48 with $Z_1$=$Z_2$=567Ω, $\sigma_1$=1.5080, $\sigma_2$=1.4847, and $R_L$=50Ω as a result of the OS outphasing control;

DETAILED DESCRIPTION OF THE PREFERRED EMBODIMENTS

Figure 4:
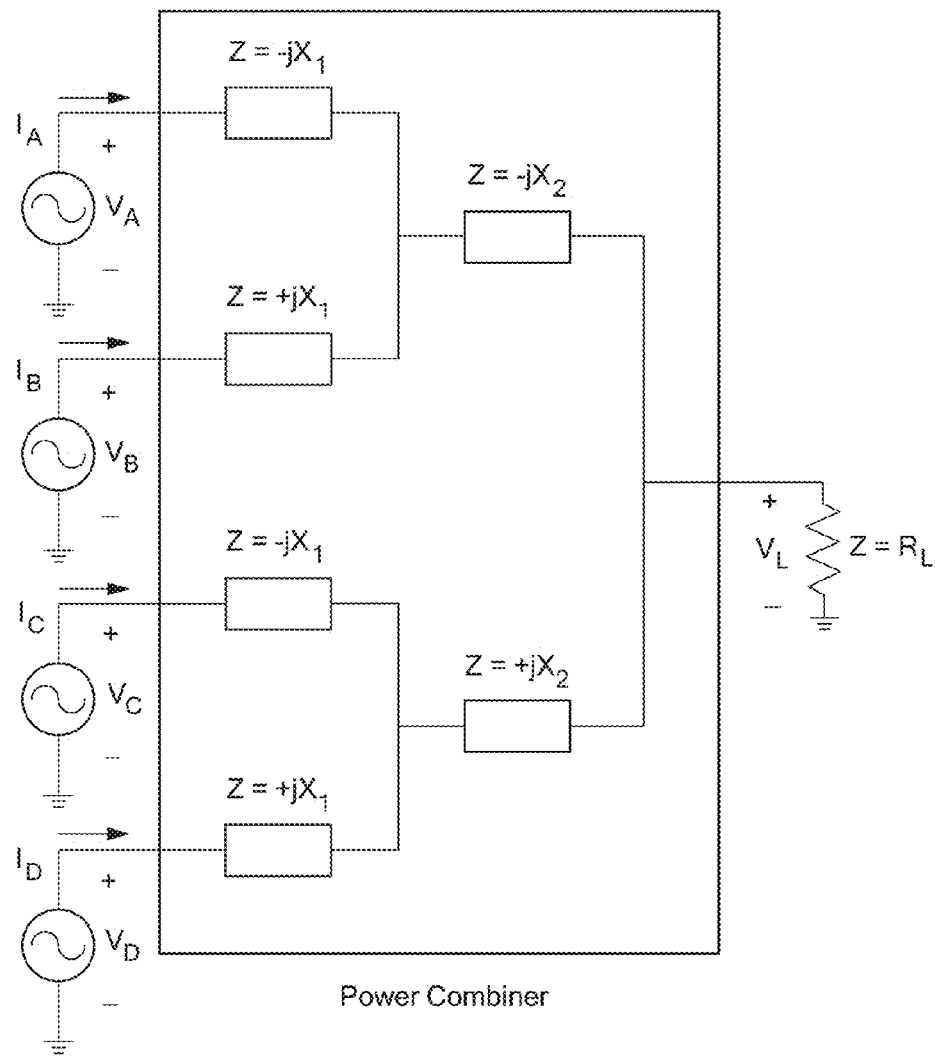
FIG. 4 is a block diagram of an outphasing system which includes a combiner having four input ports and an output port with a power amplifier (PA) coupled to each input port.

Referring now to FIG. 4, while conventional outphasing systems utilize two power amplifiers, a system configured in accordance with the concepts and techniques described herein combines power from four or more amplifiers. It should be appreciated that the power combiner is substantially lossless, and enables output power to be controlled by the relative phasing of the individual power amplifiers, while providing desirable input impedances at the power combiner inputs. It should also be appreciated that for a specified load resistance $R_L$, controlling output power P is equivalent to controlling the output voltage amplitude, since $P=V_{out}^2/(2R_L)$. It should also be noted that power may additionally be controlled through other methods, including amplitude modulation of the power amplifier inputs and modulation of the power supply/supplies of the power amplifiers (i.e. other techniques may be used in combination with outphasing techniques described herein).

It should also be appreciated that while the exemplary embodiment described herein below in conjunction with FIG. 4 includes four power amplifiers, in accordance with the concepts described herein, outphasing systems having more than four amplifiers are also contemplated and extensions to systems having more than four amplifiers are also described herein below.

Figure 5:
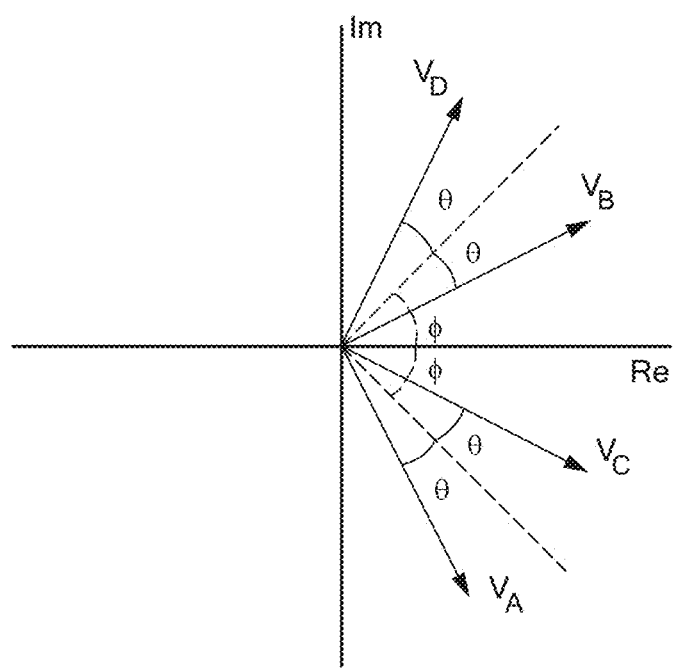
FIG. 5 is a phasor diagram showing the relationship among the phase voltages.

Turning now to FIG. 4, an outphasing system includes a power combiner (or more simply a combiner) and a plurality of, here four, amplifiers which are shown modeled as ideal voltage sources in FIG. 4 (and as will be discussed below, FIG. 5 depicts the phasor relationship between the terminal voltages of the power amplifiers). The power combiner has five ports: four input ports coupled (directly or indirectly) to output ports of respective ones of four power amplifiers and one output port coupled (directly or indirectly) to a load. Ideally, the power combiner is provided as a lossless combiner comprised of a first set of reactive elements having impedances $Z=-jkX_1$ and $+jkX_1$ and a second set of reactive elements having impedances $Z=-jkX_2$ and $+jkX_2$ (it should be appreciated that in the art, combiners comprising ideally lossless components are often referred to as lossless combiners.) The reactive elements are each provided having specified reactance values at a desired operating frequency.

In the exemplary embodiment of FIG. 4, the power amplifiers are modeled as ideal voltage sources. It is recognized, however, that practical power amplifiers will not act as ideal sources when the effective loading impedance deviates from the ideal.

To provide an outphasing system such as that shown in FIG. 4, one can begin by describing how the reactance values in the new combiner may be selected. The reactance magnitude $X_2$ of one element of the combiner is selected close to the load resistance $R_L$. For example, it is preferable that the reactance magnitude $X_2$ be typically within about 30% of load resistance $R_L$, and for many designs the reactance magnitude $X_2$ will be within about 10% of load resistance $R_L$. It should be appreciated that the parameter k sets how close $X_2$ is to $R_L$, as per Equation (1). The effects of varying k on the performance (and thus "how close" $R_L$ and $X_2$ are) is discussed below in conjunction with FIG. 15 and FIGS. 23-26. In most practical embodiments, values for k are typically in the range of about 1-1.2 although values outside this range may also be used depending upon the requirements of a particular application. To determine reactance magnitude $X_2$, one may specify a number k equal to or slightly greater than 1 (e.g., k=1.05) and determine $X_2$ as:

$$X_2 = R_L \frac{2}{k+1} \quad (1)$$

As will be described below in conjunction with FIG. 16, it should be appreciated that parameter k can be thought of as the amount into which an apparent input resistance of an RCN compression stage is compressed—e.g. to between x and kx. Such a view of parameter k is taken in connection with Equation (16) and the associated text.

In any event, once a reactance magnitude for $X_2$ is computed, a value corresponding to a reactance magnitude for $X_1$ may be computed in terms of $X_2$ and k, for example as:

$$X_1 = \frac{X_2}{k + \sqrt{k^2 - 1}} \quad (2)$$

Thus, for example, with $R_L=50\Omega$, one may choose $X_2=48.78\ \Omega$ and $X_1=35.60\ \Omega$ at the operating frequency of the system. It will be appreciated that other relative selections of $R_L$, $X_1$ and $X_2$ are possible within the scope of the general concepts described herein and may be desired in some applications. It will also be appreciated by those of ordinary skill in the art after reading this disclosure, when to make such other relative selections taking into account a variety of factors including but not limited to: the particular application for which the circuit is being used; a desired operating range of the power amplifiers; a load sensitivity of the power amplifiers; whether purely resistive loading or some reactive component is desired for optimum loading of the power amplifiers and other system design goals and requirements. Nevertheless, this represents one preferred embodiment of the invention.

The behavior of the network of FIG. 4 may be analyzed and a set of relations for controlling the output by outphasing of the sources may be developed. It can be shown that the relationship between the source voltages and input currents of the network of FIG. 4 can be expressed as:

$$\begin{bmatrix} I_A \\ I_B \\ I_C \\ I_D \end{bmatrix} = X_1^{-1} \begin{bmatrix} \gamma + j(1-\beta) & -\gamma + j\beta & \gamma & -\gamma \\ -\gamma + j\beta & \gamma - j(\beta+1) & -\gamma & \gamma \\ \gamma & -\gamma & \gamma + j(\beta+1) & -\gamma - j\beta \\ -\gamma & \gamma & -\gamma - j\beta & \gamma + j(\beta-1) \end{bmatrix} \cdot \begin{bmatrix} V_A \\ V_B \\ V_C \\ V_D \end{bmatrix} \quad (3)$$

in which:

$\gamma=R_L/X_1$ and $\beta=X_2/X_1$.

In vector notation, this can be expressed as:

$$\vec{I} = Y \cdot \vec{V} \quad (4)$$

A relative phase relationship can be proposed among the four sources. It should, however, be appreciated that the phases may also be adjusted together by an additional angle to control the absolute phase of the output. While other possibilities exist within the scope of this disclosure and the general concept disclosed herein, the following relationship among the sources is proposed:

$$\begin{bmatrix} V_A \\ V_B \\ V_C \\ V_D \end{bmatrix} = V_S \begin{bmatrix} e^{-j\phi}e^{-j\theta} \\ e^{j\phi}e^{-j\theta} \\ e^{-j\phi}e^{j\theta} \\ e^{j\phi}e^{j\theta} \end{bmatrix} \quad (5)$$

where $V_S$ is the amplitude of the sources and $\phi$ and $\theta$ are the control angles used for outphasing.

Figure 4A:
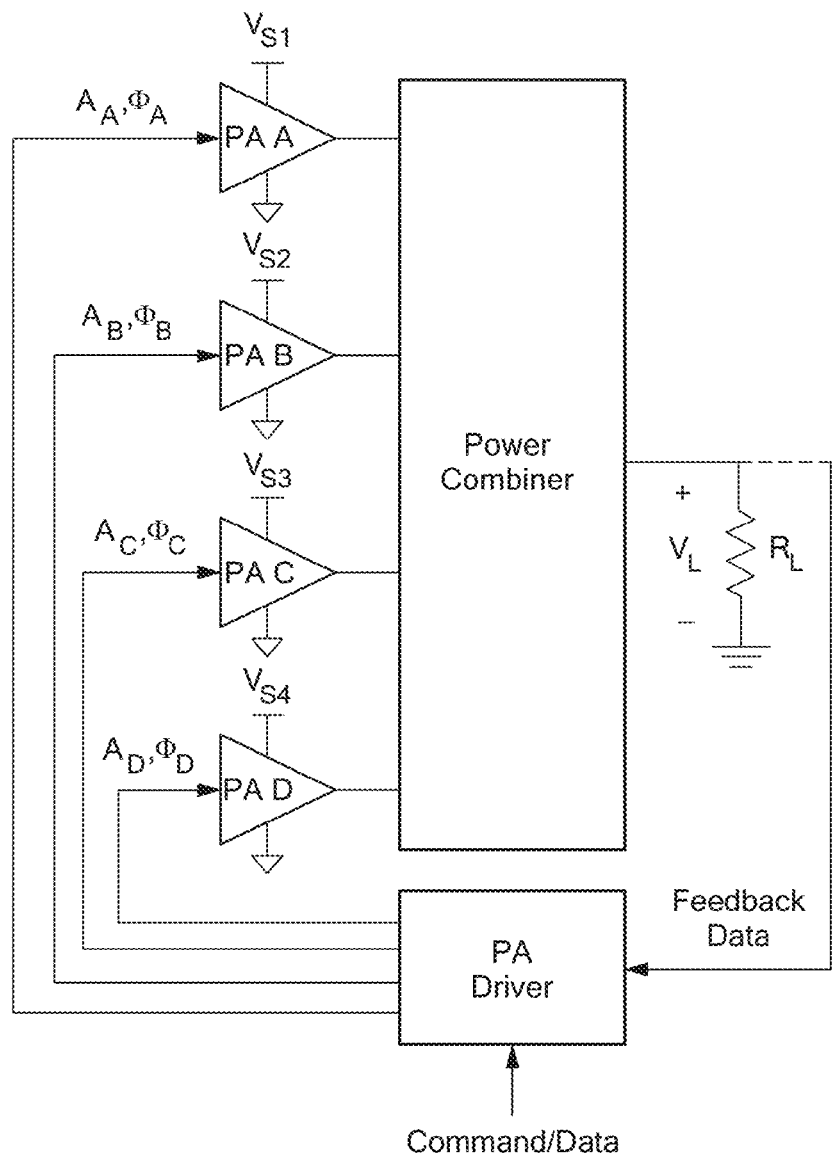
FIG. 4A is a block diagram of a power combiner system comprising: (a) power combiner, (b) four power amplifiers (PA A-PA D), and (c) amplitude/phase control unit responsible for adjusting the amplitudes ($A_A$-$A_D$) and phases ($\Phi_A$-$\Phi_D$) of the input signals to the respective PAs based on user command and feedback data.

Referring now to FIG. 4A, a power combiner system includes a reactive power combiner having four input ports and an output port. Each of four amplifiers $PA_A$, $PA_B$, $PA_D$, $PA_D$, which may be provided as power amplifiers, have an RF output port coupled to a respective one of the four RF input ports of the reactive power combiner. The amplifiers are biased by a respective one of four bias (or supply) voltages $V_{s1}$, $V_{s2}$, $V_{s3}$, $V_{s4}$. The power combiner system also includes an amplifier driver circuit (PA Driver) which provides output signals corresponding to RF signals driving amplifiers $PA_A$-$PA_D$. Each of amplifiers $PA_A$-$PA_D$ receive the signals provided thereto from the PA driver circuit and provide an amplified RF signal to the respective inputs of the reactive power combiner circuit. The PA driver circuit also receives feedback signals (here, such feedback signals coupled from the output of the reactive power combiner). It should be appreciated that PA driver circuit provides to amplifiers $PA_A$-$PA_D$ signals having appropriately selected phase and amplitudes (selected as described herein below). Thus, PA driver circuit may also include an amplitude/phase control unit responsible for adjusting the amplitudes $A_A$-$A_D$ and phases $\phi_A$-$\phi_D$ of the input signals to the respective PAs based upon user command and feedback data. Exemplary techniques for controlling such a system are described herein. It should, of course, be appreciated that the reactive power combiner may have $2^N$ ports where N is greater than or equal to 2. In some applications, a power combiner system which includes a reactive power combiner having eight (8) input ports and an output port and eight amplifiers is preferred.

Figure 4B:
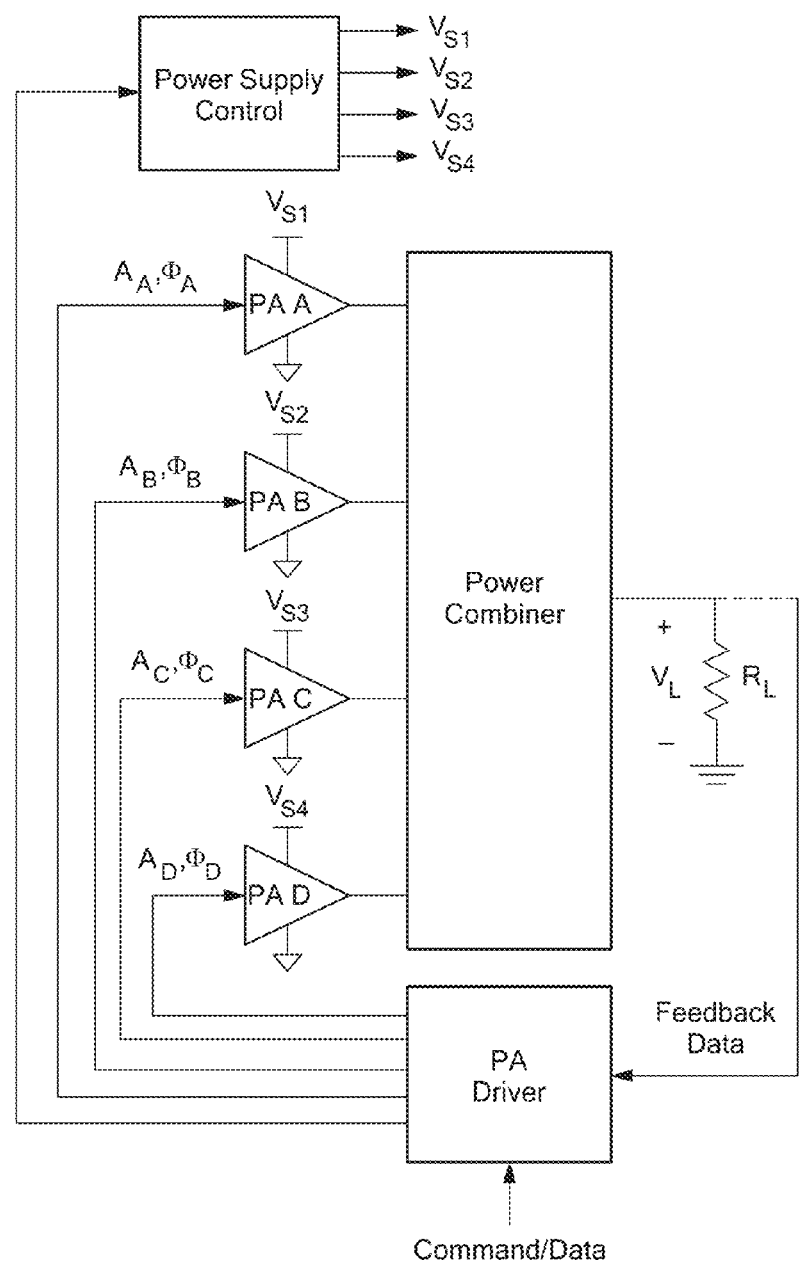
FIG. 4B is a block diagram of a power combiner system comprising: (a) power combiner, (b) four power amplifiers (PA A-PA D), (c) power supply control unit responsible for adjusting the supply voltages ($V_{s1}$-$V_{s4}$) of the respective PAs, and (d) amplitude/phase control unit responsible for adjusting the amplitudes ($A_A$-$A_D$) and phases ($\Phi_A$-$\Phi_D$) of the input signals to the respective PAs based on user command and feedback data.

Referring now to FIG. 4B, a power combiner system includes a reactive power combiner having four input ports and an output port, four amplifiers $PA_A$-$PA_D$ (which may, for example, be provided as power amplifiers), a power supply control unit responsible for adjusting the supply voltages ($V_{S1}$-$V_{S4}$) of the respective PAs, and PA driver circuit responsible for adjusting the amplitudes ($A_A$-$A_D$) and phases ($\phi_A$-$\phi_D$) of the input signals to the respective PAs based on user command and feedback data. In this exemplary embodiment, the power supply control circuit can adjust one or all of bias voltages $V_{S1}$-$V_{S4}$ provided to respective ones of amplifiers $PA_A$-$PA_D$ to further improve the efficiency of the power combiner system. As discussed above in conjunction with FIG. 4A, in some applications, a power combiner system which includes a reactive power combiner having eight (8) input ports and an output port and eight amplifiers is preferred.

Referring now to FIG. 5, the phase and control angle relationships among the sources $V_A$, $V_B$, $V_C$, $V_D$ in FIG. 4 is shown graphically as per the relations of Equation (5). It should be noted that the four terminal voltages $V_A$, $V_B$, $V_c$, and $V_D$ have the same amplitude $V_S$. As can be seen in FIG. 5, the outphasing control angles $\phi$ and $\theta$ are used to regulate output power while maintaining desirable loading of the sources (e.g. the power amplifiers).

To characterize system behavior, one finds the effective admittance seen by each source for the stipulated phase relationships. In this example, this is done using Equation (5). The effective admittance at a combiner input port is the complex ratio of current to voltage at the port with all sources active. The effective admittances represent the admittances "seen" by the sources when they are operating under outphasing control. Combining Equations (3) and (5) and manipulating them, the following expressions for the effective admittances at the four combiner input ports can be found as shown in Equations (6) through (9) below:

$$Y_{\text{eff},A} = X_1^{-1}(\gamma - \gamma \cos(2\phi+2\theta) - \gamma \cos(2\phi) + \gamma \cos(2\theta) - \beta \sin(2\phi)) + jX_1^{-1}(1 - \beta - \gamma \sin(2\phi+2\theta) - \gamma \sin(2\phi) + \gamma \sin(2\theta) + \beta \cos(2\phi)) \quad (6)$$

$$Y_{\text{eff},B} = X_1^{-1}(\gamma - \gamma \cos(2\theta-2\phi) - \gamma \cos(2\phi) + \gamma \cos(2\theta) + \beta \sin(2\phi)) + jX_1^{-1}(-1 - \beta - \gamma \sin(2\theta-2\phi) + \gamma \sin(2\phi) + \gamma \sin(2\theta) + \beta \cos(2\phi)) \quad (7)$$

$$Y_{\text{eff},C} = X_1^{-1}(\gamma - \gamma \cos(2\theta-2\phi) - \gamma \cos(2\phi) + \gamma \cos(2\theta) + \beta \sin(2\phi)) - jX_1^{-1}(-1 - \beta - \gamma \sin(2\theta-2\phi) + \gamma \sin(2\phi) + \gamma \sin(2\theta) + \beta \cos(2\phi)) \quad (8)$$

$$Y_{\text{eff},D} = X_1^{-1}(\gamma - \gamma \cos(2\phi+2\theta) - \gamma \cos(2\phi) + \gamma \cos(2\theta) - \beta \sin(2\phi)) + jX_1^{-1}(1 - \beta - \gamma \sin(2\phi+2\theta) - \gamma \sin(2\phi) + \gamma \sin(2\theta) + \beta \cos(2\phi)) \quad (9)$$

It is readily observed that the effective admittances seen by sources A and D are complex conjugates, as are those seen by sources B and C. Moreover, the expressions all have many individual terms in common.

Next, an outphasing control strategy for realizing a desired output power while preserving desirable (resistive) loading of the sources is described. Without loss of generality, consider synthesis of a zero-phase referenced output voltage at the load. One may adjust the load phase by common adjustments to all of the power amplifier phases. To synthesize a zero-phase load voltage of amplitude $V_{L,ref}$, or equivalently a "commanded" cycle-average power $P_{cmd} = (V_{L,ref})^2/(2R_L)$, an intermediate variable $r_o$ is defined as shown in Equation (10):

$$r_o = \frac{2V_S^2}{P_{cmd}} \quad (10)$$

control angles $\theta$ and $\phi$ are selected in terms of $r_o$ in accordance with Equations (11) and (11A):

$$\theta = A\text{TAN}\left(\frac{2r_o X_2}{r_o^2 + X_1^2}\right) \quad (11)$$

$$\phi = A\text{TAN}\left(\frac{X_1}{r_o}\right) \quad (11A)$$

It will be appreciated that other control selections of $\theta$ and $\phi$ are possible within the scope of this disclosure, and may be desired in some applications. Equations (10)-(11A) form the complete suggested control law in terms of desired power $P_{cmd}$, which we term the "approximate inverse resistance compression network" control method, or AIRCN control method, and this represents one preferred embodiment. Advantages include having a strong analytical basis, and ease of generating the angles and handling the phase modulation using the approach described in the last section of the extended digest.

It should, of course, be appreciated that it is be possible to come up with alternative formulations of control that could provide similar control of power while keeping the imaginary part of the effective admittance small. This could be done, for example, by performing a search, such as a numerical search, for alternative angle combinations that provide desired power points, perhaps starting the search near the solution shown above. Two such control methods, referred to herein as the "optimal phase" (or "OP") control method and the "optimal susceptance" (or "OS") control method are described below. These methods represent alternative preferred embodiments which are preferable for the very low (and in some cases minimized) phase and susceptance deviations they achieve.

The Table I below shows the achievable performance of a four (4) way combiner (e.g. of the type described above in conjunction with FIGS. 4-4B) with IRON and OP control.

TABLE I

| Power Ratio | Power Ratio (dB) | IRCN Peak Phase (Deg) | OP (~OS) Peak Phase (Deg) |
|---|---|---|---|
| 2 | 3.01 | 0.07 | 0.01 |
| 5 | 6.99 | 0.78 | 0.31 |
| 10 | 10 | 3.05 | 1.15 |
| 20 | 13.01 | 8.18 | 3.01 |
| 50 | 16.99 | 25.36 | 9.35 |

Table II shows an eight (8) way combiner maximum worst-case effective input admittance phase for the 5:1, 10:1, 20:1, 50:1, and 100:1 power range ratios for the case of an Inverse RCN (IRON) outphasing control method.

TABLE II

| Power Ratio | Power Ratio (dB) | Max Worst Case Phase (Deg) | Phase Margin (Deg) |
|---|---|---|---|
| 5 | 6.99 | 0.01 | 1 |
| 10 | 10 | 0.03 | 1 |
| 20 | 13.01 | 0.18 | 1 |
| 50 | 16.99 | 1.08 | 2 |
| 100 | 20 | 3.06 | 4 |

It should be appreciated that for phase values less than one degree in Table II, as a practical matter one degree could act as a bound (i.e. phase values within a few degrees would be sufficient for many practical applications).

It should, of course, be appreciated that it is also possible to implement control laws that additionally control the common phase among the power amplifiers and/or differential phases among the amplifiers as a function of the dynamics of the desired magnitude and phase of the output signal. The control law can thus specify the phases of the power amplifiers as a function of not only output power/voltage and phase, but also based upon the derivative of desired output voltage and phase, or some other function of the dynamics of the desired signal output and/or the power amplifier network. This can be used to compensate for rapid phase variation of the desired output signal for example (e.g., to mitigate out-of-band components in the output) and/or to compensate for the natural response of the combiner network.

It should also be appreciated that concepts, system and techniques described herein are the first-ever outphasing of more than two PAs with a lossless combiner network that provides desirable loading characteristics of the PAs and that the above-referenced control laws represents one preferred embodiment of the novel concepts, system and techniques described herein. As will be seen, for typical parameter selections, (e.g. of the parameter k in the range 1-1.2, and the circuit values $X_1$ and $X_2$ which result from this selection through the process described herein) this control law provides monotonic output control and desirable loading of the individual power amplifiers over a wide operating range.

It is useful to know the load voltage $V_L$ and the output power $P_{out}$ delivered to the load $R_L$ (see FIG. 4) for a given pair of outphasing control angles [θ; φ]. By employing straightforward linear circuit analysis techniques, it can be shown that the load voltage is given by (12):

$$V_L = j\frac{R_L}{X_1}(V_B + V_D - V_A - V_C). \tag{12}$$

As a result of the adopted PA phase relationship of FIG. 5, the above equation further reduces to (13):

$$V_L = -\frac{4R_L}{X_1}V_S\sin(\phi)\cos(\theta). \tag{13}$$

Consequently, the output power is easily determined according to (14):

$$P_{out} = \frac{V_L^2}{2R_L} = \frac{8R_L V_S^2}{X_1^2}\sin^2(\phi)\cos^2(\theta). \tag{14}$$

Equation (14) is of great importance and value as it concisely expresses the exact relationship between the output power delivered to the load $R_L$ and any pair of outphasing control angles [θ; φ].

Moreover, it can be readily seen from Equation (14) that the maximum output power deliverable to the load by the power combiner, the saturated output power $P_{out,sat}$, is given by (15), and corresponds to θ=0° and φ=90°.

$$P_{out,sat} = \frac{8R_L V_S^2}{X_1^2}. \tag{15}$$

Although Equation (15) is valid only for the 4-way combiner, the only difference between it and that for the general N-way combiner is the leading numeric constant, which can be determined by applying the methodology outlined above.

Next described are attributes of the proposed power combiner and outphasing system. As an example, consider a system having $V_s$=1 V, $R_L$=50 Ω and a design value k=1.05 (resulting in $X_2$=48.78Ω and $X_1$=35.60Ω).

Figure 6:
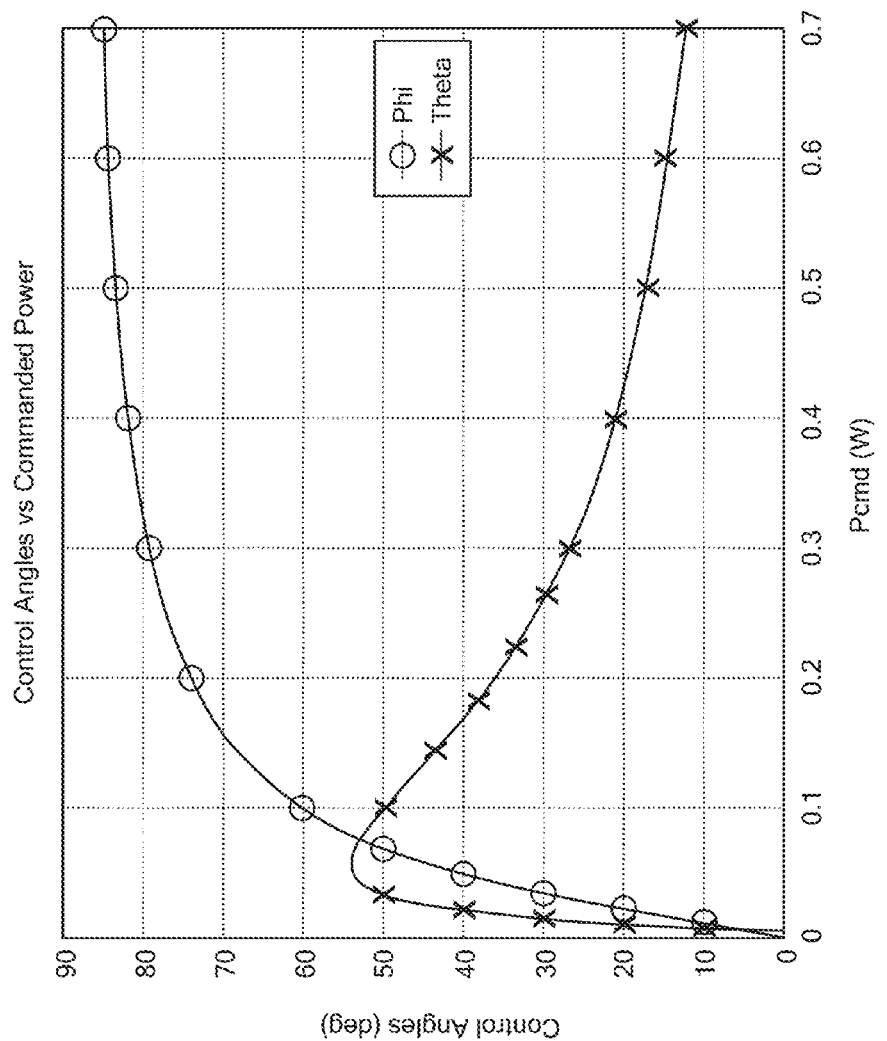
FIG. 6 is a plot showing outphasing control angles vs. commanded output power for an approximate inverse resistance compression network (AIRCN) outphasing control method.

FIG. 6 shows plots of the control angles φ and θ versus "commanded" power, as per Equations (10)-(12) for the example system ($V_s$=1 V, $R_L$=50Ω, $X_2$=48.78Ω and $X_1$=35.60Ω) for the AIRCN control method.

Figure 7:
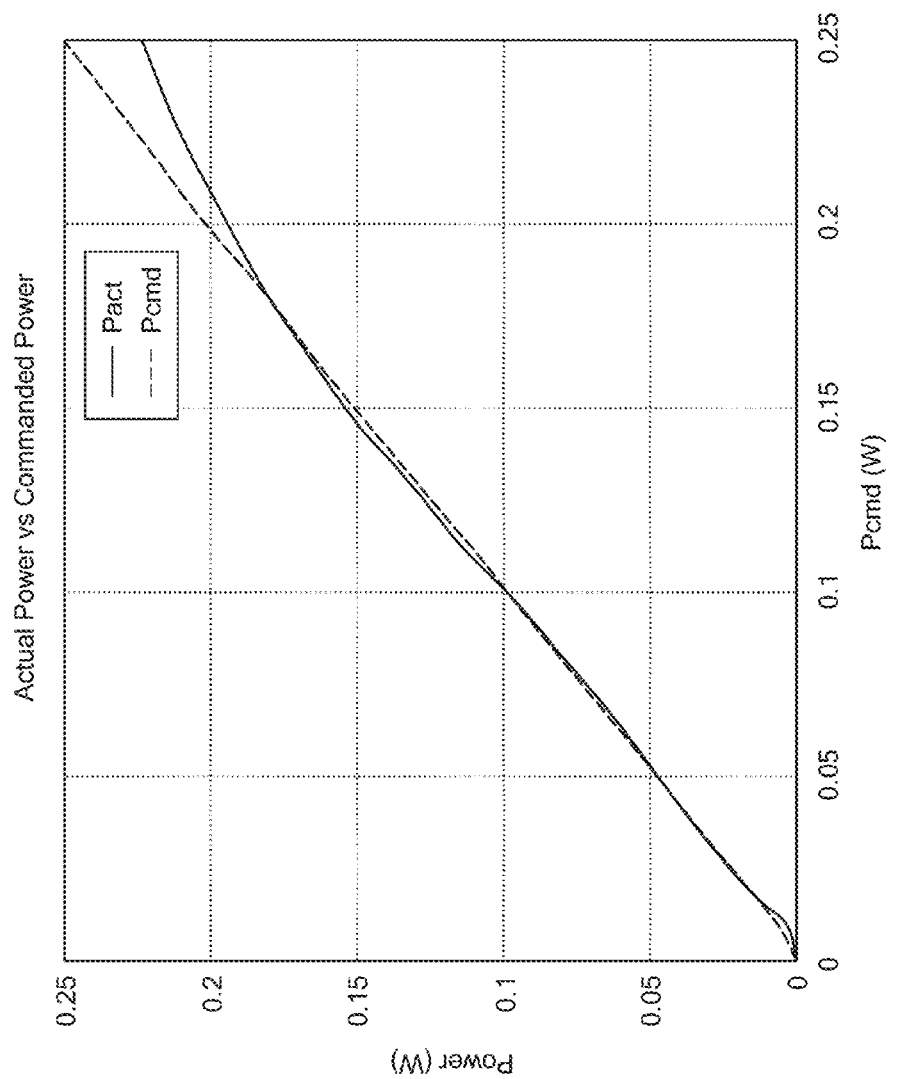
FIG. 7 is a plot of actual output power vs. commanded power for an example system comprising a four-port combiner and having $V_s=1$ V, $R_L=50\Omega$, $X_2=48.78\Omega$ and $X_1=35.60\Omega$ using the AIRCN outphasing control method.

FIG. 7 is a plot of actual output power vs. commanded power for the example system having $V_s$=1 V, $R_L$=50Ω, $X_2$=48.78Ω and $X_1$=35.60Ω. As can be seen from FIG. 7, the actual power increases monotonically from zero with commanded power, and matches the commanded power well over the range shown. At higher commanded power levels the actual power achieved saturates at approximately 0.31 W. Because the output power is a smooth, monotonic function of command down to zero power, the nonlinearity can be readily addressed through predistortion or other means. This result demonstrates that the novel outphasing scheme described herein can smoothly control output power over a wide range down to zero power.

Also of practical importance are the effective impedances seen by the individual power amplifiers across the control range.

Figure 8:
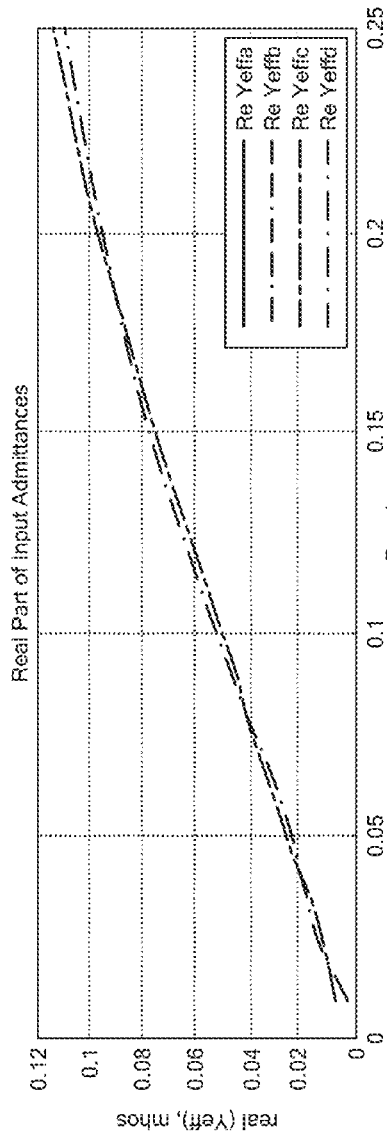
FIG. 8 is a plot of real components of the effective input admittances at the input ports of a four input port power combiner plotted as a function of the power command $P_{cmd}$ for the example $R_L=50\Omega$, $X_2=48.78\Omega$ and $X_1=35.60\Omega$ over the commanded power range of [0.01,0.25] W using the AIRCN outphasing control method.
Figure 8A:
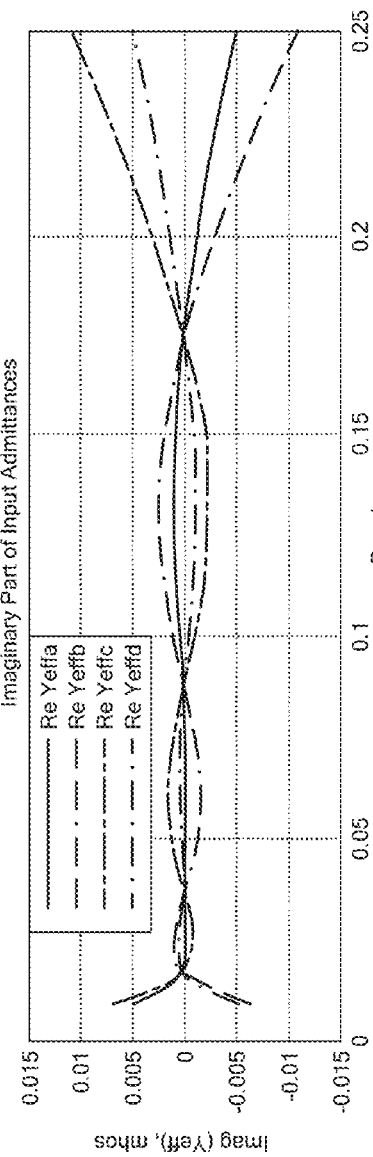
FIG. 8A is a plot of imaginary components of the effective input admittances at the four power combiner input ports plotted as a function of the power command $P_{cmd}$ for the example $R_L=50\Omega$, $X_2=48.78\Omega$ and $X_1=35.60\Omega$ over the commanded power range of [0.01,0.25] W AIRCN outphasing control method.

Referring now to FIGS. 8 and 8A, shown are the real and imaginary components of the effective admittances at the four combiner input ports as a function of the commanded cycle-average output power $P_{cmd}$ for the AIRCN control method (as per Equations (6)-(11A)).

The plots are shown for the example $R_L=50\Omega$, $X_2=48.78\Omega$ and $X_1=35.60\Omega$ over a commanded power range of [0.01,0.25] W. Comparing FIGS. 8 and 8A, it can be seen that the imaginary components are small compared to the real components over a wide range (i.e., highly conductive input admittances). Below the range shown, as commanded power goes to zero, the real parts of the admittances go to zero, while the imaginary parts go to +/−0.028 Mhos. The real parts of $Y_{eff,A}$ and $Y_{eff,D}$ briefly go negative for $P_{cmd}$<~0.00875 W, with a minimum negative real component of ~−0.026 Mhos. This indicates power transfer from sources $V_B$ and $V_C$ to $V_A$ and $V_D$ over this range. As $P_{cmd}$ is increased above the range shown, real components of the admittances saturate at values in the range 0.15-0.16 Mhos, with imaginary parts saturating to values in the range of [−0.075, 0.075] Mhos.

Figure 9:
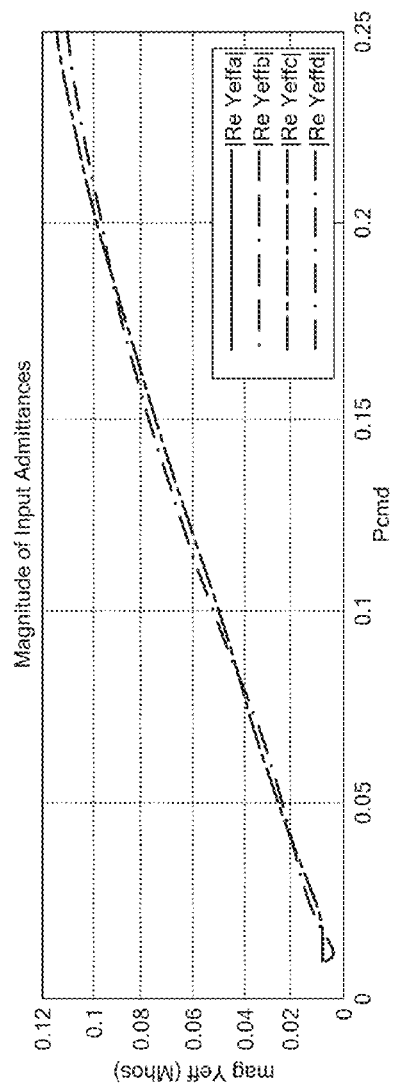
FIG. 9 is a plot of magnitude of the effective admittances at the four power combiner input ports, plotted as a function of the power command $P_{cmd}$ for the example $R_L=50\Omega$, $X_2=48.78\Omega$ and $X_1=35.60$ over the commanded power range of [0.01,0.25] W using the AIRCN outphasing control method.
Figure 9A:
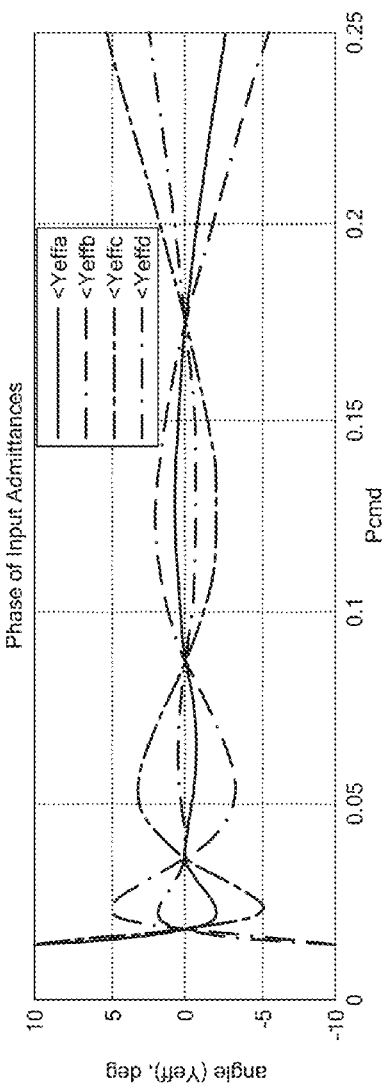
FIG. 9A is a plot of phase of the effective admittances at the four power combiner input ports, plotted as a function of the power command $P_{cmd}$ for the example $R_L=50\Omega$, $X_2=48.78\Omega$ and $X_1=35.60\Omega$ over the commanded power range of [0.01,0.25] W using the AIRCN outphasing control method.

FIGS. 9 and 9A show the same information as magnitude and phase of the effective impedances.

The plots of FIGS. 7 and 8 and 9 illustrate some important characteristics of the system.

For example, it can be seen that the input admittance at each port is highly resistive (phase close to zero) over a wide range of power commands, and that the susceptive component of the admittance is never large on an absolute scale. This represents a nearly-ideal loading characteristic for many kinds of power amplifiers: the susceptive portions of the effective admittances loading the power amplifiers are small and the conductive components of the admittances are closely matched and scale up with desired power delivery. At very low commanded powers (e.g. below the range illustrated in FIGS. 8 and 9), the admittances do increase and become susceptive (becoming entirely susceptive at zero commanded power). However, as the source currents and power drawn in this range are small, this nonideality will be tolerable in many applications. In fact, the susceptive loading is small over a substantially wider power range than with conventional Chireix outphasing, for example. Likewise, the susceptive component of loading can be made smaller over a specified power range than is achievable with conventional Chireix outphasing.

Figure 1:
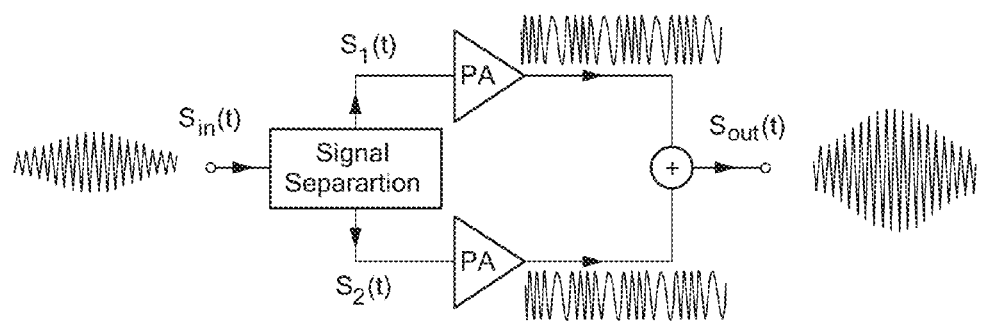
FIG. 1 is a block diagram of a conventional outphasing architecture (also known as a linear amplification with nonlinear components (LING) architecture)
Figure 1A:
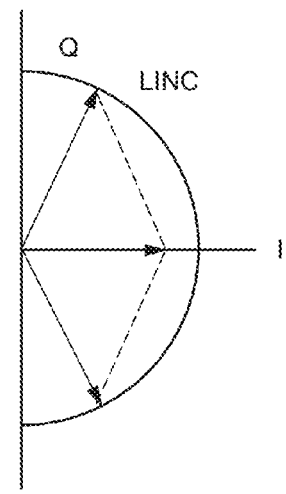
FIG. 1A is a phasor diagram showing a relationship among the phase voltages for the conventional outphasing architecture shown in FIG. 1.
Figure 2:
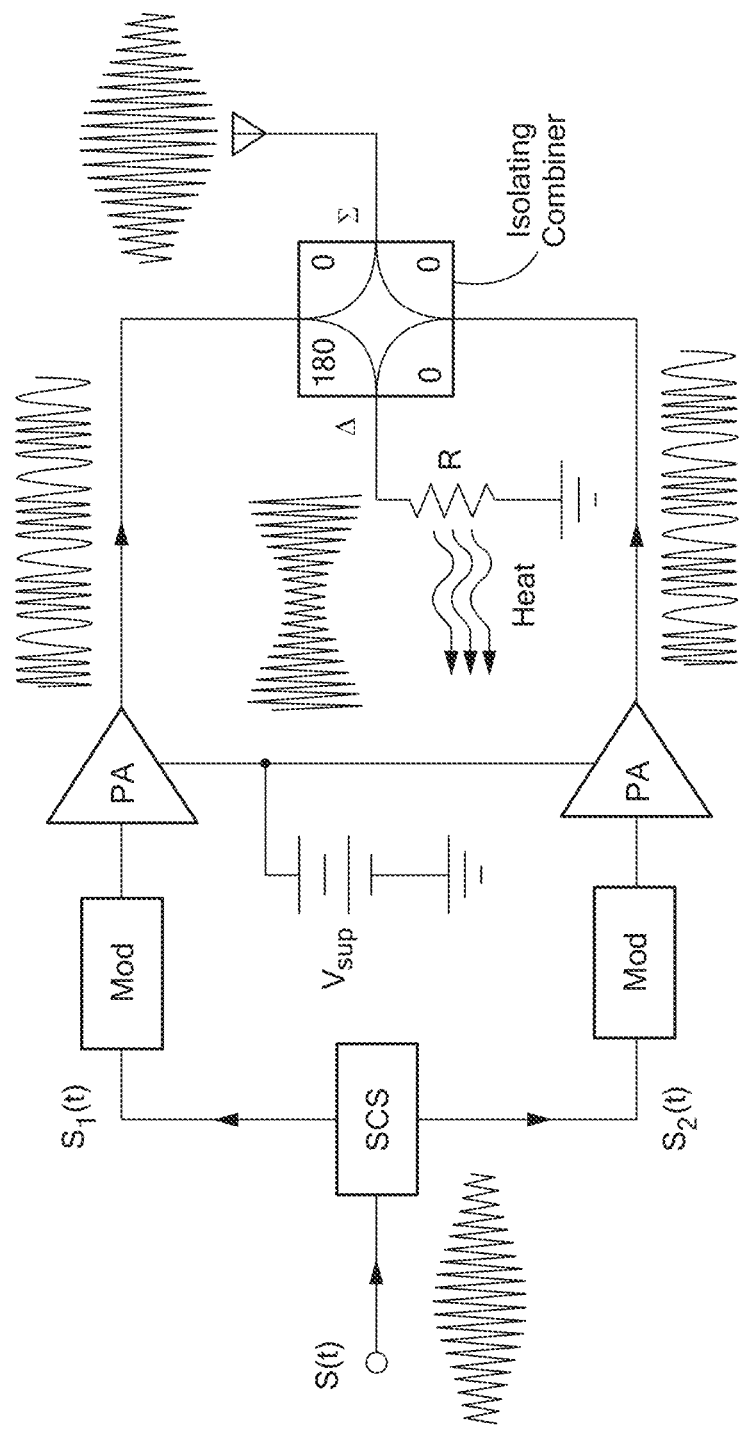
FIG. 2 is a block diagram of a conventional outphasing architecture implemented with an isolating combiner.
Figure 3:
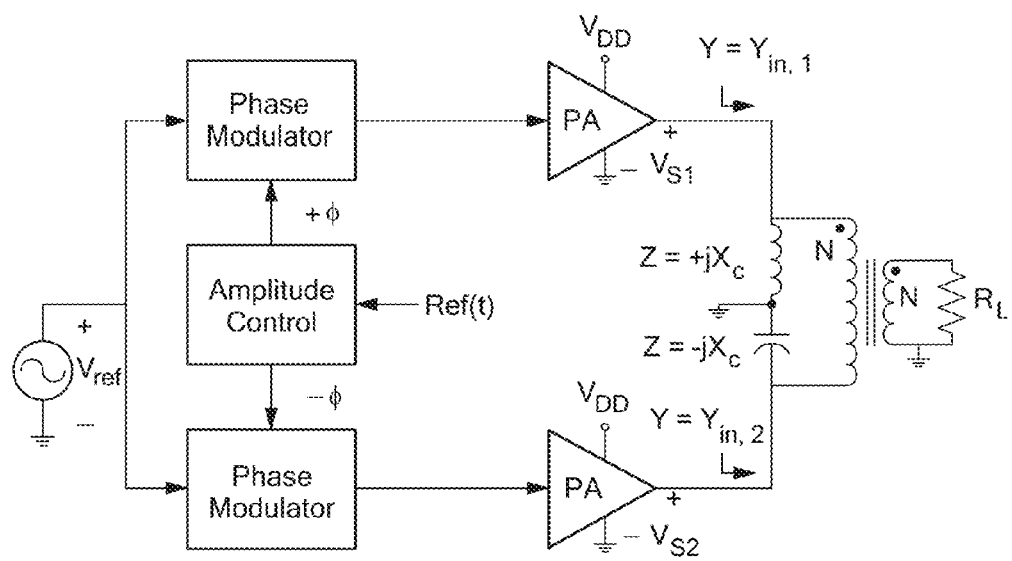
FIG. 3 is a block diagram of a conventional outphasing system implemented with a Chireix combiner.
Figure 3A:
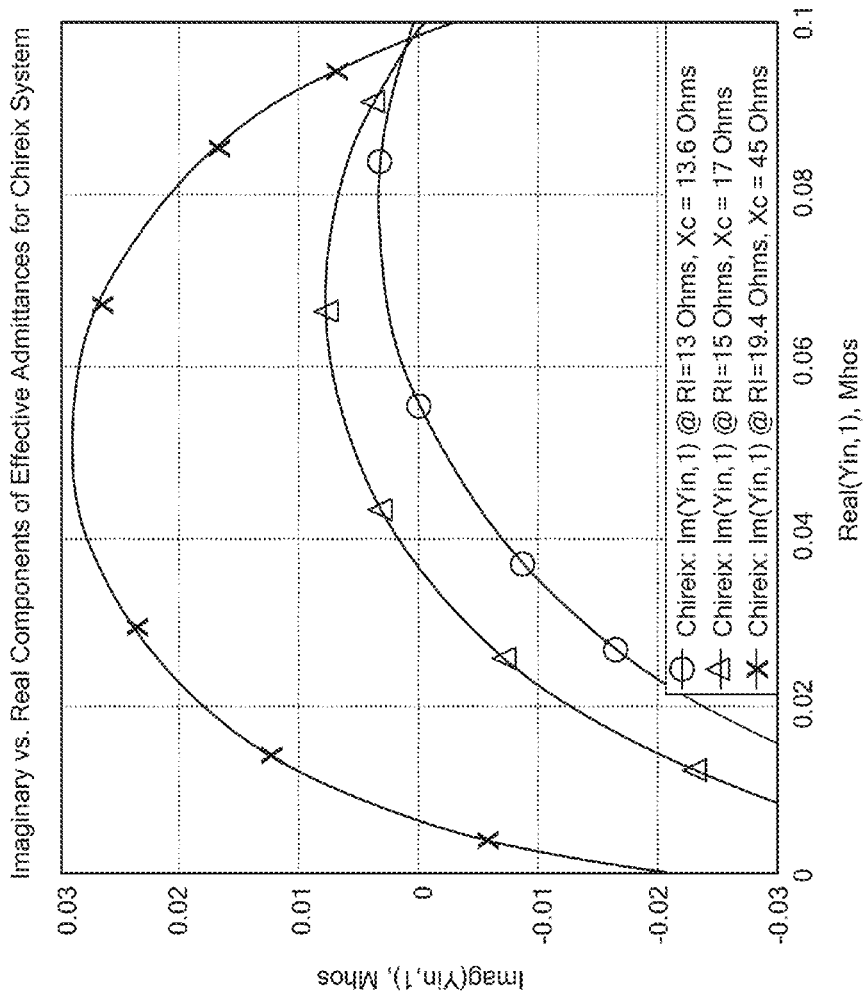
FIG. 3A is a plot of imaginary vs. real components of the effective admittances for the outphasing system of FIG. 3.
Figure 16:
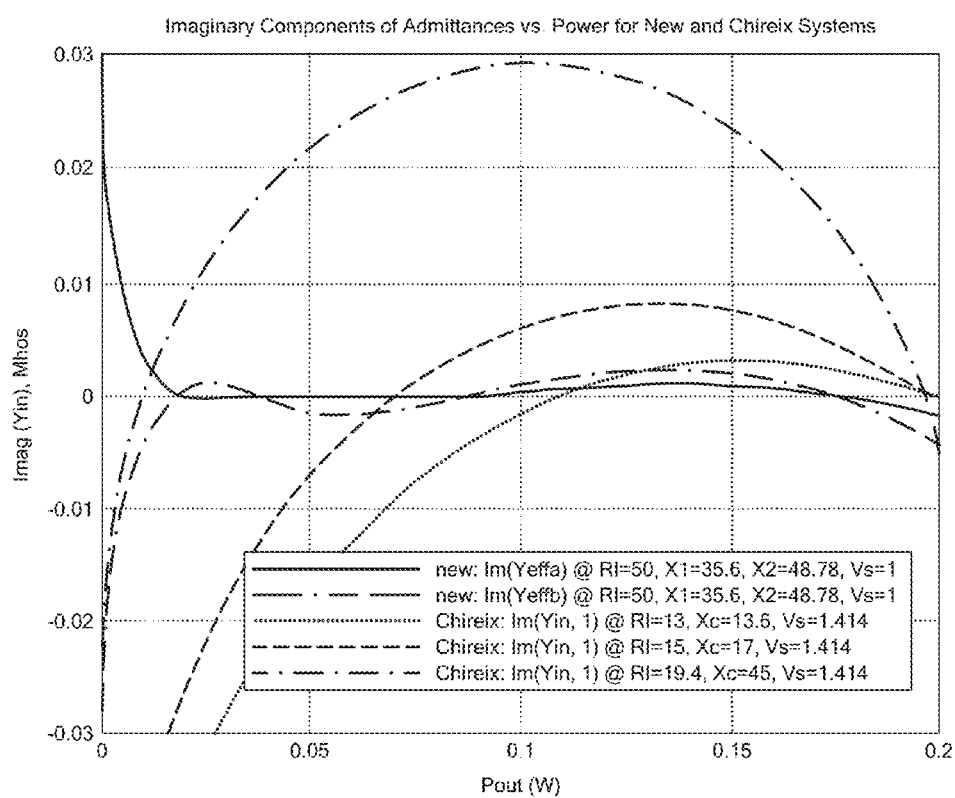
FIG. 16 is a plot of imaginary components of admittance $Y_{in}$ vs. power for a prior art system utilizing a Chireix combiner and for a system provided in accordance with the novel concepts and techniques described herein.

Referring briefly to FIG. 16, a comparison is shown between the imaginary components of admittances of the new power combiner and outphasing system (FIG. 4) and AIRCN control method to that of the Chireix system of FIG. 3 as a function of total output power. Three example designs of the Chireix system are shown. The Chireix systems are shown for a factor of sqrt(2) higher input voltage to account for the fact that a Chireix system only has two PAs. With this normalization, the same total power is achieved in the two systems with each PA seeing similar real components of admittance. It can be seen that the new power combining and outphasing system yields much smaller reactive loading than the Chireix combiner over a wide power range. (For reference, the real part of the admittances for $P_{out}=0.2$ W are each approximately 0.1 Mho.)

These results demonstrate that the proposed power combiner and outphasing system can meet the goal of providing wide-range power control at high efficiency while preserving desirable loading characteristics of the individual power amplifiers. An advantage of the novel system described herein is that one can achieve smaller susceptive loading over a specified power range with the proposed outphasing system than one can with a Chireix combiner. Likewise, for a specified allowable magnitude of susceptive loading one can operate over a greater power range with the proposed AIRCN control system than one can with a Chireix combiner.

Referring now to FIGS. 9 and 9A, magnitude and phase of the effective admittances at the four power combiner input ports, plotted as a function of the power command $P_{cmd}$ are shown. The curves in FIGS. 9 and 9A were generated for the example $R_L=50\Omega$, $X_2=48.78\Omega$ and $X_1=35.60\Omega$ over the commanded power range of [0.01,0.25] W with the AIRCN control method. It can be seen that the input admittance is highly conductive (phase close to zero) over a wide range and is ideally zero at four output power levels. As commanded power goes to zero below the range shown, the admittance magnitudes increase to a maximum of ~0.28 Mhos, and the phases go to +/−90°. As commanded power increases above the range shown, input admittance magnitudes saturate to values below ~0.18 Mhos, with phases in the range of [−25°, 25°].

To validate the above results, the system of FIG. 4 was simulated in LTSPICE with the proposed AIRCN control law set for the in Equations (10), (11) and (11A) at a frequency of 10 MHz. The example $V_S=1$ V, $R_L=50\Omega$ and $X_2=48.78\Omega$ and $X_1=35.60\Omega$ was used. Positive reactances were implemented with inductors (566.6 nH for $X_1$ and 776.4 nH for $X_2$), while negative reactances were implemented with capacitors (447 pF for $X_1$ and 326.27 pF for $X_2$). The effective admittances at the four power amplifier ports and the power were calculated numerically for a range of operating points. The simulation results were found to match the theory within the numerical precision of the simulation. An example of simulation results matching the theory within the numerical precision of a simulation shown in FIGS. 10 and 10A.

Figure 10:
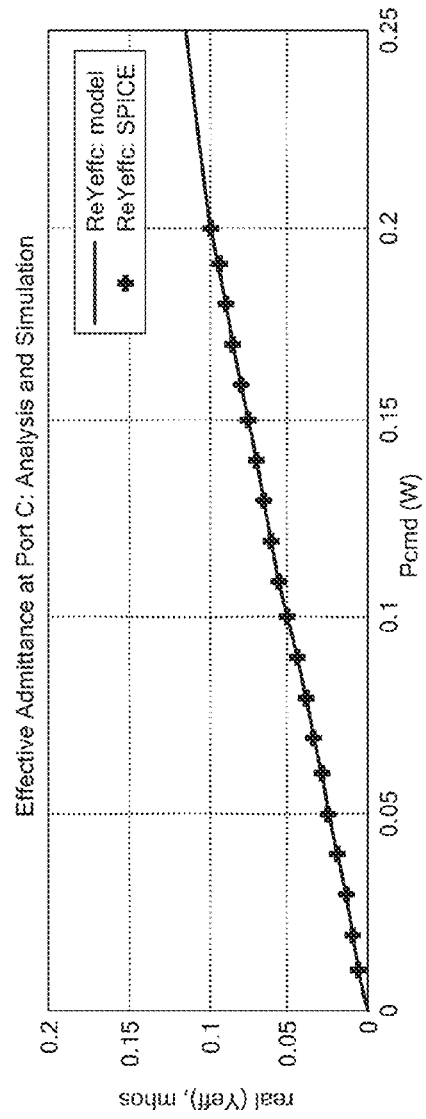
FIG. 10 is a plot of real components of the effective admittance $Y_{eff,c}$ for the example $V_s=1$ V, $R_L=50\Omega$, f=10 MHz, $X_2=48.78\Omega$ and $X_1=35.60\Omega$ using the AIRCN outphasing control method.
Figure 10A:
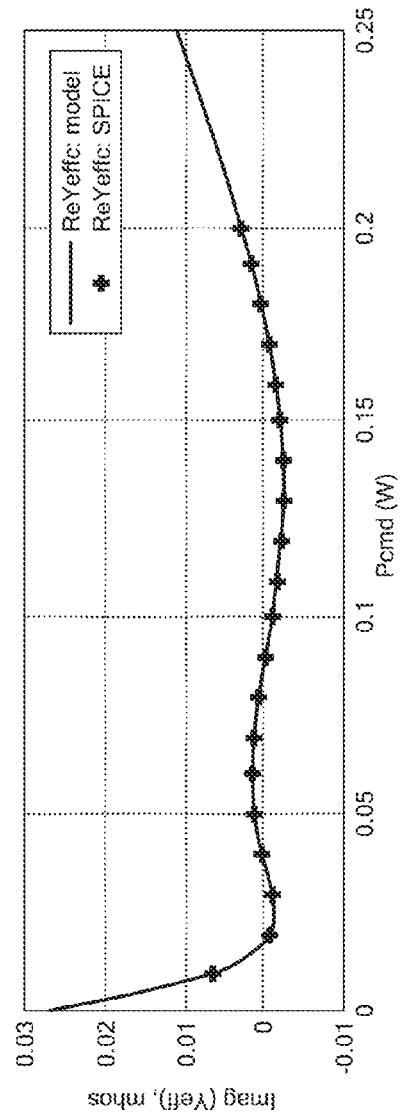
FIG. 10A is a plot of imaginary components of the effective admittance $Y_{eff,c}$ for the example $V_s=1$ V, $R_L=50\Omega$, f=10 MHz, $X_2=48.78\Omega$ and $X_1=35.60\Omega$ using the AIRCN outphasing control method.

Referring now to FIGS. 10 and 10A, these figures show real and imaginary components of the effective admittance $Y_{eff,C}$ for the example $V_s=1$ V, $R_L=50\Omega$, f=10 MHz, $X_2=48.78\Omega$ and $X_1=35.60\Omega$ and the AIRCN control method. Both analytical results and numerical results computed from LTSPICE .ac simulations are shown. For simulation, positive reactances were implemented with inductors (566.6 nH for $X_1$ and 776.4 nH for $X_2$), while negative reactances were implemented with capacitors (447 pF for $X_1$ and 326.27 pF for $X_2$). The simulation results confirm the analytical formulation.

Thus, FIGS. 10 and 10A represent one example of simulation results matching the theory within the numerical precision of a simulation. FIGS. 10 and 10A show the analytical curves showing the effective admittance $Y_{eff,C}$ along with values computed numerically based on simulations. Simulation matched theory equally well for the other effective admittances not shown in FIGS. 10 and 10A.

A concern with any power combining system is the efficiency of power combining. While ideally lossless, the parasitic resistances of actual passive components in the combiner of FIG. 4 contribute a degree of loss which often cannot be neglected. Here we consider the impact of such losses on power combiner efficiency. We treat only losses owing to the power combiner, and do not consider any combining-related losses that may accrue in the power amplifiers themselves (e.g., owing to variations in effective impedance at the power combiner input ports).

To model non-idealities of the passive components in the combiner of FIG. 4, we assume that each branch in the combiner network has a series resistance such that every branch has the same quality factor $Q=|X|/R_s$. To estimate the losses and efficiency degradation owing to these parasitic resistances, we adopt a method that has been previously employed in matching networks: the circuit currents are calculated assuming no loss (i.e., assuming the resistances are zero); the losses and circuit efficiency are then calculated based on the losses induced by the calculated currents flowing through the parasitic resistances. This method thus assumes that the branch currents are not significantly affected by the presence of small resistances.

Using the above method, in can be shown that the loss in the combiner can be calculated as shown in Equation (16):

$$P_{loss,av} = \frac{1}{2Q} \vec{V}^H [Y^H W Y] \vec{V} \quad (16)$$

Where V and Y are defined as in Equations (3) and (4), $^H$ is the Hermitian operator (conjugate transpose) and W is defined as shown in Equation (17):

$$W = \begin{bmatrix} |X_1|+|X_2| & |X_2| & 0 & 0 \\ |X_2| & |X_1|+|X_2| & 0 & 0 \\ 0 & 0 & |X_1|+|X_2| & |X_2| \\ 0 & 0 & |X_2| & |X_1|+|X_2| \end{bmatrix} \quad (17)$$

The fractional loss fl=(1-efficiency) of the combiner can be similarly calculated as shown in Equation (18):

$$fl = 1 - \eta = \frac{1}{Q} \cdot \frac{\vec{V}^H [Y^H W Y] \vec{V}}{\vec{V}^H Y \vec{V}} \quad (18)$$

The fractional loss is thus inversely proportional to the quality factor of the branch impedances in the combiner network, and depends on the operating point.

To validate the above formulation and to illustrate the efficiency potential of the proposed power combining system, the fractional loss of an example system was calculated using the result of Equation (14) and compared to numerical results from LTSPICE. The example $V_s=1$ V, $R_L=50\Omega$, f=10 MHz, $X_2=48.78\Omega$ and $X_1=35.60\Omega$ and the AIRCN control method is again used. Positive reactances were implemented with inductors (566.6 nH for $X_1$ and 776.4 nH for $X_2$), while negative reactances were implemented with capacitors (447 pF for $X_1$ and 326.27 pF for $X_2$)), and parasitic resistances are added for Q=100 of each branch element.

Figure 11:
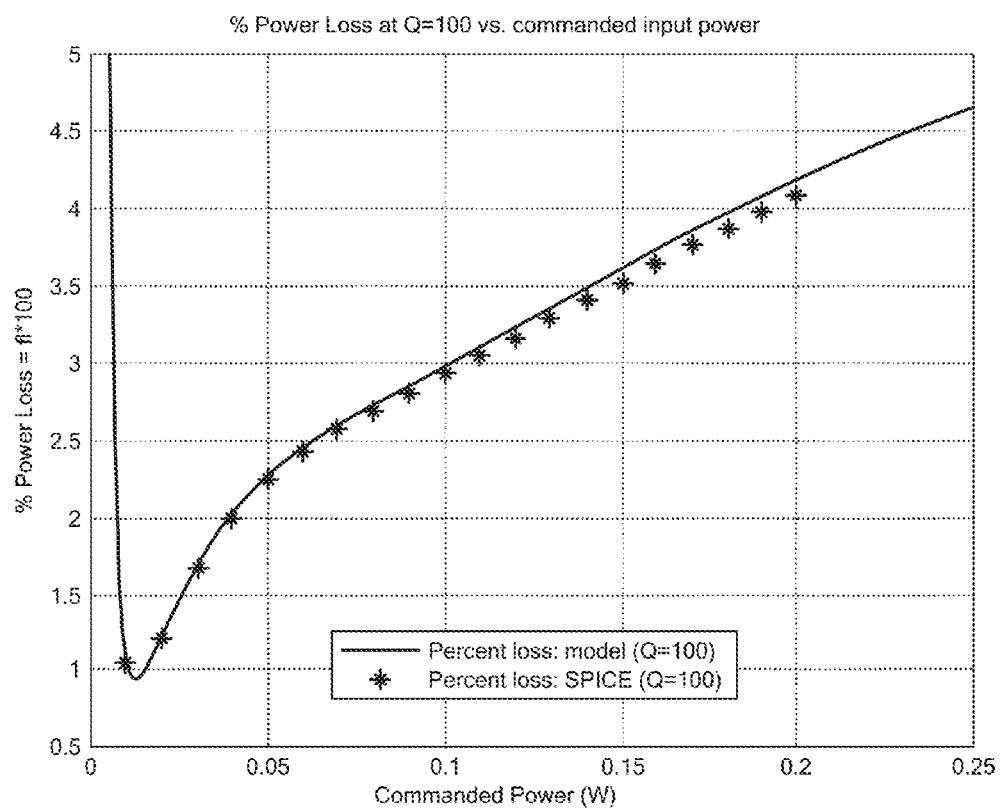
FIG. 11 is a plot of percentage power loss in the combiner (100·fl) vs. commanded input power for the example $V_s=1$ V, $R_L=50\Omega$, f=10 MHz, $X_2=48.78\Omega$ and $X_1=35.60\Omega$ for component quality factors Q=100 using the AIRCN outphasing control method.

FIG. 11 is a plot of percentage power loss in the combiner (100·fl) vs. commanded input power for the example $V_s=1$ V, $R_L=50\Omega$, f=10 MHz, $X_2=48.78\Omega$ and $X_1=35.60\Omega$ for component quality factors Q=100. Both analytical results and numerical results computed from LTSPICE .ac simulations are shown. For simulation, positive reactive impedances were implemented with inductors with series resistors (566.6 nH, 0.356Ω for $X_1$ and 776.4 nH, 0.488Ω for $X_2$), while negative reactive impedances were implemented with capacitors with series resistors (447 pF, 0.356Ω for $X_1$ and 326.27 pF, 0.488Ω for $X_2$). The simulation results confirm the analytical formulation. The small mismatch between the theoretical curve and the simulated results can be attributed to the assumption made in the analysis that the small resistive losses do not affect the current waveforms. Moreover, it can be seen that the loss owing to power combining is small over a wide operating range (<5% over the plotted range for Q=100). As fractional loss (or percentage loss) is inversely proportional to branch quality factor, we can see that combining loss is expected to be manageable even at relatively low quality factors, and can be made quite low if high-quality-factor components are used.

Next described is a conceptual framework to facilitate understanding of the proposed power combining and outphasing system. In addition to better illustrating the operating principles of the system, this section explains how the design of circuits and systems describe above in conjunction with FIGS. 4-11 are synthesized, and shows how related power combiners and control laws within the scope of the concepts, systems and techniques described herein can be developed. As a first step, a seemingly-unrelated problem is discussed: the development of multi-stage resistance compression networks. It is then shown how the design and behavior of multi-stage compression networks can be used for synthesis of combiners and outphasing control laws.

As a route to illustrating the design and behavior of the proposed outphasing system, multi-stage resistance compression networks are first discussed. Resistance Compression Networks (RCNs) are a class of lossless interconnection networks for coupling a source to a set of matched (but variable) resistive loads.

Figure 12:
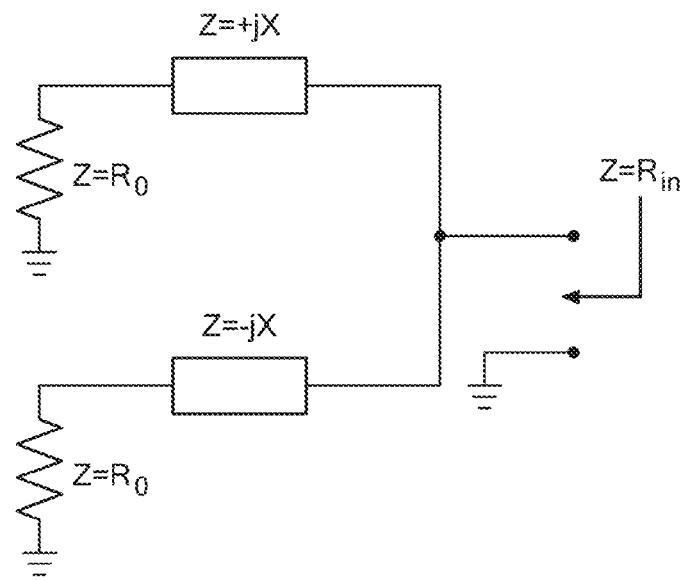
FIG. 12 is a block diagram of a resistance compression network (RCN)
Figure 12A:
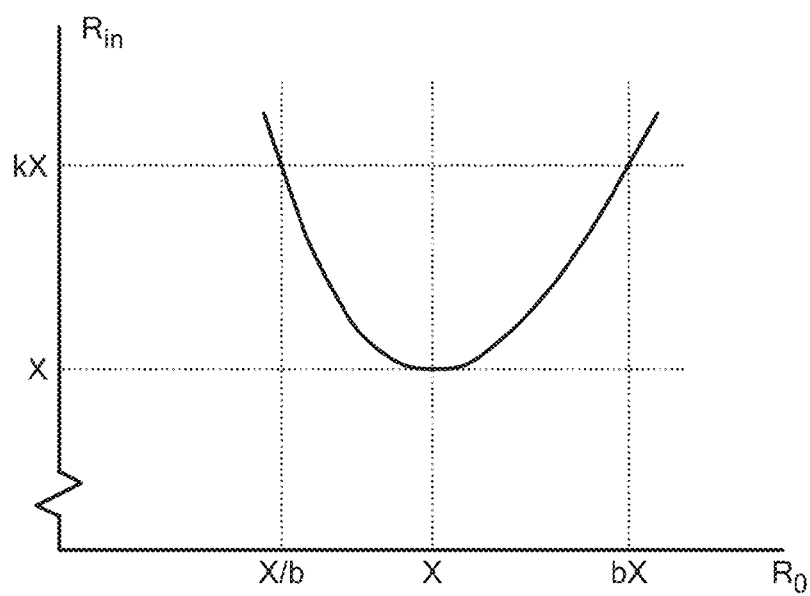
FIG. 12A is a plot of input impedance $R_{in}$ as a function of the matched load resistance value $R_o$ for the resistance compression network (RCN) of FIG. 12.

Referring now to FIGS. 12 and 12A, a resistance compression network (RCN) (FIG. 12) and its operating characteristic (FIG. 12A) are shown. FIG. 12A illustrates the resistive input impedance $R_{in}$ of the RCN of FIG. 12 as a function of the matched load resistance value $R_o$. As can be seen in FIG. 12A, as the resistance values of the matched load resistance $R_o$ vary together over a range geometrically-centered on X, the value of the input impedance is resistive and varies over a much smaller range than $R_o$. It should be noted that RCN networks have application to resonant dc-dc converters and rectifiers and to energy recovery in power amplifiers among other applications.

As the resistances $R_o$ in the RCN of FIG. 12 vary together over a range geometrically-centered on X, the input impedance of the network is resistive and varies over a much smaller range than $R_o$ varies. In particular, it can be shown that the input impedance is resistive at the operating frequency and is a function of the load resistance. This can be expressed as shown in Equation (19):

$$R_{in} = f(R_o) = \frac{R_o^2 + X^2}{2R_o} \quad (19)$$

As the load resistances Ro vary over the range [X/b, bX], the input resistance varies over the range [X,kX], where k and b are related as shown in Equation (20):

$$b = k + \sqrt{k^2 - 1} \quad (20)$$

and $$k = \frac{1 + b^2}{2b}$$

Because the input impedance is resistive and varies over a much smaller range than the matched load resistances $R_o$, RCN networks are advantageous in applications such as resonant rectifiers and dc-dc converters.

Multi-stage RCNs offer the possibility of even smaller input resistance variations (or wider load resistance ranges) than single-stage designs. Here we present for the first time the design of a multi-stage RCN to provide a specified maximum peak deviation in input resistance away from a desired median input resistance value, and determine the load resistance range over which this can be accomplished. In particular, we consider the design of the multi-stage resistance compression network shown in FIG. 13. We will subsequently show how this RCN relates to the outphasing system of FIG. 4.

Figure 13:
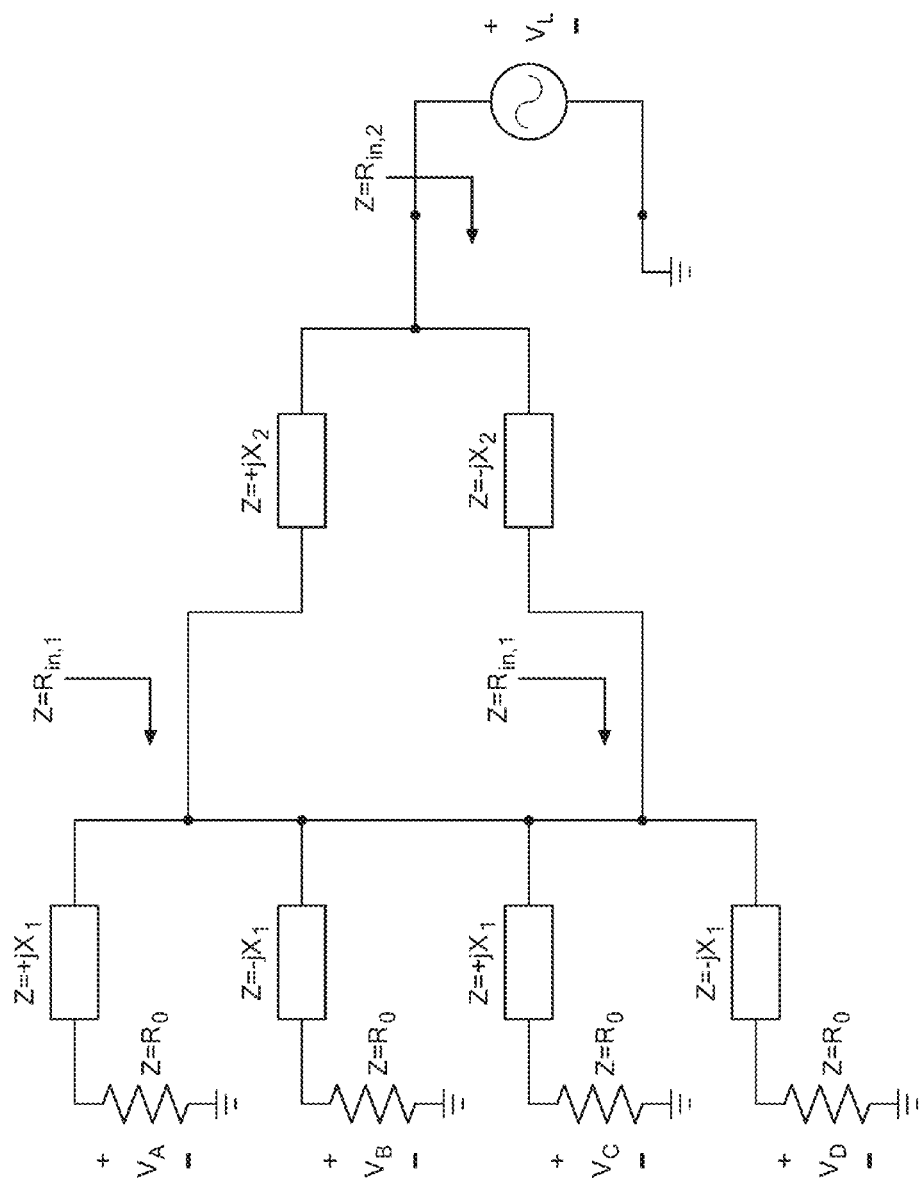
FIG. 13 is a block diagram of a multi-stage resistance compression network based on a cascade of the single-stage RCN network of FIG. 12.

Referring now to FIG. 13, a multi-stage resistance compression network is provided from a cascade of single-stage RCN networks which may be the same as or similar to the type described in conjunction with FIG. 12. A source $V_L$ driving the network is also shown. The RCN of FIG. 13 can be provided such that the input resistance $R_{in,2}$ varies much less than the matched load resistances $R_o$.

Suppose one would like to design the RCN of FIG. 13 to provide an input resistance $R_{in,2}$ within $\pm \Delta R$ of a desired median value $R_{in,2,med}$ over as wide a range as possible. To do this, a value $k_2$ (stage 2 input resistance ratio) is selected as shown in Equation (21):

$$k_2 = \frac{R_{in,2,med} + \Delta R}{R_{in,2,med} - \Delta R} \tag{21}$$

and select a stage two reactance magnitude as shown in Equation (22)

$$X_2 = \frac{2 R_{in,2,med}}{k_2 + 1} \tag{22}$$

which yields a value as shown in Equation (23):

$$R_{in,2,med} = \frac{k_2 + 1}{2} X_2 \tag{23}$$

and $$\Delta R = \frac{k_2 - 1}{2} X_2.$$

Next one considers selecting the stage one reactance magnitude $X_1$ to provide compression into a range that makes best use of the second stage. The effective resistance $R_{in,1}$ seen at the inputs of the first stage has a minimum value of $X_1$, so to maximize the $R_o$ range over which we achieve the desired compression we select $X_1$, as shown in Equations (24):

$$X_1 = \frac{1}{b_2} X_2 \tag{24}$$

where $b_2$ is determined from $k_2$ as per Equation (20). $R_{in,1}$ has a maximum value of $k_1 X_1$ where the operating range over which the desired degree of compression is achieved is found from Equation (25):

$$R_{in,1,max} = k_1 X_1 = b_2 X_2 \tag{25}$$

The desired degree of compression over an operating range of $R_o$ in $[X_1/b_1, b_1 X_1]$ where $b_1$ can be determined from Equations (20) and (25).

Figure 14:
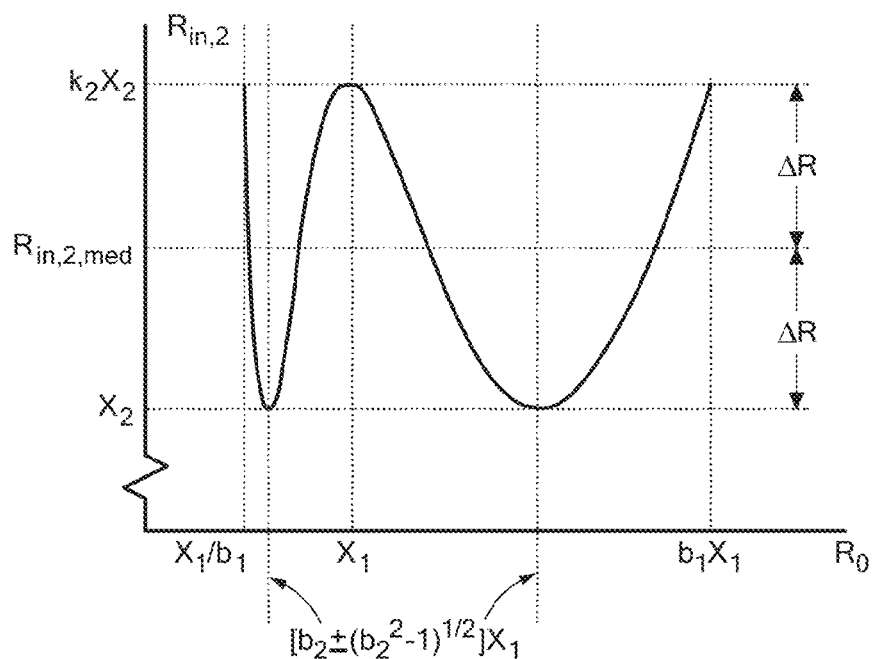
FIG. 14 is a plot of resistive input impedance $R_{in,2}$ as a function of the matched load resistance value $R_o$ for the two-stage compression network of FIG. 13.

Referring now to FIG. 14, a plot which shows how the input resistance $R_{in,2}$ varies as a function of matched load resistance $R_o$ when compression network values are selected as described above (e.g. for the two-stage compression network of FIG. 13) is shown. Selection of the compression network reactances as described provides this characteristic, which compresses resistance to a much greater extent than is possible in a single-stage compression network. For example, one can achieve resistance compression of the input resistance to within ±2.5% of the desired median value over a 12:1 ratio in load resistance $R_o$ with this technique. Similar levels of performance can be obtained using other types of compression stages. Moreover, even greater levels of resistance compression (or similar resistance deviations over wider ranges of load resistance) can be achieved with more stages.

As a final note, one will find it useful in the following section to know the load voltage $V_A$-$V_D$ in terms of the drive voltage $V_L$. It can be shown that the relation expressed in Equation (26) holds for these voltages:

$$\begin{bmatrix} V_A \\ V_B \\ V_C \\ V_D \end{bmatrix} = V_L \frac{\sqrt{R_o^2 + X_1^2}}{2\sqrt{\left(\frac{R_o^2 + X_1^2}{2R_o}\right)^2 + X_2^2}} \begin{bmatrix} e^{-j\phi} e^{-j\theta} \\ e^{j\phi} e^{-j\theta} \\ e^{-j\phi} e^{j\theta} \\ e^{j\phi} e^{j\theta} \end{bmatrix} \tag{26}$$

where $$\theta = ATAN\left(\frac{2 R_o X_2}{R_o^2 + X_1^2}\right) \tag{27}$$

and $$\phi = ATAN\left(\frac{X_1}{R_o}\right). \tag{28}$$

The phase relationship of these voltages is the same as that of the outphasing angles described in FIG. 5.

Next is provided a description of how the design and behavior of multi-stage compression networks can be used for synthesis of power combiners and outphasing control laws.

Consider the two-stage RCN shown in FIG. 13. Suppose we take this network, and change the sign of every reactance and resistance. This is equivalent to taking the network of FIG. 13 and applying type 1 time-reverse duality and then applying type 3 time reverse duality. Neglecting the impact upon the natural response of the circuit (which would become unstable), the sinusoidal steady-state behavior of such a circuit would have all current flow directions reversed, while preserving voltage relationships in the circuit, thus yielding reversed power flow (i.e. from the—now negative—resistors to the voltage source $V_L$. The ratio of the voltage $V_L$ to the current flowing into $V_L$ would be that of $R_{in,2}$ of the original compression circuit, which is close to the value $R_{in,2,med}$. Likewise, the voltages at the now-negative resistors would be as described in Equation (26), and currents proportional to these voltages would flow into the network (i.e., the apparent impedances seen looking into the network ports to which the negative resistances are connected would be resistive with values $|R_o|$.)

To develop a power combining and outphasing system, we take advantage of the above observations. In particular, we replace the source $V_L$ in FIG. 14 with a load resistance $R_L = R_{in,2,med}$ and replace the resistors $R_o$ with voltage sources (or power amplifiers in practice). This leads directly to the system of FIG. 4. Controlling the phases of the sources to match their behavior in the original two-stage resistance compression network, we can then obtain power control over a wide range while preserving nearly resistive loading of the sources (compare Equations (27), (28) to Equations (11), (11A)). While these substitutions do not lead to precise duality between RCNs and the proposed power combining and outphasing system, this approach nonetheless provides a means to develop effective outphasing and power combining systems such as described above in conjunction with FIGS. 4-11.

Figure 27:
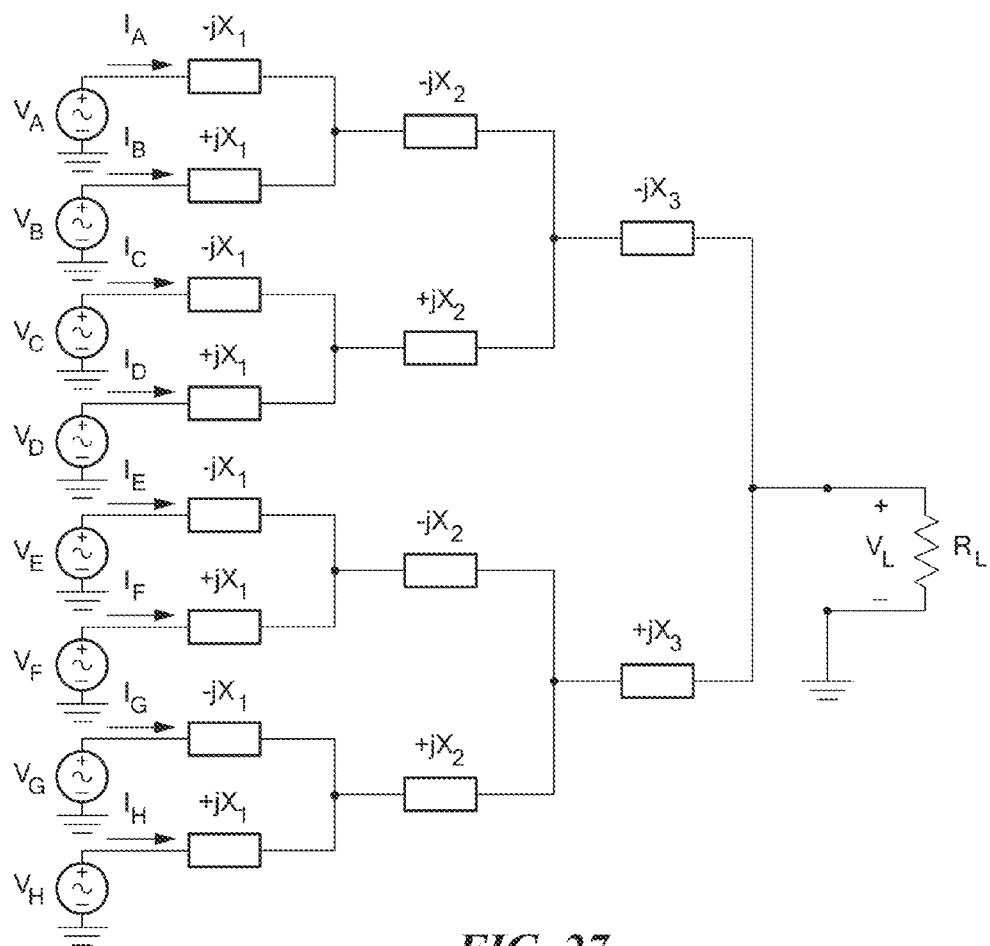
FIG. 27 is a binary tree implementation of an 8-way power combiner.

It will be appreciated that a wide variety of high-performance power combining and outphasing systems within the scope of the inventive concepts described herein can be synthesized through the approach described above. This includes designs based on multi-stage cascades of various types of compression network structures. For example, a three-level structure designed similarly (using 8 sources) as illustrated in FIG. 27 would yield even wider-range power control for a given allowable susceptive loading of the sources and a smaller achievable susceptance for a specified power control range. Likewise, using the topological dual of the RCN in FIG. 12 in a multi-stage design would likewise be effective as the basis for a combiner. Moreover, one could combine different types of base RCN circuits to construct effective combiners. It should be noted that for some types, all of the sources and/or loads may not be referenced to common potentials, so one may elect to use transformers or baluns to provide coupling. Finally, use of topological and/or time-reverse duality transformations will yield other combiner systems within the scope of the inventive concepts described herein as will network transformations such as T-Δ transformations.

Numerous other circuit opportunities also present themselves. The reactances in FIG. 4 are specified only at a single frequency, and one may choose to implement them with single inductors or capacitors as appropriate. However, one may also use higher-order reactive networks in developing networks within the scope of the invention. These may be selected to block or conduct dc- and/or higher-order harmonics, or to present desired impedances (e.g., for combining and outphasing) at harmonic frequencies or other desired operating frequencies. Likewise, while the development has been described in terms of lumped parameter elements, it will be appreciated that distributed elements (e.g., based on transmission-line networks) can likewise be used.

There is also flexibility of design within a combiner structure and control law. For example, the design discussed above in conjunction with FIGS. 4-11 utilized a value of design parameter k of 1.05. Different values of k may be selected based upon system design goals and requirements, such as the desired operating range and load sensitivities of the power amplifiers.

Figure 15:
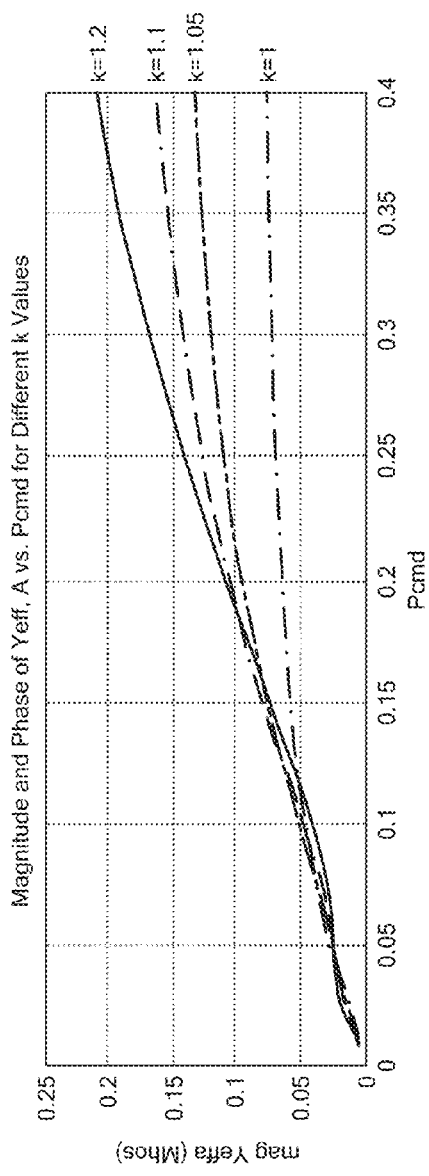
FIG. 15 is a plot of a magnitude of the effective admittance $Y_{eff,A}$ in the combiner of FIG. 4 in conjunction with control laws of Equations (10)-(12) for different values of design parameter k.
Figure 15A:
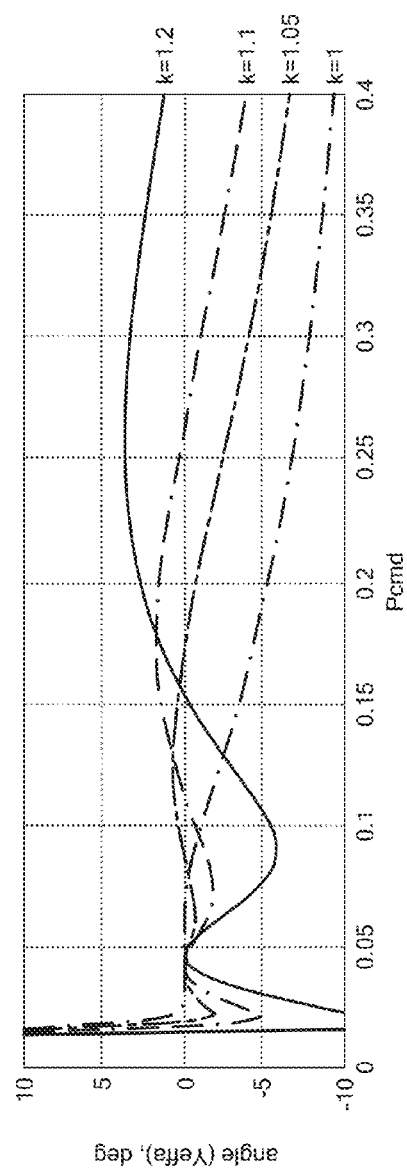
FIG. 15A is a plot of an angle of the effective admittance $Y_{eff,A}$ in the combiner of FIG. 4 in conjunction with control laws of Equations (10)-(12) for different values of design parameter k.

Referring now to FIGS. 15 and 15A, plots of the effective admittance $Y_{eff,A}$ in the combiner of FIG. 4 and control laws of Equations (10)-(11A) (AIRCN control method) for different values of design parameter k are shown. By examining FIGS. 15 and 15A, it can be seen that higher values of k provide a higher upper bound in achievable power delivery, but also results in greater phase variations over the operating range. Thus, FIGS. 15, 15A for example, show the influence of design parameter k on the effective admittance $Y_{eff,A}$.

Next described is a method for selecting power combiner reactance values. It should, of course, be appreciated that other techniques for selection of power combiner reactance magnitudes also exist.

The following methodology is proposed for selecting the reactances $X_1$ and $X_2$ of the power combiner in FIG. 4. The reactance magnitude $X_2$ is selected close to the load resistance $R_L$. In particular, a number k equal or slightly greater than 1 (e.g., k=1.05) can be specified, and $X_2$ can be determined as:

$$X_2 = \frac{2R_L}{k+1}. \tag{28}$$

The reactance magnitude $X_1$ is then selected in terms of $X_2$ and k according to:

$$X_1 = \frac{X_2}{k + \sqrt{k^2 - 1}}. \tag{29}$$

The above approach for selecting the reactance magnitudes originates from the design of Resistance Compression Networks (RCNs). That is, the relative reactances are selected based upon how one might design a resistance compression network to minimize peak deviations of the input resistance from a median value according to the methods in the section on Multi-Stage Resistance Compression. The performance and behavior of each power combiner with reactances selected as outlined above are uniquely determined by the particular k-value. Guidelines and techniques for selecting the appropriate value of k in order for the power combiner to satisfy specific performance specifications are discussed later in this document. Each of the outphasing control strategies disclosed below assume that $X_1$ and $X_2$ have been determined according to (28) and (29).

Moreover, this approach can easily be generalized for a $2^N$-way combiner with analogous implementation to that of FIG. 4 by first determining the appropriate value for $k_N$, and then applying the following recursive relations:

$$X_N = \frac{2R_L}{k_N + 1}, \; b_N = k_N + \sqrt{k_N^2 - 1} \tag{30}$$

$$X_{n-1} = \frac{X_n}{b_n} \text{ and } b_{n-1} = b_n^2 + \sqrt{b_n^4 - 1} \tag{31}$$

for $1 \leq n \leq N$.

Next described are multiple outphasing control strategies that are in accordance with the present invention. One outphasing control strategy is based upon an inverse resistance compression network (IRON) outphasing control technique (also referred to as the IRON method). The IRON outphasing control technique results by analogy of (approximate) reverse operation of a resistance compression network processing similar levels of power. That is, the PAs driving the combiner are appropriately outphased so that their terminal voltage phases match the voltage phases of the load resistances in the original RCN (i.e., the RCN which is approximates the double time-reverse dual of the combiner).

As a result, the power delivered to load $R_L$ driven by the power combiner is approximately equivalent to the power that would be delivered by a power source driving the original RCN and having the same terminal voltage as $R_L$. This outphasing control method yields desirable loading (almost entirely conductive effective input admittance) of the PAs. Moreover, due to this control method, the necessary outphasing control angles can be computed conveniently via a set of analytical expressions which are valid over the entire output power operating range of the combiner.

For the case of the 4-way power combiner in FIG. 4, the outphasing control angles θ and φ for a particular load $R_L$ and PA voltage amplitude $V_S$ are given by Equation (32) with the variable $R_o$ determined according to Equation (33). It can be further shown that φ is a monotonic function of power $P_{out}$ for every value of k≥1.

$$\theta = ATAN\left(\frac{2R_o X_2}{R_o^2 + X_1^2}\right) \tag{32}$$

and $$\phi = ATAN\left(\frac{X_1}{R_o}\right)$$

$$R_o = \frac{1}{\sqrt{\frac{4R_L V_S^2}{P_{out}} - X_1^2 - 2X_2^2 + 2\sqrt{\frac{4R_L^2 V_S^4}{P_{out}^2} - \frac{4R_L V_S^2 X_2^2}{P_{out}} + X_1^2 X_2^2 + X_2^4}}} \tag{33}$$

It should be noted here that we may think of $P_{out}$ in Equation (33) as the desired output power (the command input), which will also be the actual output power under ideal conditions (e.g., with precise component values and zero combiner loss). The difference between this IRON method and the closely-related AIRCN method described above is that the IRON method uses a more exact (but more complicated) expression to relate the commanded power ($P_{cmd}$ or $P_{out}$) to the intermediate variable ($r_o$ or $R_o$) in finding the control angles. For example, compare Equations (10)-(11A) to Equation (32) and (33). Nevertheless, both the IRON and AIRCN control methods result in equivalent effective input admittance characteristics versus actual output power delivered by the power combiner to the load. It is readily observable from Equations (1)-(4) and (32) that for zero output power ($P_{out}$=0), all PA voltages are in phase (θ=0°, φ=0°) and the effective input admittances (purely susceptive) may be expressed as shown in Equation (34):

$$Y_{eff,A} = Y_{eff,C} = jX_1^{-1}$$

$$Y_{eff,B} = Y_{eff,D} = -jX_1^{-1} \tag{34}$$

At saturated output power $P_{out,sat}$ (θ=0°, φ=90°) the effective input admittances are given by Equation (35)

$$Y_{eff,A} = X_1^{-1}(4\gamma + j(1-2\beta))$$

$$Y_{eff,B} = X_1^{-1}(4\gamma + j(-1-2\beta))$$

$$Y_{eff,C} = X_1^{-1}(4\gamma - j(-1-2\beta))$$

$$Y_{eff,D} = X_1^{-1}(4\gamma - j(1-2\beta)) \tag{35}$$

and the maximum phase φ associated with them is provided by Equation (36), where $\gamma = R_L/X_1$, $\beta = X_2/X_1$:

$$\varphi = ATAN\left\{\frac{1 + 2(k + \sqrt{k^2 - 1})}{2(k+1)(k + \sqrt{k^2 - 1})}\right\} \tag{36}$$

Figure 17:
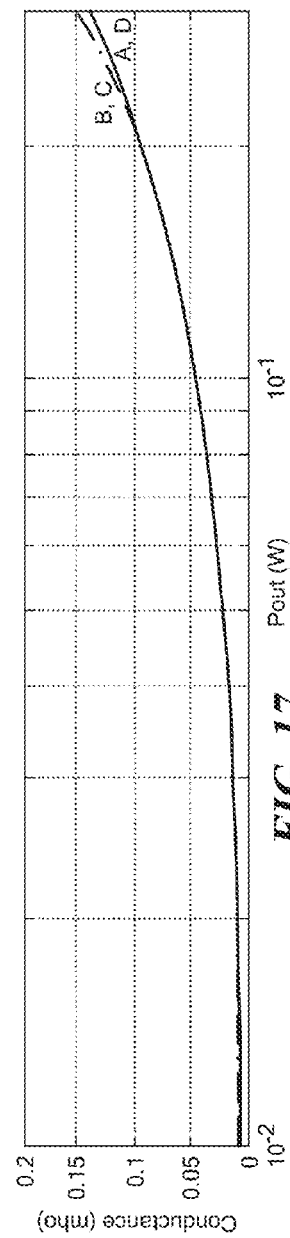
FIG. 17 is a plot of effective conductance vs. Pout as seen by each of the Power Amplifiers (A-D) driving the 4-way combiner of FIG. 4 with $V_S=1$V, $R_L=50\Omega$ and k=1.05 as a result of an inverse RCN outphasing control.
Figure 17A:
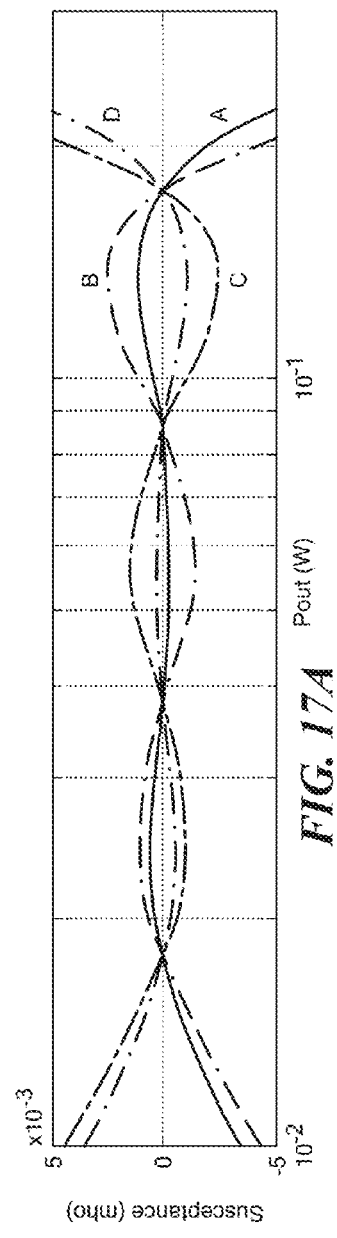
FIG. 17A is a plot of effective susceptance vs. Pout as seen by each of the Power Amplifiers (A-D) driving the 4-way combiner of FIG. 4 with $V_S=1$V, $R_L=50\Omega$ and k=1.05 as a result of an inverse RCN outphasing control.
Figure 17B:
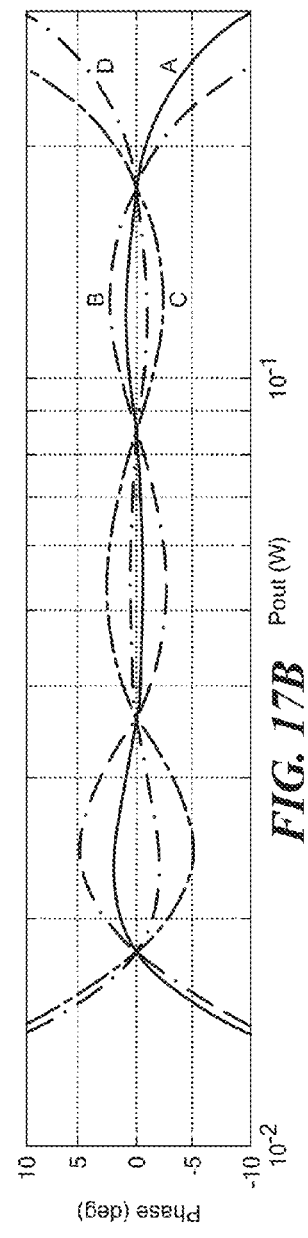
FIG. 17B is a plot of effective phase vs. Pout as seen by each of the Power Amplifiers (A-D) driving the 4-way combiner of FIG. 4 with $V_S=1$V, $R_L=50\Omega$ and k=1.05 as a result of an inverse RCN outphasing control.

As an example, FIGS. 17, 17A and 17B depict the effective input conductance, susceptance and phase seen by each of the PAs driving the power combiner of FIG. 4 with $V_S$=1V, $R_L$=50Ω, and k=1.05 and the IRON control method. It should be understood that nonidealities such as parasitic losses are not considered, so no distinction is made between commanded and actual output power.

The output power levels at which all four susceptive components of the effective input admittances become zero (referred to as a zero-point) can be computed according to Equations (37)-(40).

$$P_{out,zp1} = 2V_S^2 \left(R_L + \sqrt{R_L^2 - X_2^2} - \sqrt{2R_L^2 - X_1^2 - X_2^2 + \frac{2R_L^3 - 2R_L X_2^2}{\sqrt{R_L^2 - X_2^2}}}\right)^{-1} \tag{37}$$

$$P_{out,zp2} = 2V_S^2 \left(R_L + \sqrt{R_L^2 - X_2^2} + \sqrt{2R_L^2 - X_1^2 - X_2^2 + \frac{2R_L^3 - 2R_L X_2^2}{\sqrt{R_L^2 - X_2^2}}}\right)^{-1} \tag{38}$$

$$P_{out,zp3} = 2V_S^2 \left(R_L - \sqrt{R_L^2 - X_2^2} - \sqrt{2R_L^2 - X_1^2 - X_2^2 - \frac{2R_L^3 - 2R_L X_2^2}{\sqrt{R_L^2 - X_2^2}}}\right)^{-1} \tag{39}$$

$$P_{out,zp4} = 2V_S^2 \left(R_L - \sqrt{R_L^2 - X_2^2} + \sqrt{2R_L^2 - X_1^2 - X_2^2 - \frac{2R_L^3 - 2R_L X_2^2}{\sqrt{R_L^2 - X_2^2}}}\right)^{-1} \tag{40}$$

Another control methodology is referred to as optimal susceptance outphasing control. This strategy is characterized with the following two main advantages: (1) minimizes the effective input susceptance seen by the PAs at each power level, and (2) achieves even susceptive loading amplitude of the PAs over the desired output power operating range.

For the 4-way combiner described hereinabove in conjunction with FIG. 4, the optimal susceptance control angle pair [θ; φ] can be computed for a particular output power level $P_{out}$ by numerically minimizing the largest effective input admittance susceptance $S_{max}$ seen by any of the PAs (at $P_{out}$) subject to the constraint of Equation (41):

$$S_{max} = \max\{|\text{Im}\{Y_{eff,A}\}|, |\text{Im}\{Y_{eff,B}\}|\} \tag{41}$$

$$P_{out} = \frac{8R_L V_S^2}{X_1^2} \sin^2(\phi)\cos^2(\theta). \tag{42}$$

Appropriate control angles as a function of power for a given design can be found using numerical methods. Also, it can be shown that for the range of output power levels given by Equation (43), the solutions of the preceding optimization problem of Equations (41), (42) reduce to a set of convenient analytical expressions for calculating the control angles given by Equation (43).

$$\frac{4R_L^2 V_S^2 - 2V_S^2\sqrt{4R_L^4 - R_L^2 X_1^2}}{X_1^2 R_L} \leq P_{out} \leq \frac{4R_L^2 V_S^2 + 2V_S^2\sqrt{4R_L^4 - R_L^2 X_1^2}}{X_1^2 R_L} \quad (43)$$

$$\theta = A\cos\left(\sqrt{\frac{4V_S^4 + P_{out}^2 X_1^2}{8P_{out}R_L V_S^2}}\right) \quad (44)$$

and $$\phi = A\tan\left(\frac{P_{out} X_1}{2V_S^2}\right)$$

As an example, FIGS. 18, 18A, and 18B show a plot of the effective input conductance, susceptance and phase seen by each of the PAs driving the power combiner of FIG. 4 with $V_S=1V$, $R_L=50\Omega$, and $k=1.05$ with Optimal Susceptance (OS) control. The zero-points occur at the same output power levels as in the case of the Inverse RCN outphasing control and can be computed according to (37)-(40). Moreover, the discussion about zero-power and saturated power output levels for the Inverse RCN control similarly applies to this control method. Also, for the range of output powers (or equivalently, output voltage amplitudes) between the zero-points of the susceptances, the effective susceptance amplitude at each of the combiner inputs is substantially the same.

Still another control methodology, referred to as optimal phase (OP) outphasing control, is proposed which, in turn, is characterized with its two main advantages: (1) minimizes the effective input admittance phase seen by the PAs at each power level, and (2) ensures that each PA sees the same load phase magnitude. For the 4-way combiner addressed here (see FIG. 4), the optimal phase control angle pair $[\theta; \phi]$ can be computed for a particular output power level $P_{out}$ by numerically minimizing the largest effective input admittance phase $\phi_{max}$ seen by the PAs (at $P_{out}$) (45) subject to the constraint set forth by Equation (46):

$$\varphi_{max} = \max\left\{A\tan\left(\left|\frac{\text{Im}\{Y_{eff,A}\}}{\text{Re}\{Y_{eff,A}\}}\right|\right), A\tan\left(\left|\frac{\text{Im}\{Y_{eff,B}\}}{\text{Re}\{Y_{eff,B}\}}\right|\right)\right\} \quad (45)$$

$$P_{out} = \frac{8R_L V_S^2}{X_1^2}\sin^2(\phi)\cos^2(\theta). \quad (46)$$

It can be shown that for the range of output power levels given by (47), the solutions of the preceding optimization problem (see Equations (45), (46)) reduce to a nonlinear system of Equations (48) which can be solved for $[\theta; \phi]$ by employing conventional numerical methods.

$$\frac{4R_L^2 V_S^2 - 2V_S^2\sqrt{4R_L^4 - R_L^2 X_1^2}}{X_1^2 R_L} \leq P_{out} \leq \frac{4R_L^2 V_S^2 + 2V_S^2\sqrt{4R_L^4 - R_L^2 X_1^2}}{X_1^2 R_L} \quad (47)$$

$$\frac{P_{out} X_1^2}{8R_L V_S^2} = \sin^2(\phi)\cos^2(\theta) \quad (48)$$

$$\sin(2\phi) = \frac{2\gamma\cos^2(\theta)}{\beta^2 + 4\gamma^2\cos^2(\theta) - 2\beta\gamma\sin(2\theta)}$$

As an example, FIGS. 19, 19A and 19B illustrate the effective input conductance, susceptance and phase (respectively) seen by each of the PAs driving the power combiner of FIG. 4 with $V_S=1V$, $R_L=50\Omega$, and $k=1.05$ and optimal phase control. The zero-points occur at the same output power levels as in the case of the Inverse RCN outphasing control and can be computed according to Equations (37)-(40). Moreover, the discussion about zero-power and saturated power output levels for the Inverse RCN control equally well applies to this control method. Also, for the range of output powers (or equivalently, output voltage amplitudes) between the zero-points of the susceptances, the effective immittance (admittance or impedance) phase amplitude at each of the combiner inputs is substantially the same.

Figure 20:
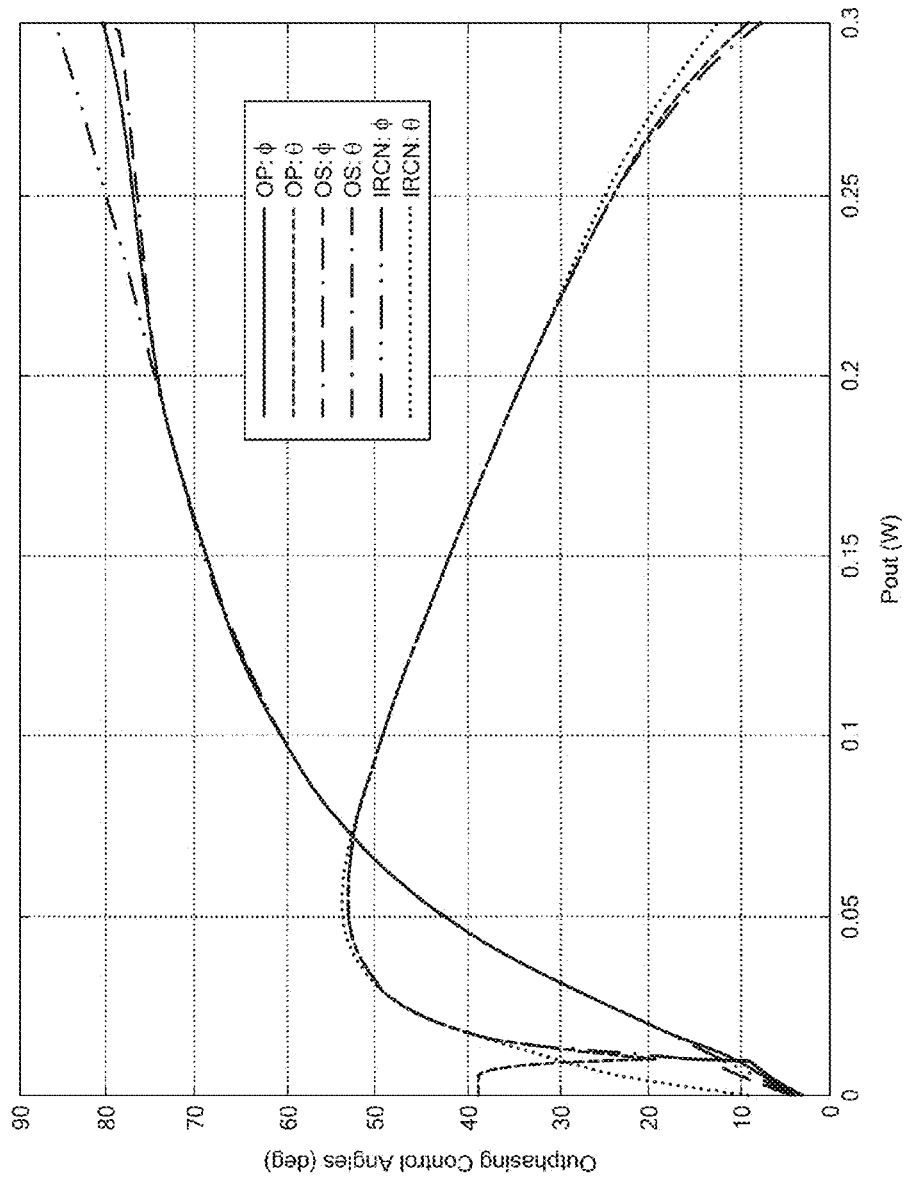
FIG. 20 is a plot of outphasing control angles θ and φ vs. Pout for the Optimal Phase (OP), Optimal Susceptance (OS), Inverse RCN (IRON) control methods for the 4-way combiner of FIG. 4 with $V_S=1$V, $R_L=50\Omega$, and k=1.05.

All of the above methodologies can be adapted for the outphasing control of a general N-way power combiner. Moreover, one could switch methodologies based on operation over different power ranges or for different operating conditions if desired. Nevertheless, to compare the relative performance of each control method, consider as an example the power combiner of FIG. 4 with $R_L=50\Omega$, $V_S=1V$, and $k=1.05$. FIG. 20 shows the appropriate outphasing control angles $\theta$ and $\phi$ for each of the above control methods for an output power in the range $[0W; P_{out,sat}\approx0.3W]$.

It can be clearly seen from FIG. 20 that the Optimal Phase and Optimal Susceptance control angles are almost entirely identical over a significant portion of the output power operating range. Thus by choosing the control angles to minimize the effective input admittance phase seen by the PAs, for all practical purposes, one effectively minimizes the susceptive components as well, and vice versa.

Figure 21:
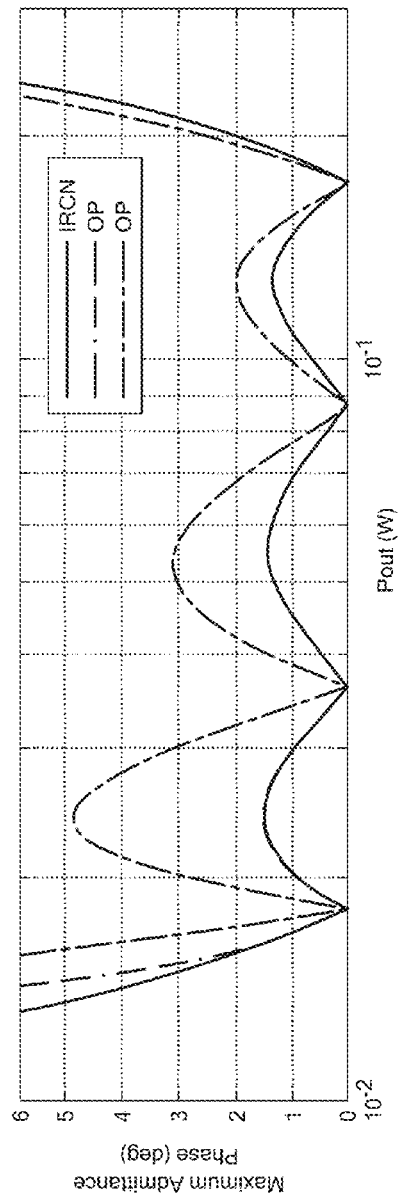
FIG. 21 is a plot of a worst-case effective input admittance phase magnitude seen by the PAs driving the 4-way combiner of FIG. 4 with $V_S=1$V, $R_L=50\Omega$, and k=1.05 as a result of the Optimal Phase (OP), Optimal Susceptance (OS) and Inverse RCN (IRON) outphasing control methods.
Figure 21A:
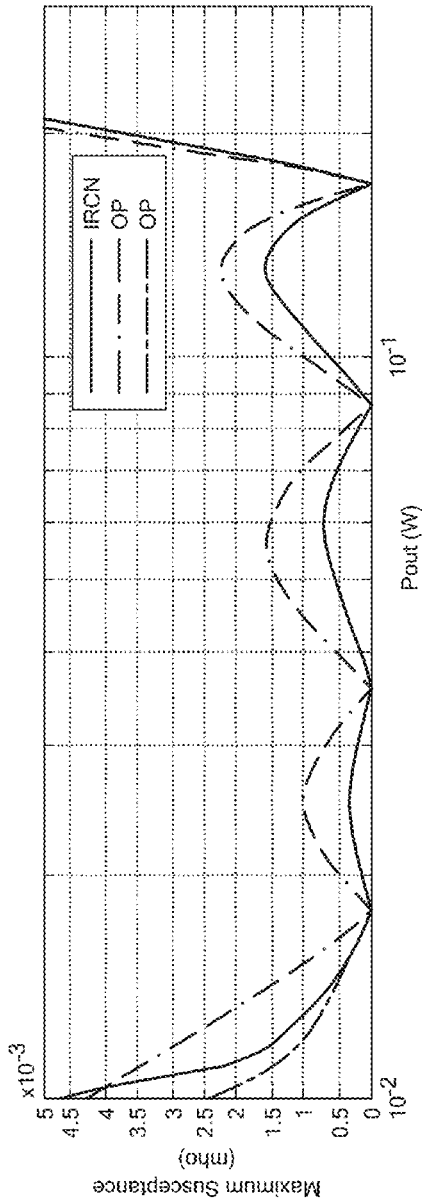
FIG. 21A is a plot of a worst-case effective susceptance magnitude seen by the PAs driving the 4-way combiner of FIG. 4 with $V_S=1$V, $R_L=50\Omega$, and k=1.05 as a result of the Optimal Phase (OP), Optimal Susceptance (OS) and Inverse RCN (IRON) outphasing control methods.

FIGS. 21 and 21A further demonstrates this observation by examining the worst-case input admittance phase magnitude and susceptance magnitude seen by the PAs for a particular output power level in the operating region of interest for the same 4-way power combiner as above. From FIGS. 21 and 21A, it can be seen that the optimal susceptance and optimal phase control methods result in approximately equivalent phase and susceptance characteristics over the main operating power range with over a factor of three improvement compared to the Inverse RCN control method. For this case, the inverse RCN control method yields less than 5 degrees of admittance phase magnitude over more than a factor of ten in power, while the optimal phase and optimal susceptance methods yield less than 1.6 degrees.

As already mentioned, the operating characteristics of an N-way power combiner system are uniquely determined by the selected value of k that is utilized for computation of the combiner's reactance magnitudes according to the recursive relations in Equations (30) and (31). A general approach is developed for selecting the appropriate value of k in order to satisfy a set of specific performance specifications. In particular, given an N-way power combiner and a specified output power operating range $[P_{out,min}, P_{out,max}]$ of interest, two design problems are considered: (1) determine a k-value that will minimize the worst-case effective input admittance phase seen at the input ports of the combiner over this operating range, or (2) determine a k-value that will minimize the worst-case effective input susceptance seen at the input ports of the combiner over the specified operating range. Note that the specified operating range is simply one over which there is particular interest in minimizing admittance phase or susceptance magnitude, and may or may not represent the full operating range of the system. Each of these two design problems is individually addressed below for the case of the 4-way combiner of FIG. 4.

Next described are techniques for designing for minimum effective input admittance phase magnitude.

Figure 22:
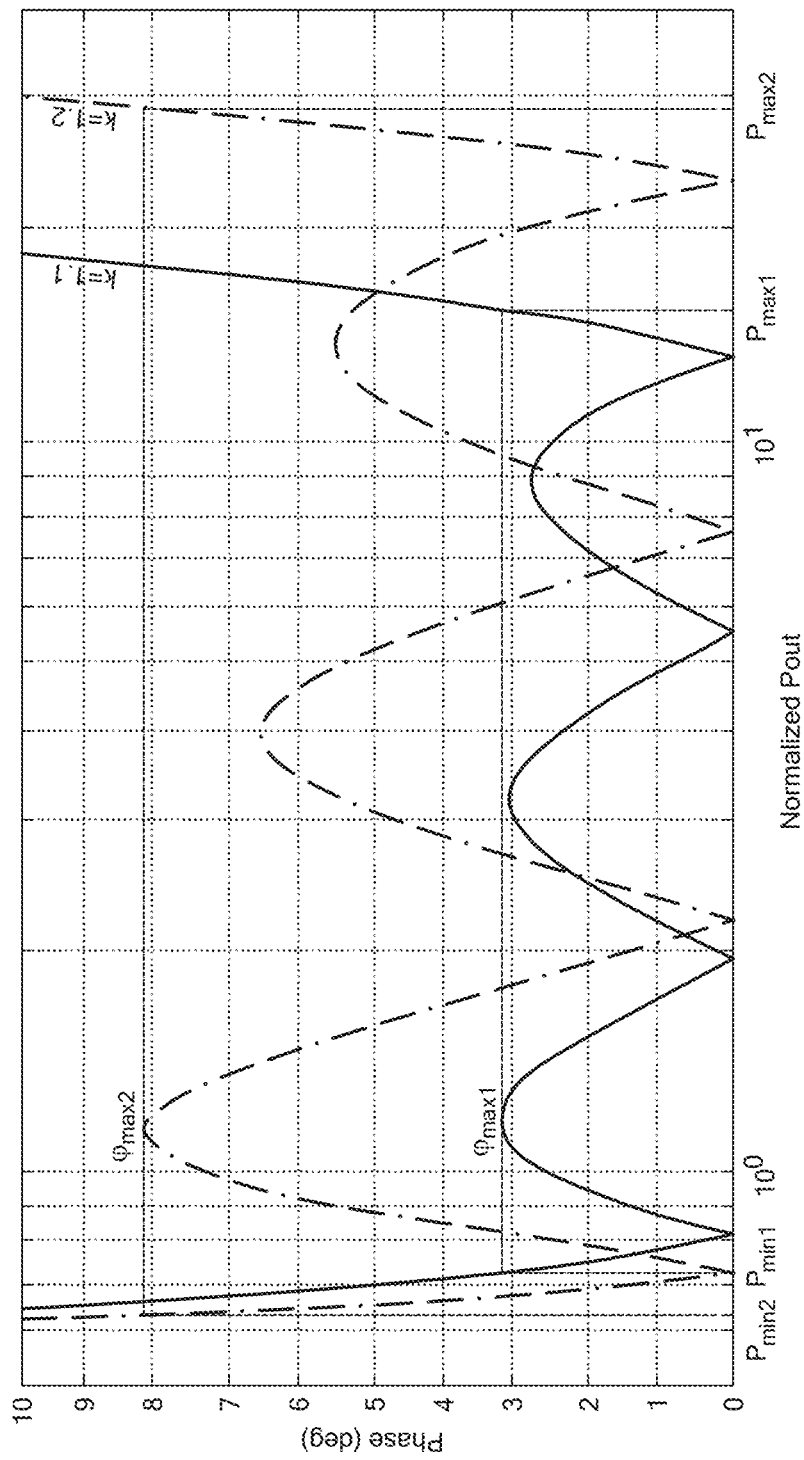
FIG. 22 is a plot of a worst-case effective input admittance phase magnitude seen by the PAs driving the 4-way combiner of FIG. 4 according to the Optimal Phase outphasing control for k=1.1 and k=1.2. Power axis is normalized to $V_S=1$V and $R_L=1\Omega$; denormalize for a particular $V_s$ and $R_L$ by multiplying the power axis by $V_S*V_S/R_L$.

Referring now to FIG. 22, FIG. 22 illustrates the worst-case input admittance phase versus output power level $P_{out}$ (phase-power curve) seen by the PAs driving the 4-way combiner of FIG. 4 according to the Optimal Phase outphasing control for two distinct values of k. Suppose that the specified operating range of this combiner over which worst-case phase deviations are to be minimized is [$P_{min1}$, $P_{max1}$]. It can be theoretically shown that the optimal value of k minimizing the worst-case admittance phase seen over this operating range is such that the phase-power curve associated with it has a maximum phase $\phi_{max}$ equal to the worst-case admittance phases at $P_{min1}$, and $P_{max1}$. As can be seen from FIG. 22, for the combiner considered here, this corresponds to k=1.1. If instead a wider operating range is specified, for instance [$P_{min2}$, $P_{max2}$], a larger value of k will be necessary (k=1.2 for this example) as demonstrated by FIG. 22, and the maximum admittance phase that must be tolerated in this case will also increase (changing approximately from 3.1° to 8.1°).

The developments above are valid and easily-adoptable for the general N-way combiner. In general, smaller k-values result in narrower power operating ranges for which worst-case phase is minimized and smaller worst-case admittance phase, while larger k-values allow wider operating power ranges over which worst-case phase is minimized at the expense of higher worst-case admittance phase. Increasing the order of the N-way combiner (larger N) expands its performance capabilities and allows it to operate in a given power range at smaller worst-case admittance phase compared to a lower-order power combiner.

Figure 23:
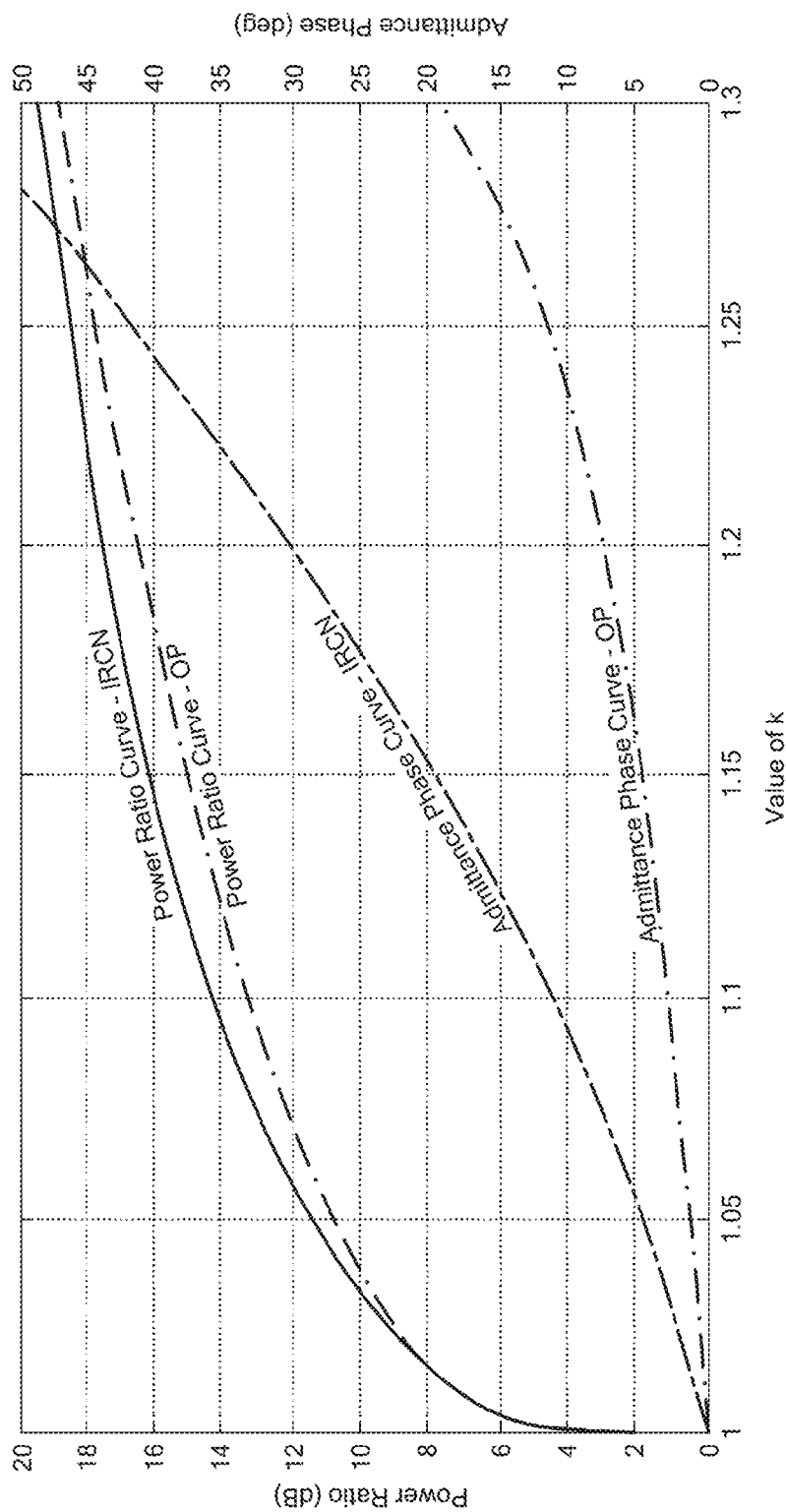
FIG. 23 is a plot of Input admittance phase-minimizing design curves for a 4-way power combiner for the Inverse RCN (IRON) and the Optimal Phase (OP) outphasing control methods.

For the case of the 4-way combiner of FIG. 4, FIG. 23 indicates the optimal value of k for a given specified output power range ratio (PRR), where PRR is the ratio of the maximum to the minimum output power over which peak phase deviations (from zero) are to be minimized. Power Ratio Curves for both the Inverse RCN and Optimal Phase control methods are shown. The value of k is found by tracing horizontally from the specified power ratio to the Power Ratio Curve of interest, and tracing vertically to find k. The corresponding worst-case admittance phase for the specified operating range (power ratio) can be obtained by tracing the k-value of choice vertically to the respective Phase Curve and horizontally (right) to the corresponding admittance phase.

Figure 24:
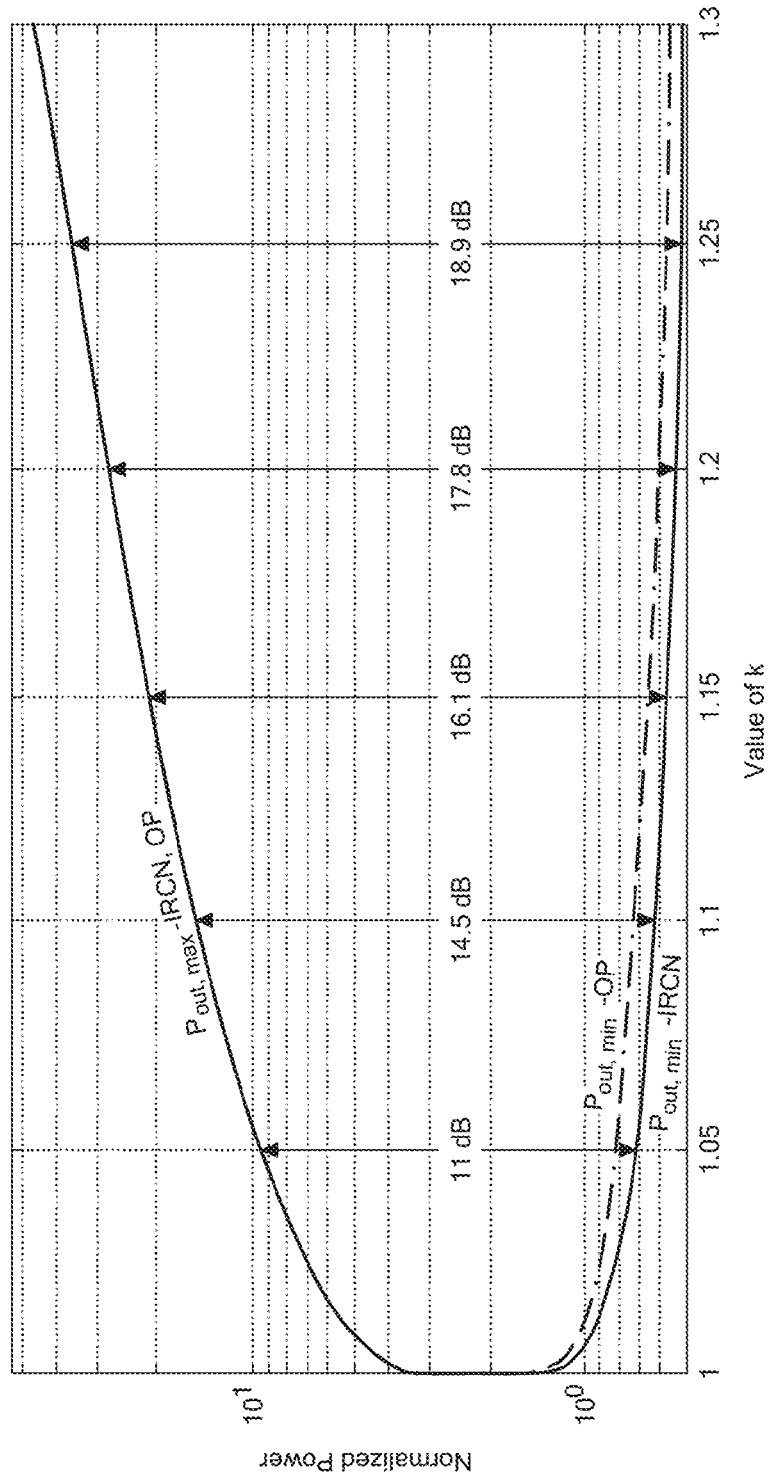
FIG. 24 is a normalized plot ($V_S=1$ V, $R_L=1\Omega$) of the minimum and maximum limits of the output power operating range for which the peak phase deviation is minimized (admittance phase-minimizing design) versus the k-value for a 4-way power combiner for the Inverse RCN (IRON) and the Optimal Phase (OP) outphasing control methods.

FIG. 24 depicts the actual minimum and maximum output power levels (relating to the phase deviation peak for that value of k) for each of the two outphasing control methods normalized to $V_S$=1V, $R_L$=1Ω for a given k-value. To denormalize for a particular $V_S$ and $R_L$, the limits must be multiplied by $V_S * V_S / R_L$.

Next described are techniques for designing for minimum effective input susceptance magnitude.

The methodology for selecting the optimal value of k that will minimize the worst-case input susceptance over a specified operating power range [$P_{min}$, $P_{max}$] is analogous to the one presented above. In this case, however, the optimal value of k is such that the susceptance-power curve associated with it has a maximum susceptance equal to the worst-case susceptance at $P_{min}$ and $P_{max}$.

Figure 25:
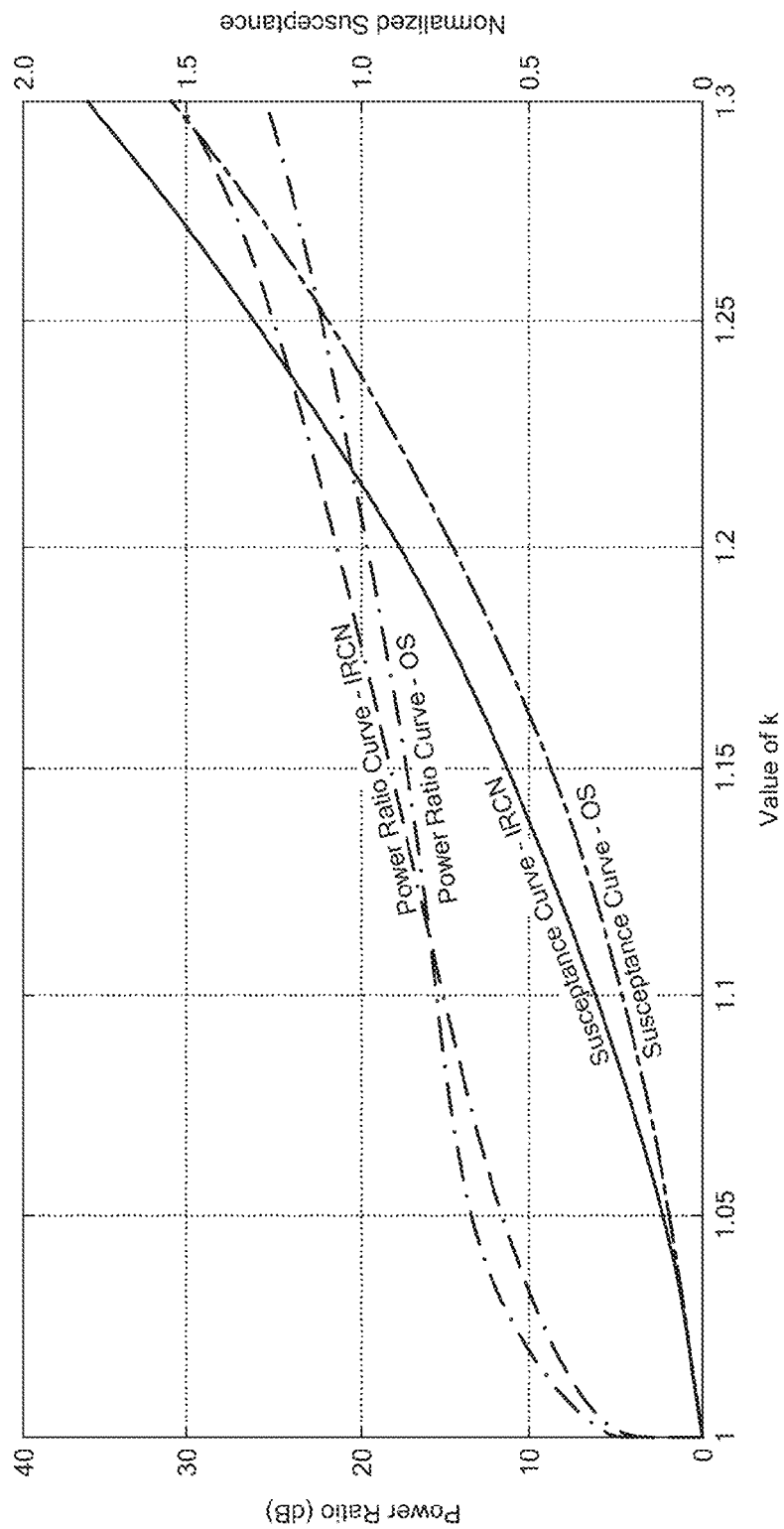
FIG. 25 is a plot of input susceptance-minimizing design curves for a 4-way power combiner for the Inverse RCN (IRON) and the Optimal Susceptance (OS) outphasing control methods.
Figure 26:
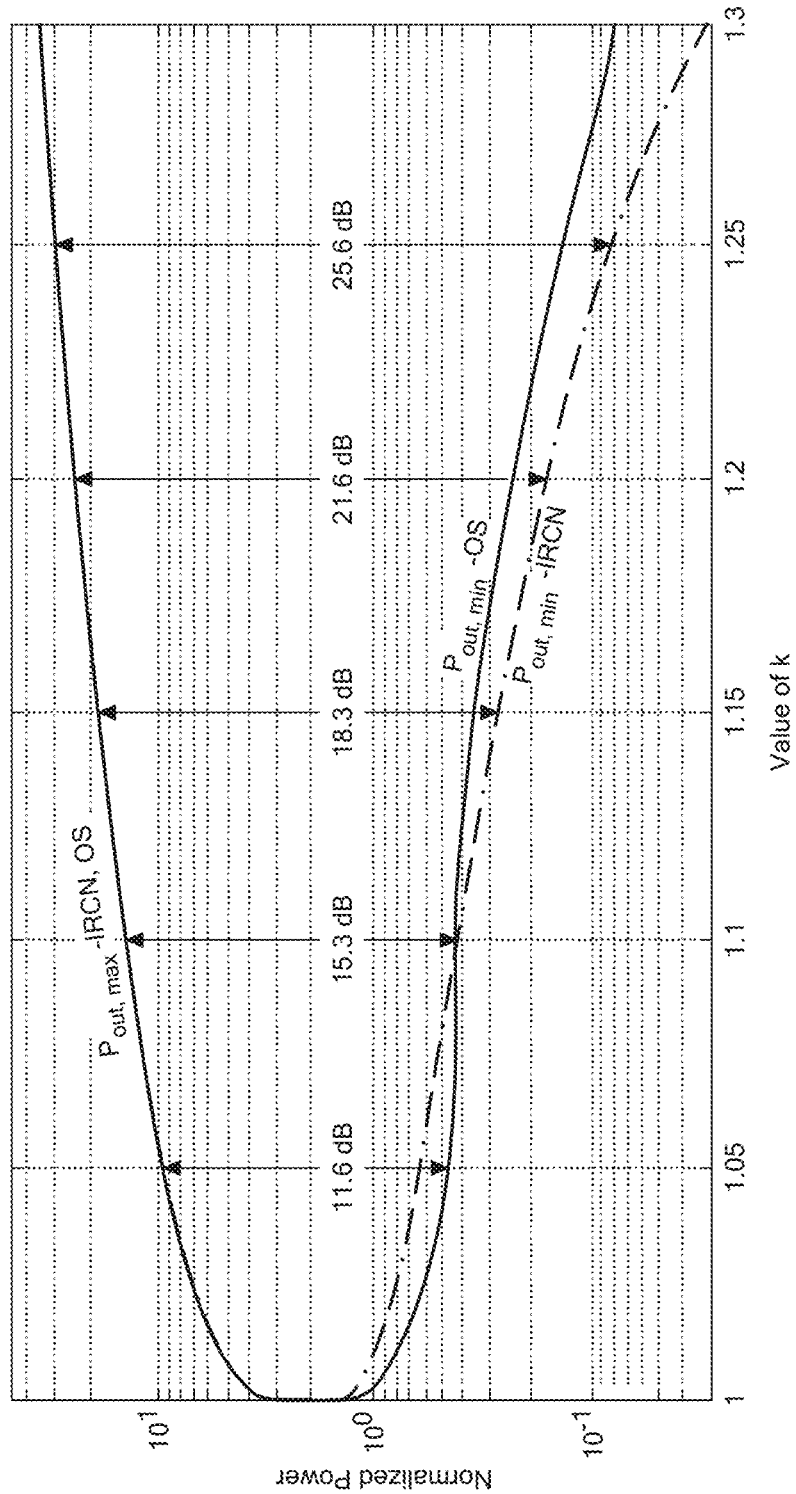
FIG. 26 is a normalized plot ($V_S$=1 V, $R_L$=1Ω) of the minimum and maximum limits of the output power operating range for which the peak susceptive deviation is minimized (susceptance-minimizing design) versus the k-value for a 4-way power combiner for the Inverse RCN (IRON) and the Optimal Phase (OP) outphasing control methods.
Figure 28:
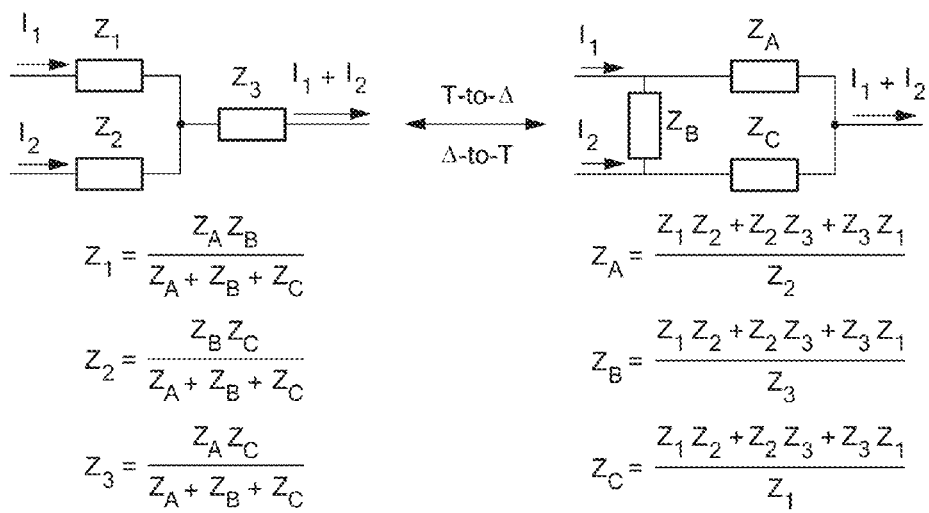
FIG. 28 is T-Δ general network transformation.

For the case of the 4-way combiner of FIG. 4, FIG. 25 indicates the optimal value of k for a given specified output power range ratio. Power Ratio Curves for both the Inverse RCN and Optimal Susceptance control methods are shown. The corresponding worst-case susceptance for the specified operating range can be obtained by tracing the k-value of choice to the Susceptance Curve (normalized to $R_L$=1Ω). Susceptance can be denormalized by simply dividing it by the intended value of $R_L$. FIG. 28 depicts the respective minimum and maximum output power levels associated with the related peak susceptive deviation for both control methods normalized to $V_S$=1V, $R_L$=1Ω for a given k-value. To denormalize for a particular $V_S$ and $R_L$, the limits must be multiplied by $V_S * V_S / R_L$.

Using the information represented in FIGS. 23 and 24, it can be shown that over power ratios of 2, 5, 10, 20 and 50 the 4-way combiner can ideally achieve worst-case input admittance (or impedance, or generally immitance) phase amplitudes of 0.07, 0.78, 3.05, 8.18 and 25.36 degrees with the IRCN control method and 0.01, 0.31, 1.15, 3.01, and 9.35 degrees with the OP control method. Thus, achieving worst case phase variations of less than 1 degree over a factor of 5 in power, 5 degrees over a factor of ten in power, ten degrees over a factor of 20 in power and 30 degrees over a factor of 50 in power is possible in practice with a variety of control laws in keeping with this disclosure. Moreover, some control laws in keeping with this disclosure can practically achieve worst-case phase amplitudes of less than two degrees over a factor of ten in power, five degrees over a factor of twenty in power, and fifteen degrees over a factor of fifty in power. Still much smaller phase magnitudes (or wider power ranges at constant phase magnitudes) are achievable with an 8-way combining system.

Next described are a variety of power combiner topological implementations and transformations.

It should be appreciated that many of the concepts and techniques described herein have referred to the implementation shown in FIG. 4. This combiner implementation may be thought of as including a binary tree of reactances having complementary reactances at each bifurcation in the tree.

It should be appreciated, however, that for a binary tree combiner implementation with M bifurcations, one has N=$2^M$ inputs and 2N−2 reactive branches. As an example, FIG. 27 depicts such a "binary tree" implementation of an 8-way combiner (N=8). Nevertheless, various topological transformations may be applied to this basic "binary tree" realization to obtain other useful implementations of the combiner. Here we discuss two such types of topological transformations: (1) T-Δ network transformation (also known as the Y-Δ or star-triangle transformation), and (2) topological duality transformation. These transformations are used to and enumerate other possible topological implementations of the 4-way combiner; similar techniques can be used to synthesize other combiners in keeping with the present invention (e.g., for higher-order N). Although the input-port and output-port characteristics, as will be demonstrated below, remain largely unaffected under these transformations, depending on the application of the combiner and component values that result, one implementation may be preferred over another.

Referring now to FIG. 28, the general T-Δ network transformation of a three-terminal network is shown.

Figure 29:
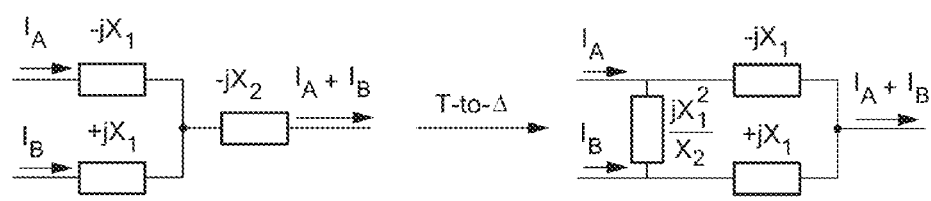
FIG. 29 is T-to-Δ transformation applied to the top T-network of the 4-way combiner in FIG. 4.

An important characteristic of the transformation is that it does not affect the transformed network's interface with other networks connected to its terminals. In other words, the current-voltage relationship at each terminal of the transformed network is preserved under the transformation. FIG. 29 depicts the same transformation applied to top T-network of the power combiner in FIG. 4.

Figure 30:
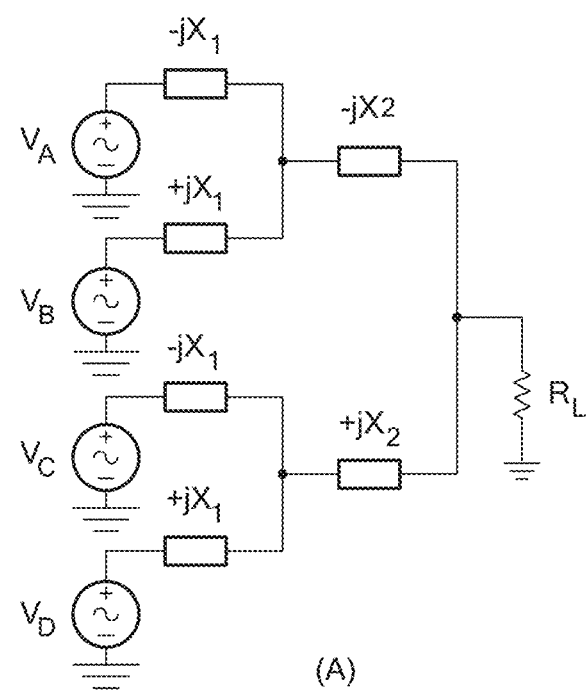
FIG. 30 is a basic 4-way combiner with power amplifier inputs and load network connection shown.
Figure 30A:
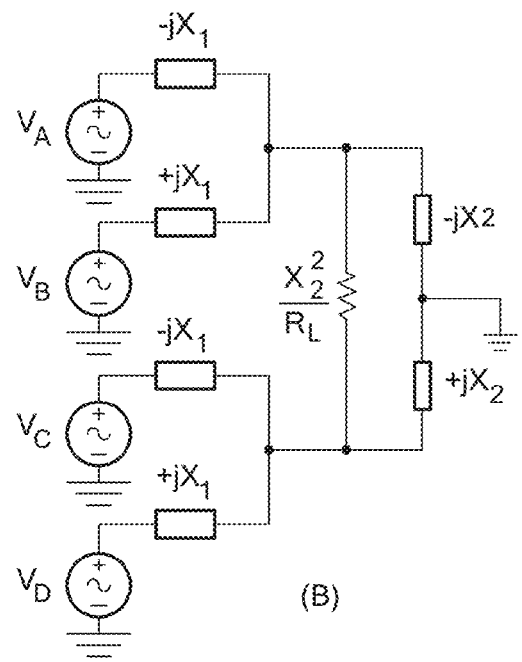
FIGS. 30A-30D are four possible topological variations of the basic 4-way combiner of FIG. 30 as result of T-Δ transformations on portions of the network and load with power amplifier inputs and load network connection shown.
Figure 30B:
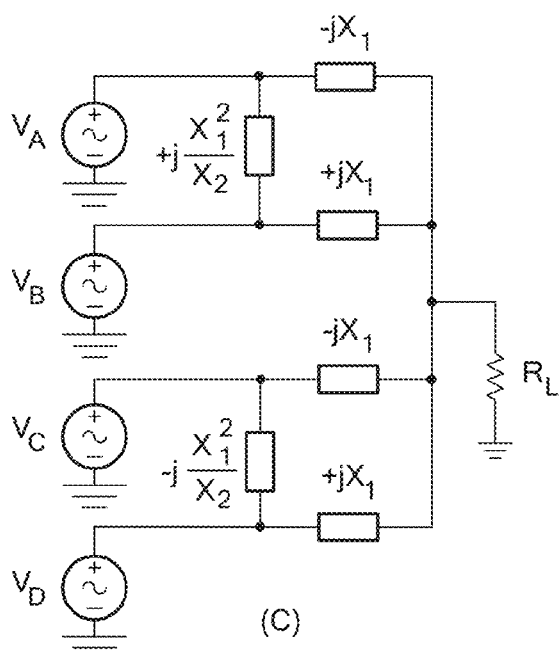
Figure 30C:
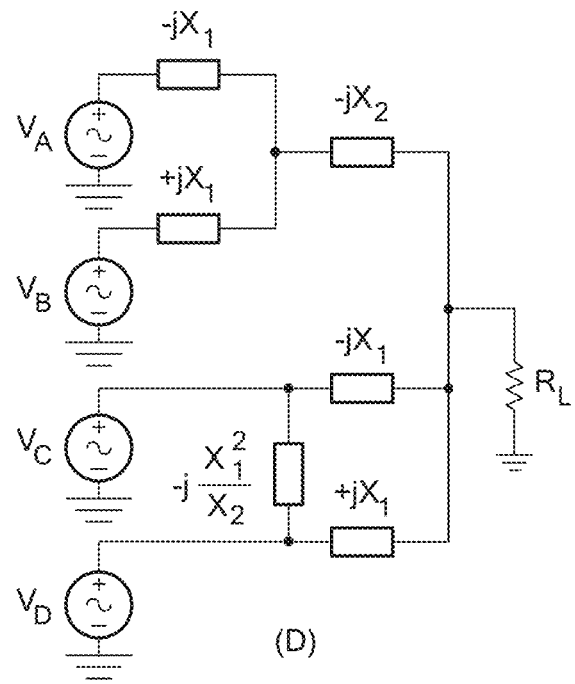
Figure 30D:
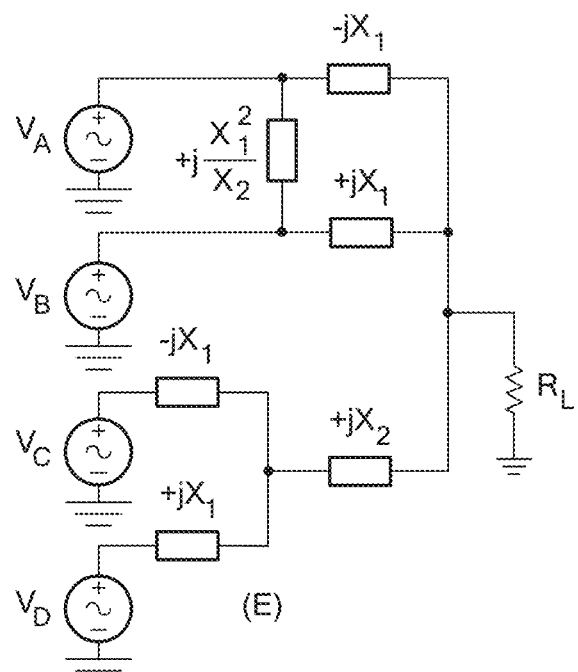
Figures 31, 31A, 31B:
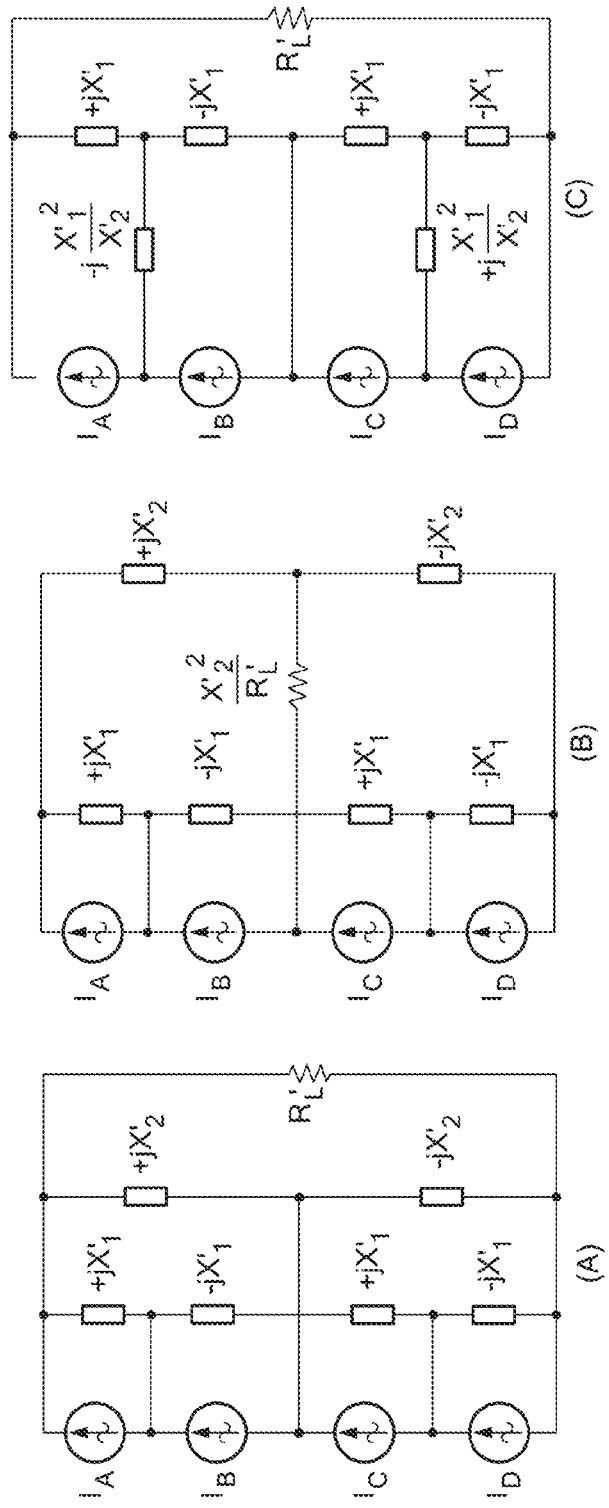
FIGS. 31 and 31A-31D are circuits corresponding to topological duals of circuits in FIGS. 30 and FIGS. 30A-30D with power amplifier inputs and load network connection shown.
Figure 31C:
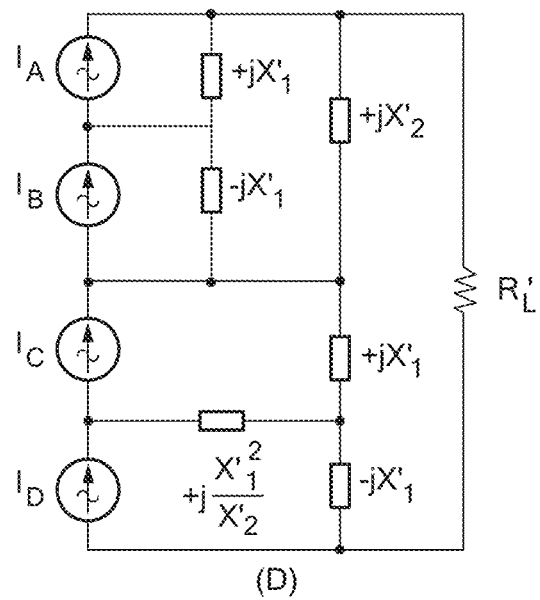
Figure 31D:
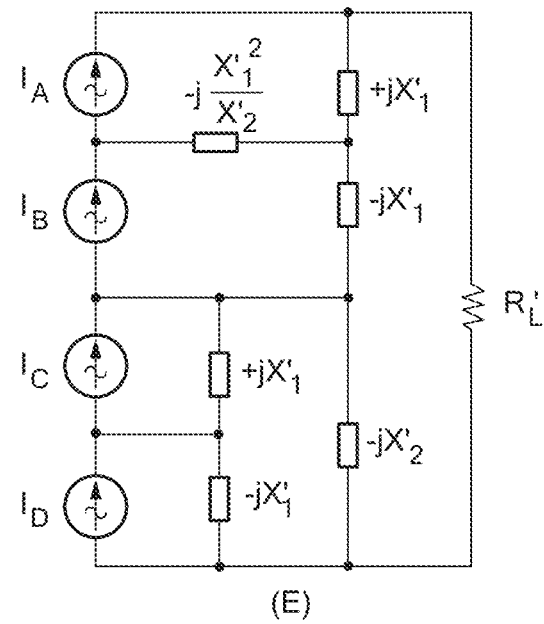

Referring now to FIGS. 30-30D the 4-way combiner implementations that can result from applying the T-Δ transformation to the various T-networks found in the basic 4-way combiner of FIG. 4 (repeated in FIG. 30 for convenience) are shown.

Although unnecessary, it is convenient to think of the basic combiner in FIG. 30 as the starting point for all the T-Δ transformations. For this reason, the reactance magnitudes in all the implementation variants of FIG. 30A-30D are given in terms of the reactance magnitudes of the basic combiner. The suggested reactance magnitude values for a particular implementation ensure that its input-port and output-port characteristics are identical to those of the basic combiner, i.e. as far as the PAs and the load (transformed in the case of FIG. 30A) are concerned, the behavior of the transformed combiner for any outphasing control method will be equivalent to that of the basic combiner for the same outphasing control strategy and respective load. It should be noted that the same transformations can be applied to the combiner and load networks in other power combiner implementations, including those of higher order N.

FIGS. 31 and 31A-31D shows the topology of the corresponding topological duals of each of the networks including 4-way combiner implementations of FIGS. 30 and 30A-30D. Specific component values may be found for the dual network as is well known in the art. As a result of this transformation, the PAs (approximated by voltage sources $V_A$-$V_D$ in FIGS. 30 and 30A-30D) are now modeled respectively by currents sources $I_A$-$I_D$ having equivalent magnitude and phase relationship as the voltage sources of FIGS. 30 and 30A-30D, though it is recognized that this is for modeling purposes, and to show the connection ports of the power amplifiers—the power amplifiers needn't act as ideal voltage or current sources.

Further, it is of significant importance to note that for any particular outphasing control method, the input admittance versus output power characteristic of the FIGS. 29 and 29A-29D permutations is equivalent to the input impedance versus output power characteristic of their respective duals. Conveniently, the relationship between the output power delivered to the load and the outphasing control methodology is unaffected by the topological duality transformation. Thus, all of the presented outphasing control methods previously introduced are directly applicable to the implementation variants of FIGS. 30 and 30A-30D, although, in this case, it will be more appropriate to refer to the Optimal Susceptance control method as the Optimal Reactance control method, in keeping with the effects of topological duality on interchanging voltages and currents and admittances and impedances. It should also be noted that there are also other methods for synthesizing the networks of FIGS. 30 and 30A-30D, such as starting with other types of multi-level resistance compression networks.

In general, as operating frequencies increase toward the microwave frequency range and above, the electrical length of the interconnects in a multi-way lossless power combining and outphasing system affect system operation and thus must be considered. One strategy to address interconnect electrical length is to include micro-strip or other types of substrate-embedded or printed circuit transmission lines (e.g., coplanar waveguide, stripline, etc.) of particular impedance and electrical length between nodes that are directly coupled in completely lumped implementations of a combiner.

Described herein below are resistance compression networks implemented using quarter-wave lines and their relationship to power combining. Also described are power combiner circuits (e.g. four-way power combiner circuits) implemented using a combination of quarter-wave lines and lumped reactive elements. It should, however, be appreciated that the concepts described herein also apply to combiner implementations other than four-way combiner implementations (e.g. fewer than or greater than four way implementations). It should also be appreciated that the lumped reactive elements may instead be realized with distributed approximations to the lumped components (e.g., the reactive elements may be implemented using printed circuit passive components, microstrip transmission lines or with transmission-line stubs having an appropriately selected input impedance) without departing from the spirit and scope of the concepts claimed herein.

Figure 32A:
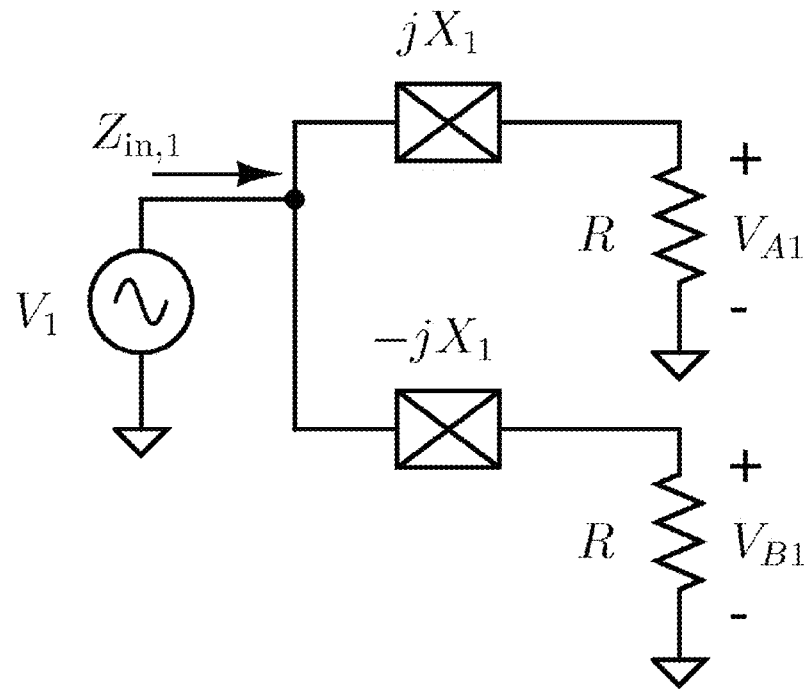
FIG. 32A is a schematic diagram of a single-stage resistance compression network provided from lumped element circuit components.
Figure 32B:
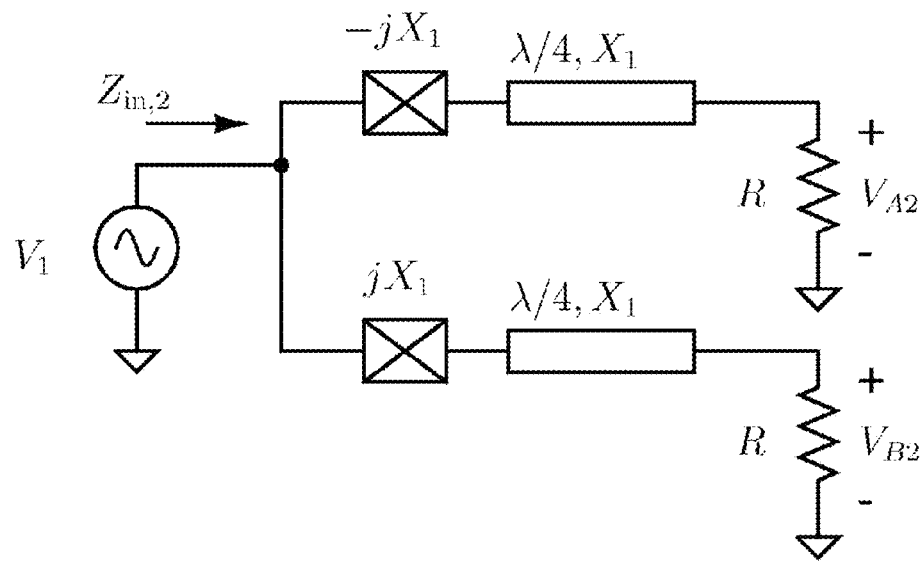
FIG. 32B is a schematic diagram of a single stage resistance compression network provided from quarter-wave transmission lines and reactive components.

Referring now to FIGS. 32A, 32B two single-stage resistance compression networks are shown. The network in FIG. 32A is a lumped-element implementation and the network in FIG. 32B is a version using quarter-wave transmission line interconnects. Thus, FIGS. 32A, 32B illustrate two variations of a single-stage resistance compression network. The rectangular elements denoted by "X's" in FIGS. 32A, 32B and FIGS. 33-38 indicate reactive components.

It should be noted that the reactive elements in all topologies described herein below can be implemented using either discrete components or transmission line structures (e.g. including, but not limited to microstrip, co-planar wave guide or stripline transmission line structures, and passives implemented as printed circuit structures).

With the interconnect transmission line characteristic impedances chosen equal to the reactive component magnitudes, the input impedances of the two networks are equal and the terminal voltages are nearly identical, with all four voltages $V_{A1}$, $V_{B1}$, $V_{A2}$, $V_{B2}$, having equal amplitudes, and having a phase relationship which may be described as $\angle V_{B1} = \angle V_{B2} + 180°$.

The input impedances and port voltages are described by Equations (49)-(51).

$$Z_{in,1} = Z_{in,2} = \frac{R^2 + X_L^2}{2R} \qquad (49)$$

$$V_{A1} = V_1 \frac{R}{R + jX_1}, \quad V_{B1} = V_1 \frac{R}{R - jX_1} \qquad (50)$$

$$V_{A2} = V_2 \frac{R}{R + jX_1}, \quad V_{B2} = V_1 \frac{R}{-R + jX_1} \qquad (51)$$

Figure 33A:
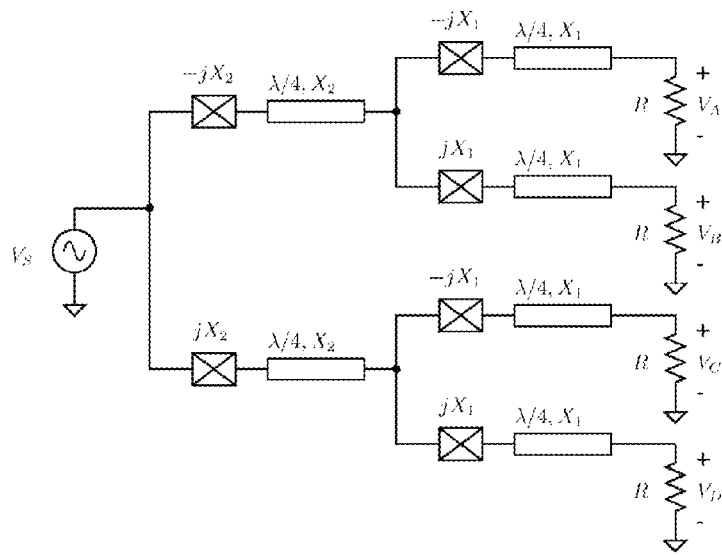
FIG. 33A is a schematic diagram of a two-stage resistance compression network with microstrip interconnects.
Figure 33B:
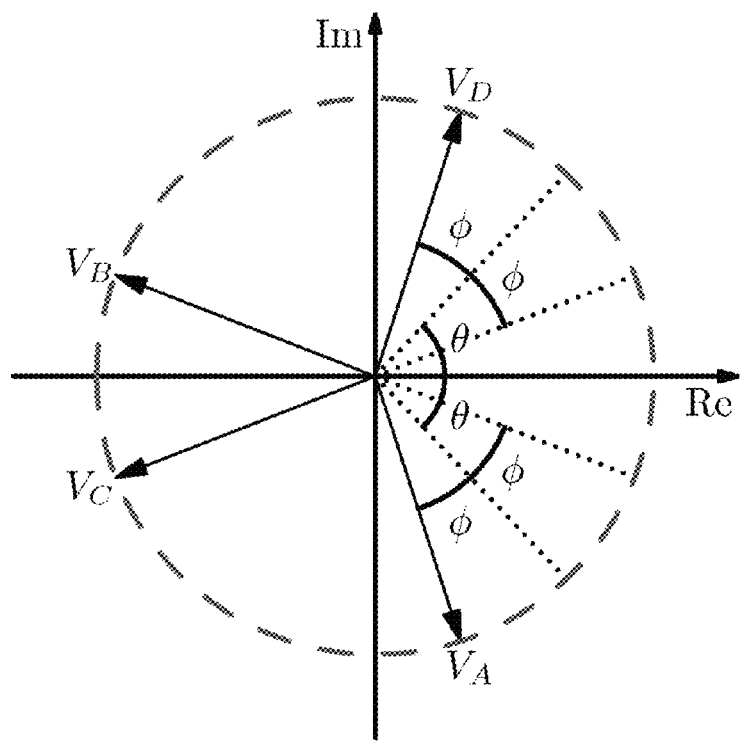
FIG. 33B is a phasor diagram of terminal voltages of the circuit of FIG. 33A.

When stages of the transmission line network in FIGS. 32A, 32B are cascaded to create a two-stage resistance compression network with transmission-line interconnects, the resulting network and port voltages are as indicated in FIGS. 33A, 33B. The behavior of the load voltages at the operating frequency can be shown to be described by Equation (52):

$$\begin{bmatrix} V_A \\ V_B \\ V_C \\ V_D \end{bmatrix} = V_S \frac{\sqrt{R^2 + X_1^2}}{2\sqrt{\left(\frac{R^2 + X_1^2}{2R}\right) + X_1^2}} \begin{bmatrix} e^{-j\phi}e^{-j\theta} \\ e^{j(\phi-\pi)}e^{-j\theta} \\ e^{-j(\phi+\pi)}e^{j\theta} \\ e^{j\phi}e^{j\theta} \end{bmatrix} = V_0 \begin{bmatrix} e^{-j\phi}e^{-j\theta} \\ e^{j(\phi-\pi)}e^{-j\theta} \\ e^{-j(\phi+\pi)}e^{j\theta} \\ e^{j\phi}e^{j\theta} \end{bmatrix} \qquad (52)$$

where $$\theta = \arctan\left(\frac{2RX_2}{R^2 + X_L^2}\right) \qquad (53)$$

and $$\phi = \arctan\left(\frac{X_1}{R}\right) \qquad (54)$$

The resistance compression network in FIG. 33A can be transformed to a four-way power combining network by reversing the direction of power flow through the network, i.e. reversing the sign of all impedances and replacing the load resistances with sources and the source with a load resistor.

Figure 34:
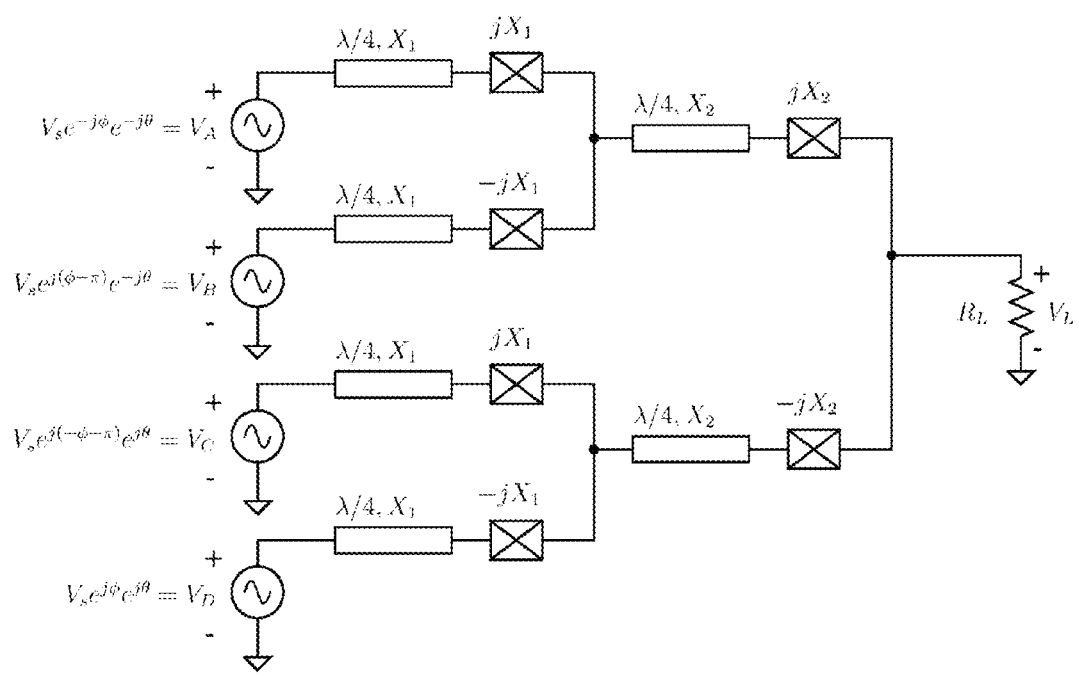
FIG. 34 is a schematic diagram of a four-way power combiner provided from microstrip transmission lines and series reactive elements.

Referring now to FIG. 34, a power combiner provided by a transformation of the resistance compression network of FIG. 33A is shown. The power combiner is provided having a plurality of input ports, here four (4) input ports, and an output port. Thus, the power combiner is here provided as a four-way power combiner (i.e. four input ports and one output port).

Each of the input ports has one of a like plurality of sources $V_A$-$V_D$ coupled thereto and a load $R_L$ coupled to the output port. It should be understood that sources $V_A$-$V_D$ and load $R_L$ are not properly a part of the power combiner and may represent inputs from devices such as RF power amplifiers and an output such as an antenna or RF load.

The power combiner has a first stage coupled to a second stage. A first set of ports (or input ports) of the first stage are coupled to corresponding ones of the power combiner input ports and a second set of ports (output ports) of the first stage are coupled to a first set of ports (input ports) of the second stage. A second set of ports (one or more output ports) of the second stage are coupled to the power combiner output port. It should be noted that in this exemplary embodiment, the second stage of the power combiner has a single output port which is coupled to the output port of the power combiner (i.e. the second set of ports the second stage corresponds to a single output port in the exemplary embodiment of FIG. 34). It should be noted that the individual stages do not act independently, but rather each of the sources interacts with the other sources through the combiner to provide the desired behavior as a single system.

In general, the first stage of a power combiner provided in accordance with the concepts described herein has a number of input ports equal to the number of power combiner input ports with each of the first stage input ports coupled to a corresponding one of the power combiner input ports. Thus, if the power combiner has N input ports, the first stage likewise has N input ports. In this exemplary embodiment in which the power combiner has four input ports (i.e. N=4), the first stage likewise has four input ports.

Each signal path (or leg) of the first stage of the power combiner includes a transmission line having first and second ends and having an effective electrical length corresponding to $\lambda/4$ (a quarter wavelength at the design frequency), and a characteristic impedance $X_1$. The first end of the transmission line is coupled to one of the ports in the first set of ports of the first stage. A second end of each transmission line has one terminal coupled to a first terminal of a reactive element. Thus, each leg of the first stage of the power combiner includes a transmission line having an effective electrical length corresponding to $\lambda/4$ and characteristic impedance $X_1$ with a serially coupled reactive element having an impedance of either $+jX_1$ or $-jX_1$. Pairs of legs of the first stage of the power combiner are coupled to provide the first stage having N/2 output ports.

In general, the second stage of a power combiner provided in accordance with the concepts described herein has a number of input ports equal to the number of output ports of the first stage. Thus, if the first stage of the power combiner has K output ports, the second stage has K input ports. In this exemplary embodiment in which the power combiner has four input ports (i.e. N=4), the first stage likewise has two output ports (i.e. N/2=2). Thus, the second stage has N/2 input ports.

Each leg of the second stage of the power combiner includes a transmission line having an effective electrical length corresponding to $\lambda/4$, and characteristic impedance $X_2$ followed by a serially coupled reactive element having an impedance characteristic corresponding to one of $+jX_1$ or $-jX_1$.

By analogy to the network comparison in FIG. 32A, 32B, the four-way power combiner will have the same input impedances and output power as the networks described above in conjunction with FIGS. 1-31 when the power combiner is driven with sources having the relationship shown in Equation (55):

$$\begin{bmatrix} V_A \\ V_B \\ V_C \\ V_D \end{bmatrix} = V_S \begin{bmatrix} e^{-j\phi}e^{-j\theta} \\ e^{j(\phi-\pi)}e^{-j\theta} \\ e^{-j(\phi+\pi)}e^{j\theta} \\ e^{j\phi}e^{j\theta} \end{bmatrix} \quad (55)$$

The relationship in Equation 55 will result in an output voltage $V_L$ having zero phase. The absolute phase output can be offset by adding a common phase offset to all four inputs. The input admittances seen by the four voltage sources will be that of Equations (56a)-(56d) with $\gamma=R_L/X_1$ and $\beta=X_2/X_1$.

$Y_{\mathit{eff},A}=X_1^{-1}(\gamma-\gamma\cos(2\phi+2\theta)-\gamma\cos(2\phi)+\gamma\cos(2\theta)-\beta\sin(2\phi))+jX_1^{-1}(1-\beta-\gamma\sin(2\phi+2\theta)-\gamma\sin(2\phi)+\gamma\sin(2\theta)+\beta\cos(2\phi))$ (56a)

$Y_{\mathit{eff},B}=X_1^{-1}(\gamma-\gamma\cos(2\theta-2\phi)-\gamma\cos(2\phi)+\gamma\cos(2\theta)+\beta\sin(2\phi))+jX_1^{-1}(-1-\beta-\gamma\sin(2\phi-2\theta)+\gamma\sin(2\phi)+\gamma\sin(2\theta)+\beta\cos(2\phi))$ (56b)

$Y_{\mathit{eff},C}=X_1^{-1}(\gamma-\gamma\cos(2\theta-2\phi)-\gamma\cos(2\phi)+\gamma\cos(2\theta)+\beta\sin(2\phi))-jX_1^{-1}(-1-\beta-\gamma\sin(2\phi-2\theta)+\gamma\sin(2\phi)+\gamma\sin(2\theta)+\beta\cos(2\phi))$ (56c)

$Y_{\mathit{eff},D}=X_1^{-1}(\gamma-\gamma\cos(2\phi+2\theta)-\gamma\cos(2\phi)+\gamma\cos(2\theta)-\beta\sin(2\phi))-jX_1^{-1}(1-\beta-\gamma\sin(2\phi+2\theta)-\gamma\sin(2\phi)+\gamma\sin(2\theta)+\beta\cos(2\phi))$ (56d)

At microwave frequencies, the power combiner reactive elements, whether implemented with discrete components or as distributed elements (e.g. transmission lines such as microstrip transmission lines, stepped line segments, etc.), often have non-negligible electrical length. This effective length can be accounted for in the selection of the length of each transmission-line section. Alternatively, it may be preferable to use distributed or lumped element circuit components as shunt elements to ground (as will be described below in conjunction with FIGS. 35 and 36) rather than in the signal path as described in conjunction with FIG. 34.

Figure 35:
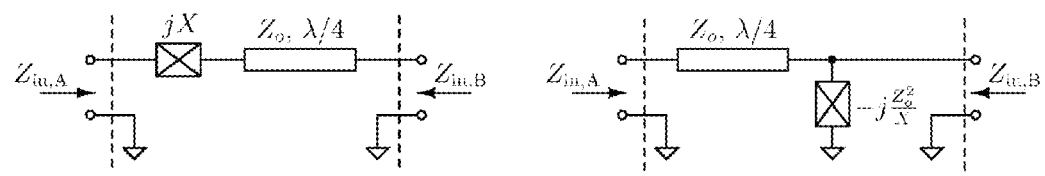
FIG. 35 illustrates a series to shunt transformation.

Referring now to FIG. 35, a series to shunt transformation can be used to replace the series coupled reactive elements in the network in FIG. 34 with shunt reactive elements. The two networks in FIG. 35 have identical port impedances and are therefore interchangeable at the operating frequency.

Figure 36:
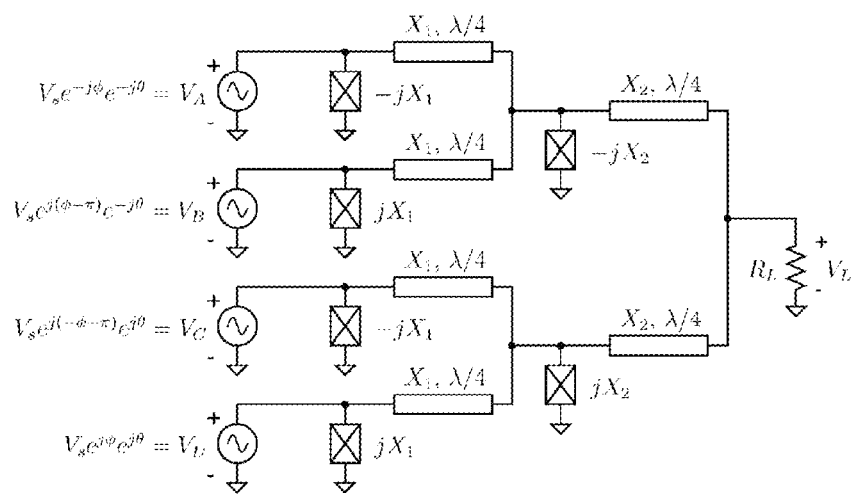
FIG. 36 is a schematic diagram of a four-way power combiner circuit implemented using transmission lines and shunt reactive components.

Applying the series to shunt transformation to the network in FIG. 34 and appropriately selecting the transmission line characteristic impedances results in a power combiner topology shown as shown in FIG. 36. It is also notable that the power combiner network in FIG. 36 can be transformed to a four-way (two-stage) resistance compression network by reversing the direction of power flow through the network, i.e. reversing the sign of all impedances and replacing the load resistance with a source and the sources with loads (e.g., resistors, rectifiers, etc.).

FIG. 36 illustrates an exemplary four-way power combiner having a plurality of input ports, here four (4) input ports, and an output port. The four-way power combiner includes a first stage having four input ports each coupled to a corresponding one of the four input ports of the power combiner and having two output ports. The first stage further includes four signal paths with each of the signal paths comprised of a transmission line and a reactive shunt element coupled thereto. Each transmission line in the first stage has a first end coupled to a corresponding one of the combiner output ports, a second end coupled to an output port of the first stage and having an effective electrical length corresponding to $\lambda/4$, and characteristic impedance $X_1$. Each reactive element has an impedance of either $+jX_1$ or $-jX_1$. Each reactive element has a first terminal coupled to the transmission line and a second terminal coupled to a reference potential, here corresponding to ground.

The four-way power combiner also includes a second stage having two input ports each coupled to a respective one of the two output ports of the first stage and an output port. The second stage further includes two signal paths with each of the signal paths comprised of a transmission line having an effective electrical length corresponding to $\lambda/4$ and characteristic impedance $X_2$ and a reactive element having an impedance of either $+jX_2$ or $-jX_2$ shunt coupled to the transmission line.

Each transmission line in the second stage has a first end coupled to a corresponding one of the second stage input ports and a second coupled to the output port of the second stage. Each reactive element has a first terminal coupled to the transmission line and a second terminal coupled to a reference potential, here shown as ground.

When driven by sources with the relationship expressed in Equation (55), this combiner has identical characteristics to that in FIG. 34 without requiring reactive components in series with the signal path.

It should be noted that the network in FIG. 36 utilizes transmission lines having characteristic impedances $X_1$ and $X_2$ that may be determined using the combiner design equations described above in conjunction with FIGS. 1-31. In some cases, the necessary impedance values may be impractical and an implementation that allows for arbitrary transmission line impedances may be preferred.

Figure 37A:
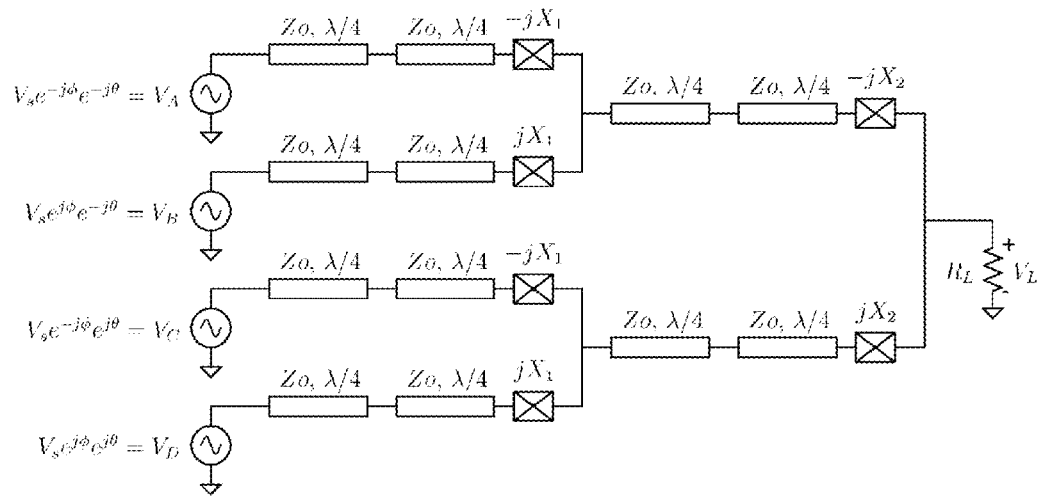
FIG. 37A is a schematic diagram of a four-way power combining network provided from half-wavelength transmission lines and reactive components.
Figure 37B:
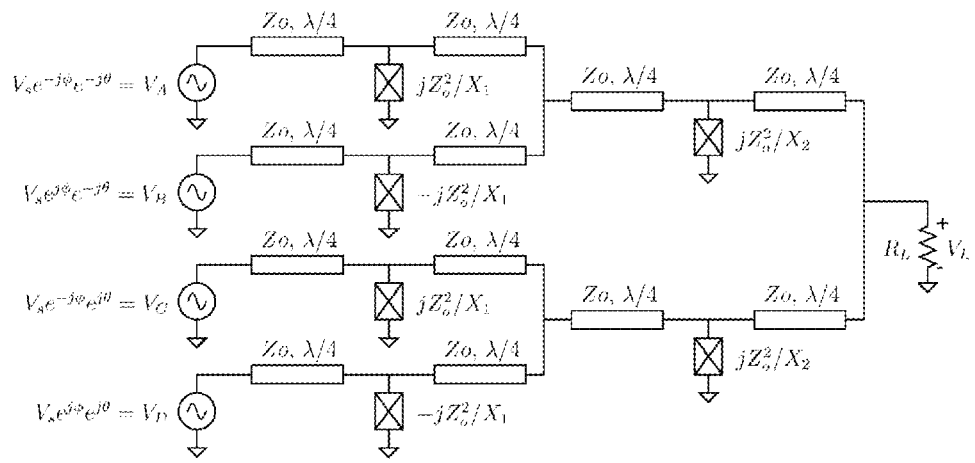
FIG. 37B is a schematic diagram of a four way power combining network implemented with quarter-wave transmission lines after applying a transformation as shown in FIG. 35.

Referring now to FIGS. 37A, 37B, the reactive elements in the four-way power combiner discussed above in conjunction with FIGS. 1-31 can be replaced with reactive elements in series with half-wavelength transmission lines as indicated in FIG. 37A without altering the system behavior (i.e. FIG. 37A illustrates an implementation of a network of the type described above in conjunction with FIGS. 1-31 using half-wavelength transmission lines).

If the series to shunt transformation described in conjunction with FIG. 35 is then applied to the network of FIG. 37A, the result is the four-way power-combining network illustrated in FIG. 37B. The two networks in FIGS. 37A, 37B have identical electrical characteristics in terms of the effective impedances seen by the sources, and the port input impedances will be characterized by Equations (56a)-(56d) if the source voltages have the relationship shown in Equation 57:

$$\begin{bmatrix} V_A \\ V_B \\ V_C \\ V_D \end{bmatrix} = V_S \begin{bmatrix} e^{-j\phi}e^{-j\theta} \\ e^{j\phi}e^{-j\theta} \\ e^{-j\phi}e^{j\theta} \\ e^{j\phi}e^{j\theta} \end{bmatrix} \quad (57)$$

FIG. 37A illustrates an exemplary four-way power combiner having a plurality of input ports, here four (4) input ports, and an output port. The four-way power combiner includes a first stage having four input ports each coupled to a corresponding one of the four input ports of the power combiner and having two output ports. The first stage further includes four signal paths with each of the signal paths comprised of a pair of serially coupled transmission lines each having an effective electrical length corresponding to $\lambda/2$ and characteristic impedance $Z_0$ and a serially coupled reactive element having an impedance of either $+jX_1$ or $-jX_1$.

The four-way power combiner also includes a second stage having two input ports each coupled to respective ones of the two output ports of the first stage and an output port. The second stage further includes two signal paths with each of the signal paths comprised of a pair of serially coupled transmission lines each having an effective electrical length corresponding to $\lambda/2$, and a characteristic impedance $Z_0$. The second stage signal paths also include a reactive element having an impedance of either $+jX_2$ or $-jX_2$ serially coupled to the transmission lines with one terminal of each reactive element coupled to one end of one of the transmission lines and one terminal of each reactive element coupled to a terminal of the output port of the second stage.

FIG. 37B illustrates an exemplary four-way power combiner having a plurality of input ports, here four (4) input ports, and an output port. The four-way power combiner includes a first stage having four input ports each coupled to a corresponding one of the four input ports of the power combiner and having two output ports.

The first stage further includes four signal paths with each of the signal paths comprised of a pair of cascaded transmission lines with each having a characteristic impedance of $Z_0$ and an effective electrical length corresponding to $\lambda/4$. Each of the first stage signal paths has a first end coupled to a corresponding one of the combiner input ports and a second end coupled to one of the two output ports of the first stage. Each reactive element has an impedance of either $+jZ_0^2/X_1$ or $-jZ_0^2/X_1$. Each reactive element has a first terminal coupled to the transmission line and a second terminal coupled to a reference potential, here corresponding to ground. In this exemplary embodiment, the reactive elements are coupled to the midpoint of the transmission line, but it should be appreciated that in some embodiments, the reactive elements may be coupled at other points of the transmission line (i.e. either before or after to the midpoint of the transmission line).

The four-way power combiner also includes a second stage having two input ports each coupled to a respective one of the two output ports of the first stage and an output port. The second stage further includes two signal paths with each of the signal paths comprised of a pair of cascaded transmission lines having a characteristic impedance of $Z_0$ and an effective electrical length corresponding to $\lambda/4$. A reactive element having an impedance of either $+jZ_0^2/X_2$ or $-jZ_0^2/X_2$. Is shunt coupled to the two transmission lines (here shown being shunt coupled between the two transmission lines).

Each transmission line in the second stage has a first end coupled to a corresponding one of the second stage input ports and a second coupled to the output port of the second stage. Each reactive element has a first terminal coupled to the transmission line and a second terminal coupled to a reference potential, here shown as ground.

Compared to the four-way combiner in FIG. 36, the implementation shown in FIGS. 37A, 37B has a greater total amount of transmission line length in the signal path, but the transmission lines may have arbitrary impedance. Furthermore, the transmission line impedances can be selected to choose the reactive element component values. It should also be appreciated that although the reactive elements are illustrated as a single block (implying a single circuit element), it is possible (and may sometimes be desirable) to implement a single reactance (e.g. a single reactive element as shown in some of FIGS. 1-39-with multiple circuit elements.

Figure 38:
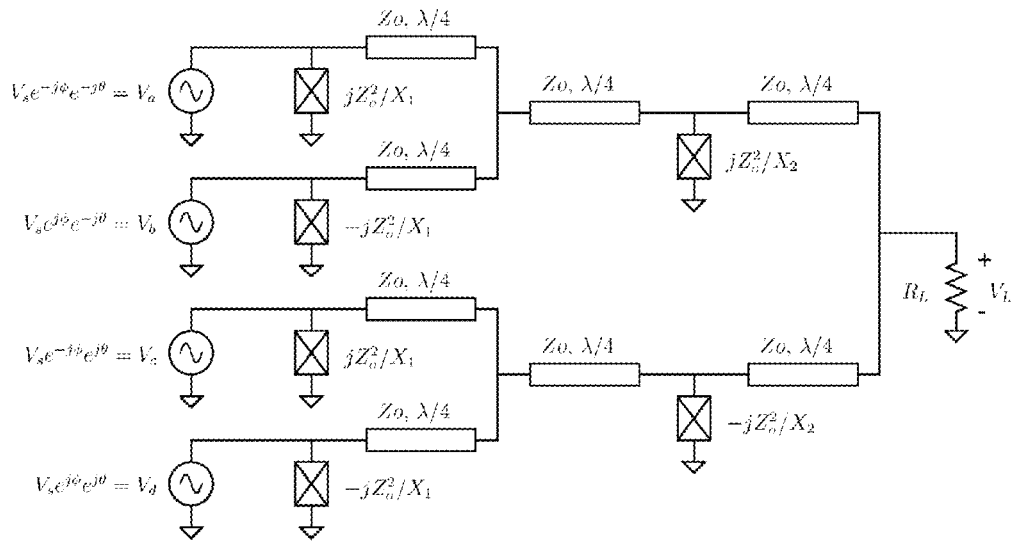
FIG. 38 is a schematic diagram of a four-way power combiner circuit implemented with port impedances related to nominal combiner behavior through an impedance conversion.

Referring now to FIG. 38, quarter-wave transmission lines at the inputs to the power combiner in FIG. 37B (i.e. in the first stage) can be removed to produce the network in FIG. 38. This network is related to the previous ones through the impedance conversion resulting from the removed quarter-wave line. Thus, the embodiment of FIG. 38 illustrates a circuit implementation having port impedances related to the nominal combiner behavior through an impedance conversion.

FIG. 38 thus illustrates an exemplary four-way power combiner having a plurality of input ports, here four (4) input ports, and an output port. The four-way power combiner includes a first stage having four input ports each coupled to a corresponding one of the four input ports of the power combiner and having two output ports.

The first stage further includes four signal paths with each of the signal paths comprised of a transmission line having a characteristic impedance of $Z_0$ and an effective electrical length corresponding to $\lambda/4$. Each of the first stage signal paths has a first end coupled to a corresponding one of the combiner input ports and a second end coupled to one of the two output ports of the first stage. A reactive element having an impedance of either $+jZ_0^2/X_1$ or $-jZ_0^2/X_1$. Each reactive element has a first terminal coupled to the transmission line and a second terminal coupled to a reference potential, here corresponding to ground (i.e. the reactive elements are shunt coupled to respective ones of the signal paths). In this exemplary embodiment, the reactive elements are shown coupled to an endpoint of the transmission line (closest to the combiner input port). It should, however, be appreciated that in some embodiments, the reactive elements may be coupled at other points of the transmission line (e.g. at either end of the transmission line or anywhere in between).

The four-way power combiner also includes a second stage having two input ports each coupled to a respective one of the two output ports of the first stage and an output port. The second stage further includes two signal paths with each of the signal paths comprised of a pair of cascaded transmission lines having a characteristic impedance of $Z_0$ and an effective electrical length corresponding to $\lambda/4$. A reactive element having an impedance of either $-jZ_0^2/X_2$ or $-jZ_0^2/X_2$. Is shunt coupled to the two transmission lines (here, illustrated as being shunt coupled between two quarter wavelength transmission lines). Each reactive element has a first terminal coupled to the signal path and a second terminal coupled to a reference potential, here shown as ground.

Each signal path in the second stage has a first end coupled to a corresponding one of the second stage input ports and a second end coupled to the output port of the second stage.

A control law relating the selection of control angle pair φ, θ (Equations 53 and 54) to a commanded power $P_{cmd}$ can be adapted for this impedance conversion by rewriting it in terms of a normalized commanded power $P_N$:

$$P_N = \frac{P_{cmd}}{P_{Z_0}} \tag{58}$$

where $$P_{Z_0} = \frac{2V_S^2}{Z_0} \tag{59}$$

is the total power of all four sources driving loads of impedance Zo. Then, the rewritten control law can be adapted for the network in FIG. 38 by replacing all instances of $P_N$ with $1/P_N$. It should be appreciated that while such a control law may be used directly, it can also simply serve as the basis for developing an empirically-based or measurement based control commands (e.g. including lookup tables, digital predistortion, and related techniques) to set relative amplitudes and phases of the sources to obtain a desired command-to-output behavior.

It should be appreciated that each of these implementations can be augmented with additional elements as will be known to a person of ordinary skill in the art. This includes using added transmission line sections, impedance transformations networks (e.g., including quarter-wave lines, tapered lines, transformers and matching networks), additions of baluns and other techniques for converting between common-mode and differential-mode inputs and outputs, etc.

Control techniques as discussed herein may be employed to modulate the output power (and control the instantaneous RF output), with control angles and/or drive amplitudes derived from equations or measurements or based upon lookup-tables of control angles or through other means. As discussed above, output power control can be accomplished by outphasing of the sources (power amplifiers), or by a combination of outphasing and drive amplitude backoff of the sources (power amplifiers) driving the power combining network. Any desired combination of outphasing and drive amplitude modulation may be used in order to achieve goals such as high linearity and high efficiency.

In some cases, one may choose to use outphasing over some portion of the output power range and drive backoff over a second portion of the output power range, where the two portions may or may not overlap. Power may be further controlled through discrete or continuous drain modulation of the power amplifiers driving the combiner network. Moreover, drive amplitudes may be individually adjusted to balance the drives and loading of the individual power amplifiers driving the combiner, and may also adjust drive (e.g., of power amplifier sources) over the operating range to improve or maximize overall lineup efficiency or power added efficiency of the power amplifier system.

At sufficiently high frequencies the quality of discrete passive components (such as capacitors and inductors) can significantly degrade, and accuracy and repeatability of component values and accuracy of component placement may become challenging issues. To address these issues, a transmission-line-only implementation of a multi-way lossless outphasing combiner is described. This approach results in an outphasing architecture implemented using only transmission lines but having operating characteristics similar to the operating characteristics of the above-described combiners implemented using lumped-circuit elements or a combination of lumped-circuit and distributed elements (e.g. microstrip transmission line) or distributed elements and transmission lines.

Accordingly, described herein below is one exemplary transmission-line implementation of a four-way combiner and its combining characteristics. It should, of course, be appreciated that other implementations are also possible. Also described is a design methodology.

Figure 39:
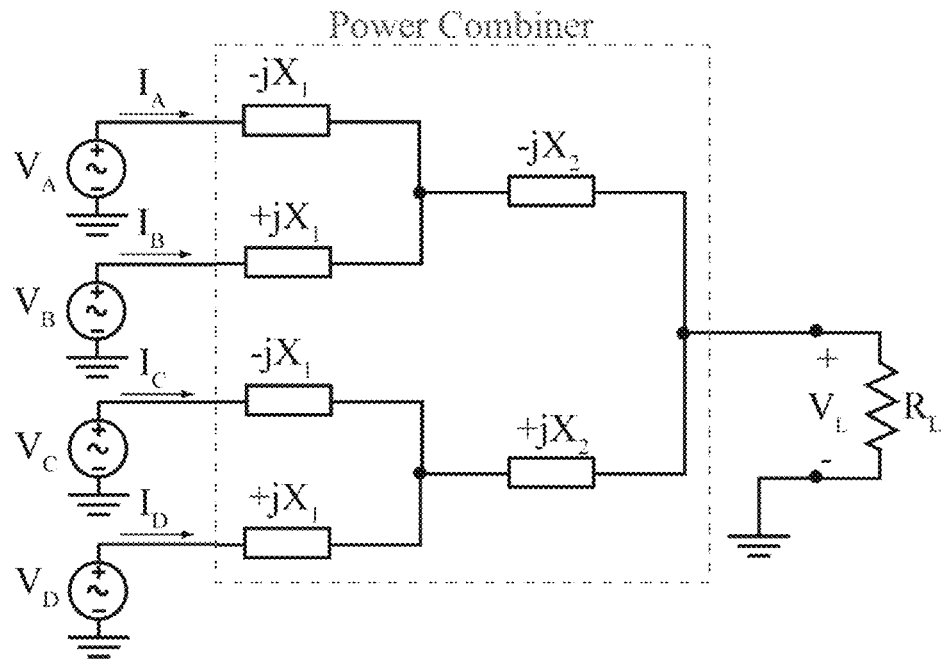
FIG. 39 is a schematic diagram which illustrates one possible topological implementation of lumped-element four-way power combiner having four input ports A-D and a single output port terminated with a load.

Referring now to FIG. 39, one possible topological implementation of the lumped-element four-way power combiner with four input ports A-D and a single output port terminated with a load $R_L$ includes a first stage having four legs with a reactance of either $+jX_1$ or $-jX_1$. A second stage of the combiner has two legs with each of the legs having a reactance of either $+jX_2$ or $-jX_2$. The combiner's input ports are driven by PAs which (for modeling purposes) are here treated as ideal voltage sources.

Referring now to FIG. 40, one possible transmission-line (TL) implementation of the four-way combiner of FIG. 39 is shown with each of the $X_1$ and $X_2$ combiner reactances replaced respectively with transmission lines having impedances $Z_1$ and $Z_2$. Each of the transmission lines has a half-wavelength base length, i.e. their lengths are defined as a particular increment/decrement $\Delta L_1$ and $\Delta L_2$ from a half-wavelength transmission line. This methodology for sizing the transmission lines allows for design symmetry and greatly simplifies the analysis of the combiner. As is described below, other base-length choices (such as quarter-wavelength) are also possible. Half wavelength increments may be added to the base transmission line lengths without changing the operating characteristics, but shorter lengths are preferable when possible because of practical loss considerations.

The design methodology for selecting the transmission line impedances Z $Z_1$ and $Z_2$ and their respective length increments $\Delta L_1$, $\Delta L_2$ is described below.

It should be appreciated that although the combiner network is designed for a particular load resistance $R_L$, its output may be terminated with an impedance transformation stage (such as matching network, or transmission-line transformer) that converts the actual load impedance $R_{LO}$ to the impedance $R_L$ for which the combiner is designed (see e.g. FIG. 40). Such impedance transformation introduces greater design flexibility and allows one to design the combiner network without the necessity of utilizing transmission lines having relatively high characteristic impedances. By relatively high impedance one may mean characteristic impedances in the multiple hundreds of ohms; such high impedances may be difficult to efficiently and accurately realize in many systems (e.g., manufacturing accuracy and loss concerns).

Understanding of the effective input admittance characteristics of the transmission line combiner of FIG. 40 is important for its design and analysis. A convenient approach for determining these characteristics is to first derive an effective admittance matrix relating the input port currents $I_A$-$I_D$ to its input terminal voltages $V_A$-$V_D$. Based upon this matrix, one can then compute the input admittance (effective power amplifier loading) of any input port of the combiner for any arbitrary outphasing control methodology.

To derive the admittance matrix of the transmission line combiner, consider the three-port network of FIG. 41A. Conventional transmission-line analysis methods can be employed to show that its terminal voltages and input-port currents are related according to Equation 60, where $\sigma = 2\pi L/\lambda$. Furthermore, by loading port 3 with an arbitrary impedance $Z_L$ and demanding that $V_3/I_3 = -Z_L$, one can show that Equation 61 describes the relationship between the terminal voltages and input currents of the network in FIG. 41B.

$$\begin{bmatrix} I_1 \\ I_2 \\ I_3 \end{bmatrix} = \frac{j}{Z_o \sin(\sigma)} \begin{bmatrix} -\cos(\sigma) & 0 & -1 \\ 0 & \cos(\sigma) & 1 \\ -1 & 1 & 0 \end{bmatrix} \begin{bmatrix} V_1 \\ V_2 \\ V_3 \end{bmatrix} \quad (60)$$

$$\begin{bmatrix} I_1 \\ I_2 \end{bmatrix} = \quad (61)$$

$$\frac{Z_L}{Z_o^2 \sin^2(\sigma)} \begin{bmatrix} 1 - j\frac{Z_o}{Z_L}\cos(\sigma)\sin(\sigma) & -1 \\ -1 & 1 + j\frac{Z_o}{Z_L}\cos(\sigma)\sin(\sigma) \end{bmatrix} \begin{bmatrix} V_1 \\ V_2 \end{bmatrix}$$

Referring now to FIG. 40, and employing the admittance matrices given by Equations 60 and 61, the various branch currents $I_A$-$I_F$, and node voltages $V_A$-$V_F$ can be related according to Equations (62a)-(62c)

$$\begin{bmatrix} I_A \\ I_B \\ I_E \end{bmatrix} = \frac{j}{Z_1 \sin(\sigma_1)} \begin{bmatrix} -\cos(\sigma_1) & 0 & -1 \\ 0 & \cos(\sigma_1) & 1 \\ -1 & 1 & 0 \end{bmatrix} \begin{bmatrix} V_A \\ V_B \\ V_E \end{bmatrix} \quad (62a)$$

$$\begin{bmatrix} I_C \\ I_D \\ I_F \end{bmatrix} = \frac{j}{Z_1 \sin(\sigma_1)} \begin{bmatrix} -\cos(\sigma_1) & 0 & -1 \\ 0 & \cos(\sigma_1) & 1 \\ -1 & 1 & 0 \end{bmatrix} \begin{bmatrix} V_C \\ V_D \\ V_F \end{bmatrix} \quad (62b)$$

$$\begin{bmatrix} I_E \\ I_F \end{bmatrix} = \frac{R_L}{Z_2^2 \sin^2(\sigma_2)} \quad (62c)$$

$$\begin{bmatrix} 1 - j\frac{Z_2}{R_L}\cos(\sigma_2)\sin(\sigma_2) & -1 \\ -1 & 1 + j\frac{Z_2}{R_L}\cos(\sigma_2)\sin(\sigma_2) \end{bmatrix} \begin{bmatrix} V_E \\ V_F \end{bmatrix}$$

By solving Equations 62a-62c for the combiner input-port currents $I_A$-$I_D$ as a function of its terminal voltages $V_A$-$V_D$, one can obtain the transmission line combiner admittance matrix of Equation 63, where sub-matrices $M_1$, $M_2$, and $M_3$ are respectively given by Equations 64-66.

$$\begin{bmatrix} I_A \\ I_B \\ I_C \\ I_D \end{bmatrix} = Y_{eff} \begin{bmatrix} V_A \\ V_B \\ V_C \\ V_D \end{bmatrix} = \begin{bmatrix} M_1 & M_2 \\ M_2 & M_3 \end{bmatrix} \begin{bmatrix} V_A \\ V_B \\ V_C \\ V_D \end{bmatrix} \quad (63)$$

$$M_1 = \begin{bmatrix} \gamma\sec^2(\sigma_2) + j(\cos(\sigma_1)\sin(\sigma_1) - \beta\tan(\sigma_2)) & -\gamma\sec^2(\sigma_2) + j\beta\tan(\sigma_2) \\ -\gamma\sec^2(\sigma_2) + j\beta\tan(\sigma_2) & \gamma\sec^2(\sigma_2) - j(\cos(\sigma_1)\sin(\sigma_1) + \beta\tan(\sigma_2)) \end{bmatrix} \quad (64)$$

$$M_3 = \begin{bmatrix} \gamma\sec^2(\sigma_2) + j(\cos(\sigma_1)\sin(\sigma_1) + \beta\tan(\sigma_2)) & -\gamma\sec^2(\sigma_2) - j\beta\tan(\sigma_2) \\ -\gamma\sec^2(\sigma_2) - j\beta\tan(\sigma_2) & \gamma\sec^2(\sigma_2) - j(\cos(\sigma_1)\sin(\sigma_1) - \beta\tan(\sigma_2)) \end{bmatrix} \quad (65)$$

$$M_2 = \begin{bmatrix} \gamma\sec^2(\sigma_2) & -\gamma\sec^2(\sigma_2) \\ -\gamma\sec^2(\sigma_2) & \gamma\sec^2(\sigma_2) \end{bmatrix} \quad (66)$$

Figure 42:
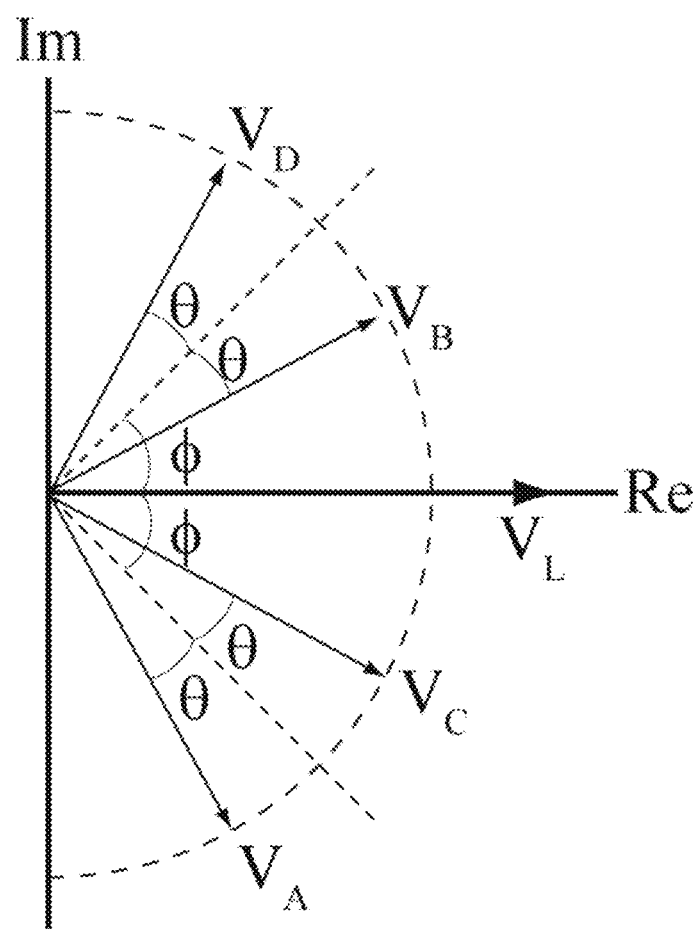
FIG. 42 is a phasor representation of the output voltages $Y_A$-$Y_D$ of the power amplifiers driving the combiner of FIG. 40.

Furthermore, if one assumes that the power amplifiers driving the TL combiner are outphased according to FIG. 42 with the combiner terminal voltages $V_A$-$V_D$ given by Equation 67, then Equations 63-66 can be solved to yield the effective combiner input admittances $Y_{eff,A}$-$Y_{eff,D}$ in terms of the outphasing angles $\theta$ and $\phi$ given by Equations 68a-68d.

$$\vec{V} = \begin{bmatrix} V_A \\ V_B \\ V_C \\ V_D \end{bmatrix} = V_S \begin{bmatrix} e^{-j\phi}e^{-j\theta} \\ e^{+j\phi}e^{-j\theta} \\ e^{-j\phi}e^{+j\theta} \\ e^{+j\phi}e^{+j\theta} \end{bmatrix} \quad (67)$$

Referring now to FIGS. 41A, 41B, shown are exemplary transmission-line networks for deriving the effective input admittance matrix of the TL combiner of FIG. 40.

Referring now to FIG. 42, shown is a phasor representation of output voltages $V_A$-$V_D$ of the power amplifiers driving the combiner of FIG. 40. The net output voltage vector is controlled by the relative phases and amplitudes of the voltages $V_A$-$V_D$. The relative phase angles of the inputs are of the same general nature as those in discrete combiner implementations, including use of a pair of control angles to characterize behavior.

As with the lumped combiner implementation, it can be seen from Equations 68a-68d that the input admittances at ports A/D and B/C are complex conjugate pairs.

$$Y_{eff,A} = \qquad (68a)$$
$$\frac{csc^2(\sigma_1)sec^2(\sigma_2)}{Z_1}[\sin(\phi)(-\beta\cos(\phi)\sin(2\sigma_2) + 4\gamma\cos(\theta)\sin(\theta+\phi)) +$$
$$j(\cos(\sigma_1)\cos^2(\sigma_2)\sin(\sigma_1) +$$
$$\sin^2(\phi)(2\gamma\sin(2\theta) - \beta\sin(2\sigma_2)) - 2\gamma\cos^2(\theta)\sin(2\phi))]$$

$$Y_{eff,B} = \frac{csc^2(\sigma_1)sec^2(\sigma_2)}{Z_1} \qquad (68b)$$
$$[2\sin(\phi)(-2\gamma\cos(\theta)\sin(\theta-\phi) + \beta\cos(\phi)\sin(\sigma_2)\cos(\sigma_2)) -$$
$$j(\cos(\sigma_1)\cos^2(\sigma_2)\sin(\sigma_1) +$$
$$\sin(\phi)(-4\gamma\cos(\theta)\cos(\theta-\phi) + \beta\sin(2\sigma_2)\sin(\phi)))]$$

$$Y_{eff,C} = \frac{csc^2(\sigma_1)sec^2(\sigma_2)}{Z_1} \qquad (68c)$$
$$[2\sin(\phi)(-2\gamma\cos(\theta)\sin(\theta-\phi) + \beta\cos(\phi)\sin(\sigma_2)\cos(\sigma_2)) +$$
$$j(\cos(\sigma_1)\cos^2(\sigma_2)\sin(\sigma_1) +$$
$$\sin(\phi)(-4\gamma\cos(\theta)\cos(\theta-\phi) + \beta\sin(2\sigma_2)\sin(\phi)))]$$

$$Y_{eff,D} = \qquad (68d)$$
$$\frac{csc^2(\sigma_1)sec^2(\sigma_2)}{Z_1}[\sin(\phi)(-\beta\cos(\phi)\sin(2\sigma_2) + 4\gamma\cos(\theta)\sin(\theta+\phi)) -$$
$$j(\cos(\sigma_1)\cos^2(\sigma_2)\sin(\sigma_1) +$$
$$\sin^2(\phi)(2\gamma\sin(2\theta) - \beta\sin(2\sigma_2)) - 2\gamma\cos^2(\theta)\sin(2\phi))]$$

It is interesting to note that if the transmission line impedances $Z_1$ and $Z_2$ are selected to be respectively $X_1/\sin(\sigma_1)$ and $X_2/\sin(\sigma_2)$, where $X_1$ and $X_2$ are the branch reactances of the lumped combiner of FIG. 39, then in the limit of $\sigma_1$ and $\sigma_2$ being zero, Equations 63-68d become identical to Equations 69-70d, i.e. the expressions for the lumped-element combiner of FIG. 39.

$$\begin{bmatrix} I_A \\ I_B \\ I_C \\ I_D \end{bmatrix} = Y \cdot \vec{V} = \qquad (69)$$

$$X_1^{-1} \begin{bmatrix} \gamma + j(1-\beta) & -\gamma + j\beta & \gamma & -\gamma \\ -\gamma + j\beta & \gamma - j(\beta+1) & -\gamma & \gamma \\ \gamma & -\gamma & \gamma + j(\beta+1) & -\gamma - j\beta \\ -\gamma & \gamma & -\gamma - j\beta & \gamma + j(\beta-1) \end{bmatrix} \cdot$$

$$\begin{bmatrix} V_A \\ V_B \\ V_C \\ V_D \end{bmatrix}$$

$$Y_{eff,A} = X_1^{-1}(\gamma - \gamma\cos(2\phi + 2\theta) - \gamma\cos(2\phi) + \gamma\cos(2\theta) - \beta\sin(2\phi)) + \qquad (70a)$$
$$jX_1^{-1}(1 - \beta - \gamma\sin(2\phi + 2\theta) - \gamma\sin(2\phi) + \gamma\sin(2\theta) + \beta\cos(2\phi))$$

$$Y_{eff,B} = X_1^{-1}(\gamma - \gamma\cos(2\theta - 2\phi) - \gamma\cos(2\phi) + \gamma\cos(2\theta) + \beta\sin(2\phi)) + \qquad (70b)$$
$$jX_1^{-1}(-1 - \beta - \gamma\sin(2\theta - 2\phi) + \gamma\sin(2\phi) + \gamma\sin(2\theta) + \beta\cos(2\phi))$$

$$Y_{eff,C} = X_1^{-1}(\gamma - \gamma\cos(2\theta - 2\phi) - \gamma\cos(2\phi) + \gamma\cos(2\theta) + \beta\sin(2\phi)) - \qquad (70c)$$
$$jX_1^{-1}(-1 - \beta - \gamma\sin(2\theta - 2\phi) + \gamma\sin(2\phi) + \gamma\sin(2\theta) + \beta\cos(2\phi))$$

$$Y_{eff,D} = X_1^{-1}(\gamma - \gamma\cos(2\phi + 2\theta) - \gamma\cos(2\phi) + \gamma\cos(2\theta) - \beta\sin(2\phi)) - \qquad (70d)$$
$$jX_1^{-1}(1 - \beta - \gamma\sin(2\phi + 2\theta) - \gamma\sin(2\phi) + \gamma\sin(2\theta) + \beta\cos(2\phi))$$

In other words, by making $\sigma_1$ and $\sigma_2$ sufficiently small, and choosing $Z_1=X_1/\sin(\sigma_1)$ and $Z_2=X_2/\sin(\sigma_2)$, the transmission line combiner can be designed to approximately match the behavior of the lumped combiner. Of course, there is a practical limit to the minimum values selected for $\sigma_1$ and $\sigma_2$ as too small values result in extremely large transmission-line impedances that may be difficult to realize in practical circuits manufactured using currently available manufacturing techniques. It should, of course, be understood that as manufacturing techniques improve, smaller and smaller values for $\sigma_1$ and $\sigma_2$ may be realized in practical circuits.

One may additionally choose to design the combiner at one impedance level, and use an additional transformation network (transformer, matching network, tapered line, etc.) to transform the combined power for use at an impedance level desirable more suitable for driving the actual load.

Referring now to FIGS. 43A-43C, effective input conductance (FIG. 43A), susceptance (FIG. 43B), and phase (FIG. 43C) seen by each of the PAs (A-D) driving the four-way TL combiner of FIG. 40 with $Z_1=Z_2=567$ $\Omega$, $\sigma_1=0.0628$, $\sigma_2=0.0861$, and $R_L=50\Omega$ as a result of the OS outphasing control.

As with the lumped combiner implementation, in the case of the transmission line combiner, output power control can be achieved by adjusting the signal amplitudes at the combiner inputs $V_S$ (by modulating the power amplifiers drive amplitudes and/or their supply voltages), and/or by adjusting their outphasing angles $\theta$ and $\phi$ (see FIG. 42). (Further modulation of output power can be obtained by discrete or continuous drain modulation of the power amplifiers.) Straightforward transmission-line analysis reveals that the load current $I_L$ of the TL combiner of FIG. 40 depends on the terminal voltage phasors $V_A$-$V_D$ and is given by Equation 71:

$$I_L = j\frac{\sec(\sigma_2)}{Z_1 \sin(\sigma_1)}(V_A + V_C - V_B - V_D). \qquad (71)$$

Assuming the phasor relationship between the combiner port voltages is as given by Equation 67, then $I_L$ can be expressed in terms of the outphasing angles θ and φ, and the PA drive amplitude $V_S$:

$$I_L = \frac{4V_S \sin(\phi)\cos(\theta)}{Z_1 \cos(\sigma_2)\sin(\sigma_1)}. \tag{72}$$

From here, one can compute the output power $P_{out}$ that the combiner delivers to the load $R_L$. Note that by selecting $Z_1 = X_1/\sin(\sigma_1)$ and $Z_2 = X_2/\sin(\sigma_2)$, where $X_1$ and $X_2$ are the branch reactances of the lumped combiner of FIG. 39, in the limit of $\sigma_1$ and $\sigma_2$ being zero Equation 73 also reduces to the equation for output power in the case of the lumped combiner implementation.

$$P_{out} = \frac{8R_L V_S^2}{Z_1^2 \sin^2(\sigma_1)\cos^2(\sigma_2)} \sin^2(\phi)\cos^2(\theta). \tag{73}$$

Similar to the lumped combiner implementation, for θ=Ω and φ=90°, the output power saturates to its saturation level $P_{out,sat}$ given by Equation 74.

$$P_{out,sat} = \frac{8R_L V_S^2}{Z_1^2 \sin^2(\sigma_1)\cos^2(\sigma_2)}. \tag{74}$$

It can be seen from Equation 73 that, just as in the case of the lumped combiner implementation, the output power $P_{OUT}$ depends upon both θ and φ. Although infinitely many possible control angle pairs exist for a given desired output power level, one may select a particular pair based upon additional requirements on the behavior of the combiner. As described below, it is possible to adapt the optimal-phase (OP) and optimal-susceptance (OS) control methodologies discussed above in conjunction with FIGS. 1-31 to the case of the transmission-line combiner implementation.

Optimal-susceptance control entails the selection of the control angle pair [θ, φ] so that the combiner will deliver the desired output power level while reducing and ideally minimizing the peak susceptive loading of the PAs over the entire output power operating range. The OS control angles [θ, φ] can be calculated by employing the output power relation shown in Equation 73, and further imposing identical susceptive components (by magnitude) of the TL combiner effective input admittances represented by Equations 68a-68d i.e. $|Im(Y_{eff,A})|=|Im(Y_{eff,B})|=|Im(Y_{eff,C})|=|Im(Y_{eff,D})|$.

Equations 75 and 76 give the OS control angles in terms of the desired output power $P_{out}$. The actual angles used in a particular application may be determined based directly upon these equations, or by seeking desirable operating angles empirically (or adaptively) for a particular system with the angles indicated in Equations 75 and 76 as a starting point. As with discrete and mixed transmission-line and lumped implementations of the combiners, this may include independently setting the amplitudes and/or phases of the four (or N) input sources. One may start from the proposed control laws and empirically search to identify control relations (of input amplitudes and phases) that provide a desired combination of efficiency, power sharing and output power. This system training can then serve as the basis for a lookup table for commands to achieve desired outputs.

This may be further refined by using digital predistortion techniques (DPD techniques) to adaptively adjust the command amplitudes and phases used to synthesize a desired response based on comparison of the command and the observed output, as is known in the literature.

$$\phi = \tan^{-1}\left(\frac{Z_1 \tan(\sigma_1) P_{out}}{2V_S^2}\right) \tag{75}$$

$$\theta = \cos^{-1}\left(\cos(\sigma_2)\cos(\sigma_1)\sqrt{\frac{4V_S^4 + P_{out}^2 Z_1^2 \tan^2(\sigma_1)}{8R_L V_S^2 P_{out}}}\right) \tag{76}$$

in which:

$\sigma_1, \sigma_2$ correspond to the electrical angles (in radians) of the differential transmission-line lengths $\Delta L1$ and $\Delta L2$ and also defined herein below as:

$\sigma_1 = 2\pi \Delta L_1/\lambda$, $\sigma_2 = 2\pi \Delta L_2/\lambda$, $\gamma = R_L/Z_1$, and $\beta = Z_2/Z_1$.

and $V_s$ correspond to the ac voltage amplitude at the combiner inputs.

Referring now to FIGS. 43A-43C, the input admittance characteristics of an example design of the TL combiner of FIG. 40 with $Z_1=Z_2=567\Omega$, $\sigma_1=0.0628$, $\sigma_2=0.0861$, and $R_L=50\Omega$ as a result of the OS outphasing control is shown. As is evident from FIG. 40, the admittance characteristics of the transmission line and lumped combiner implementations are approximately equivalent. The input conductance is modulated in accordance with output power, while peak susceptance variations are limited to less than 2.5 mS. It should be noted that in the example design considered here, fairly large transmission-line characteristic impedances of 567Ω are used. Although the implementation of such transmission lines in reality may pose some challenges, (e.g., loss, manufacturing and accuracy difficulties associated with high impedance lines) the purpose of this example is to demonstrate that a transmission line combiner can be designed to have almost identical characteristics as its lumped-element counterpart. As will be discussed below, the higher the transmission-line characteristic impedance relative to the load impedance, the closer the transmission line combiner mimics the behavior of the lumped-element combiner. On the other hand, smaller transmission-line impedances will result in slightly wider operating range at the expense of higher susceptance (and phase) variations in the input admittances of the combiner.

FIGS. 44A-44C show effective input conductance (FIG. 44A), susceptance (FIG. 44B), and phase (FIG. 44C) seen by each of the PAs (A-D) driving the four-way TL combiner of FIG. 40 with $Z_1=Z_2=100\ \Omega$, $\sigma_1=0.3640$, $\sigma_2=0.5096$, and $R_L=50\Omega$ as a result of the OS outphasing control.

For example, FIG. 44A-44C depict the effective input admittance characteristics of each of the combiner input ports A-D of an example design of the transmission line combiner of FIG. 40 with $Z_1=Z_2=100\ \Omega$, $\sigma_1=0.3640$, $\sigma_2=0.5096$, and $R_L=50\Omega$ as a result of OS outphasing control.

Comparing the susceptance characteristics of FIGS. 43A-43C and FIGS. 44A-44C reveals that decreasing the transmission-line characteristic impedances for a given combiner load $R_L$ does indeed result in larger phase and susceptance variations (and slightly wider operating range). In the former combiner example ($Z_1=Z_2=567\Omega \approx 11R_L$) the peak admittance phase and susceptance are 2° and 2.5 mS respectively, while in the later example ($Z_1=Z_2=100\ \Omega=2R_L$) the peak admittance phase and susceptance have dramatically increased to approximately 15° and 20 mS respectively.

The above example comparison suggests that in order for the TL combiner implementation to exhibit approximately the same behavior as its lumped-element counterpart, the characteristic impedance of the transmission lines in FIG. 40 must be selected to be significantly larger than the combiner loading impedance $R_L$ (by a factor of ten or larger). In a typical RF application where the intended load is 50Ω, similar to the above example, one may use transmission lines having a characteristic impedance on the order of 500Ω or higher. The implementation of transmission lines with such high characteristic impedances may be quite problematic in some cases however. This is where one can appreciate the design flexibility introduced by an impedance transformation stage at the combiner's output. Suppose for example that one desires to drive a 50Ω load with the TL combiner of FIG. 40. However, instead of designing the combiner network for a 50Ω load, it can be designed for 12.5Ω. An additional impedance transformation stage (with an impedance transformation factor of 4) can be employed at the combiner's output to transform the actual 50Ω load to a 12.5Ω combiner loading impedance RL. As a consequence, the characteristic impedance of the combiner's transmission lines can be selected on the order of 125Ω–a value that is significantly easier to implement than 500Ω in the case of the combiner driving the 50 Ω load directly. Of course, in the latter case one must also redesign the PAs to handle the new loading impedance requirements: the combiner designed for a 12.5Ω load will have effective input admittances that are a quarter of those of the combiner designed to operate with a 50Ω load.

Figure 45A:
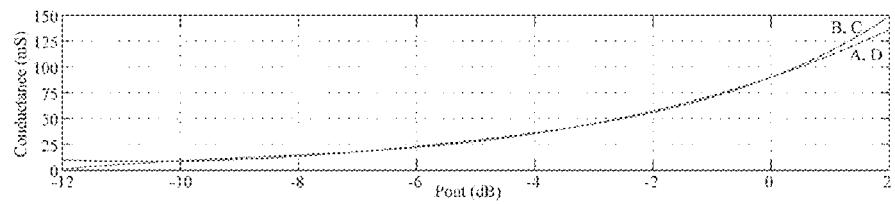
FIGS. 45A, 45B, 45C are plots of effective input conductance (FIG. 45A), susceptance (FIG. 45B), and phase (FIG. 45C) seen by each of the power amplifiers driving the four-way transmission line combiner of FIG. 40 with $Z_1$=$Z_2$=567Ω, ($\sigma_1$=0.0628, ($\sigma_2$=0.0861, and $R_L$=50Ω as a result of the OP outphasing control.
Figure 45B:
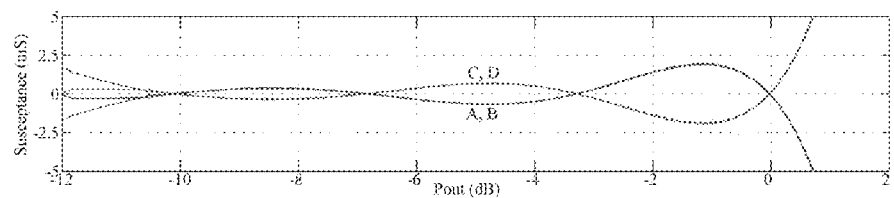
Figure 45C:
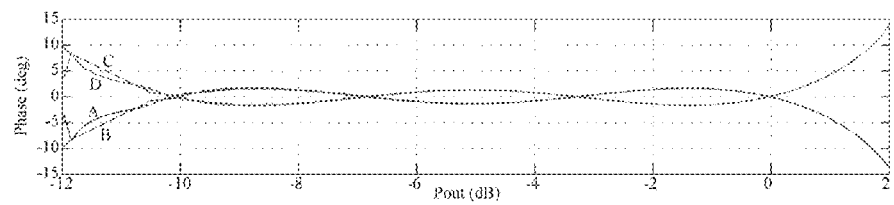

Referring now to FIGS. 45A-45C, (shown are the effective input conductance (FIG. 45A), susceptance (FIG. 45B), and phase (45C) seen by each of the PAs (A-D) driving the four-way transmission line combiner of FIG. 40 with $Z_1=Z_2=567$ Ω, $\sigma_1=0.0628$, $\sigma_2=0.0861$, and $R_L=50\Omega$ as a result of the OP outphasing control.

By analogy to OS control, optimal-phase (OP) control entails the selection of a control angle pair [θ,φ] so that the combiner will deliver the desired output power level while reducing or ideally minimizing the peak phase of the transmission line combiner's input admittances seen by the PAs over the entire output power operating range. Although closed-form expressions for the OP control angles have not been determined, the control angle values can be computed numerically for any arbitrary combiner design. This can be done by numerically searching across combinations of control angles (e.g., starting from Optimal Susceptance angles), and identifying the sets of control angles that provide a given output power with minimum phases.

FIGS. 45A-45C illustrates the input admittance characteristics of an example design of the transmission line combiner of FIG. 40 with $Z_1=Z_2=567$ Ω, $\sigma_1=0.0628$ and $\sigma_2=0.0861$ (the same transmission line combiner design as in the example above) as a result of the OP outphasing control. Not surprisingly, as can be seen from FIGS. 43A-43C and FIGS. 45A-45C, both the OP and OS control methods result in approximately identical input admittance characteristics.

Figure 46:
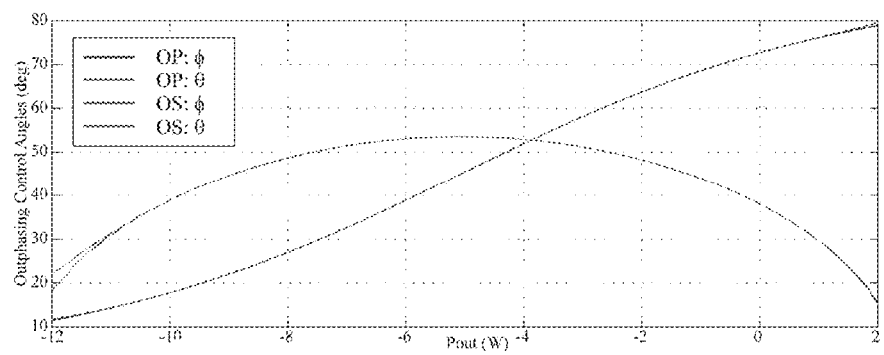
FIG. 46 is a plot of outphasing control angles θ and φ for the Optimal Phase (OP) and Optimal Susceptance (OS) control methods for the four-way combiner of FIG. 40 with $Z_1$=$Z_2$=567Ω, $\sigma_1$=0.0628, $\sigma_2$=0.0861, and $R_L$=50Ω.

FIG. 46 illustrates outphasing control angles θ and φ for the Optimal Phase (OP) and Optimal Susceptance (OS) control methods for the four-way combiner of FIG. 40 with $Z_1=Z_2=567\Omega$, $\sigma_1=0.0628$, $\sigma_1=0.0861$, and $R_L=50\Omega$.

In particular, FIG. 46 shows that the OP and OS control angles, for all practical purposes, are substantially identical over almost the entire combiner operating range. Similarly to the lumped-element combiner implementation, by outphasing the transmission line combiner for minimum susceptive variations, one simultaneously achieves minimum input admittance phase variations, and vice-versa.

Phase-shift (outphasing) control techniques such as those described above may be employed to modulate the output power (and control the instantaneous RF output), with control angles to achieve particular operating points (based on desired the desired output) derived from equations or based-on lookup-tables of control angles (or I, Q values, etc.) determined empirically, or through other means. As with the designs described above in conjunction with FIGS. 1-31, output power control can be accomplished by outphasing of the sources (power amplifiers), or by a combination of outphasing and drive amplitude backoff of the sources (power amplifiers) driving the power combining network. Any desired combination of outphasing and drive amplitude modulation may be used in order to achieve goals such as high linearity and high efficiency. In some cases, one may choose to use outphasing over some portion of the output power range and drive backoff over a second portion of the output power range, where the two portions may or may not overlap. Power may be further controlled through discrete or continuous drain modulation of the power amplifiers driving the combiner network. Moreover, one may adjust drive amplitudes individually to balance the drives and loading of the individual power amplifiers driving the combiner, and may also adjust drive over the operating range to improve or maximize overall lineup efficiency or power-added efficiency of the power amplifier system.

The concepts, systems and techniques presented here for designing the transmission-line combiner of FIG. 40 are similar to those employed for designing the lumped-element combiner. The design of the TL combiner begins with a specification on its operating output power range and its load RL. As discussed herein, a design parameter k is selected based upon the intended combiner operating range. The reactance values $X_1$ and $X_2$ are then calculated according to Equations 77 and 78.

$$X_2 = \frac{2R_L}{k+1} \tag{77}$$

$$X_1 = \frac{X_2}{k + \sqrt{k^2 - 1}} \tag{78}$$

Note that these reactances are equivalent to the branch reactances of the lumped-element combiner in FIG. 39; this is the starting point for converting a lumped-element implementation into the transmission-line implementation.

For given transmission-line characteristic impedances $Z_1$ and $Z_2$, the transmission-line length increments $\Delta L_1$ and $\Delta L_2$ can then be computed according to Equations 31 and 32. The higher the values of $Z_1$ and $Z_2$ which are selected, the closer the behavior of the transmission line combiner to that of its lumped-element counterpart.

$$\Delta L_1 = \frac{\lambda}{2\pi}\sin^{-1}\left(\frac{X_1}{Z_1}\right) \tag{79}$$

$$\Delta L_2 = \frac{\lambda}{2\pi}\sin^{-1}\left(\frac{X_2}{Z_2}\right) \tag{80}$$

Figure 47:
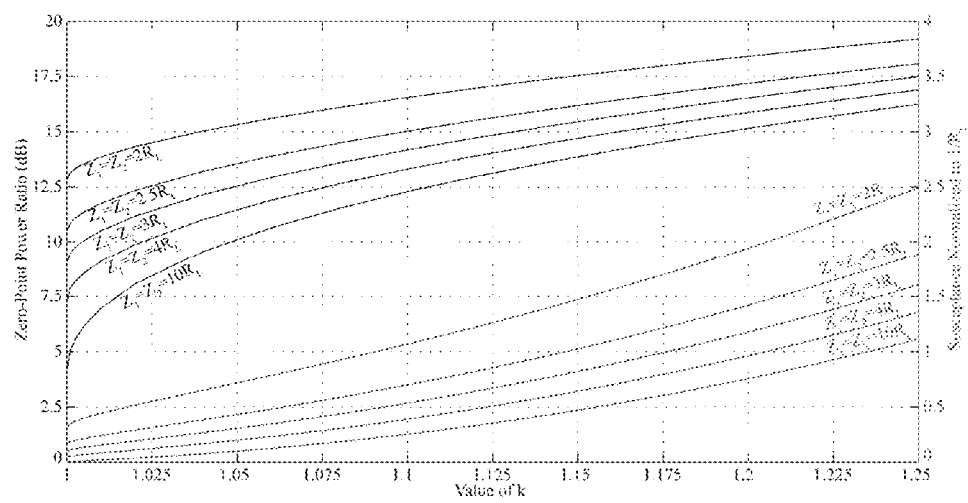
FIG. 47 is a plot of zero-point power ratio vs. K illustrating four-way transmission line combiner design curves.

A set of design curves (illustrated as solid and dotted lines) are shown in FIG. 47 for the transmission line combiner for various transmission-line characteristic impedances ranging from $2R_L$ to $10R_L\Omega$. To determine the appropriate design factor for a particular transmission line combiner operating output power range ratio (PRR), one starts from the left Zero-Point Power Ratio axis and traces the desired PRR to one of the solid lines corresponding to the selected transmission-line characteristic impedances $Z_1$ and $Z_2$. Tracing then vertically down to the k-value axis yields the appropriate value of k. The resultant peak susceptive PA loading (normalized to $1/R_L$) for the chosen value of k is then given by tracing the k value vertically up to a dotted line corresponding to the values of $Z_1$ and $Z_2$, and then tracing horizontally (right) to the Susceptance axis. It is interesting to note that although higher $Z_1$ and $Z_2$ values result in a transmission line combiner whose behavior closely mimics that of the lumped-element combiner, smaller $Z_1$ and $Z_2$ values yield wider output power operating range at the expense of larger peak susceptance variations. The design curves in FIG. 47 are generated for transmission lines having identical characteristic impedances, which may result in certain simplifications to the constriction of the combiner. However, after reading the disclosure herein, it should be appreciated by those of ordinary skill in the art that similar design curves can be generated for any arbitrary combination of $Z_1$ and $Z_2$ values.

Thus, transmission line combiner design curves can be used to trace-out the specified power range ratio to the Power Ratio Curve to determine the appropriate design value for k for particular transmission line characteristic impedances. The Susceptance Curves give the corresponding peak effective input susceptance that a PA can see at the inputs ports of the combiner over the specified operating range for OP/OS outphasing control. The susceptance axis is normalized to a combiner load $R_L=1\Omega$; to denormalize, multiply axis by $1/R_L$.

Design and the performance characteristics of a multi-way combiner comprised entirely of transmission lines (FIG. 40) where the length of each transmission line is selected as a particular increment/decrement from a half-wavelength ($\lambda/2$) base length have been described above.

It has, however, been recognized in accordance with the concepts, systems and techniques described herein, that combining networks can also be implemented with transmission lines having different base lengths $L_b$. One exemplary embodiment is described in conjunction with FIG. 48 which illustrates a radio-frequency (RF) power combiner having an output port and $N=2^M$ input ports, where M is an integer greater than one and the power combiner includes 2N-2 transmission-line segments, the n and $(n+1)^{st}$ transmission line segments having electrical lengths of $K_n\lambda/4+\Delta L_n$ and $K_n\lambda/4-\Delta L_n$, where $K_n$ is an $n^{th}$ integer greater than or equal to one, $\lambda/4$ is a quarter wavelength at a design frequency, and $\Delta L_n$ is an $n^{th}$ nonzero length, and wherein each transmission line segment is coupled to at least one other transmission line segment.

Figure 48:
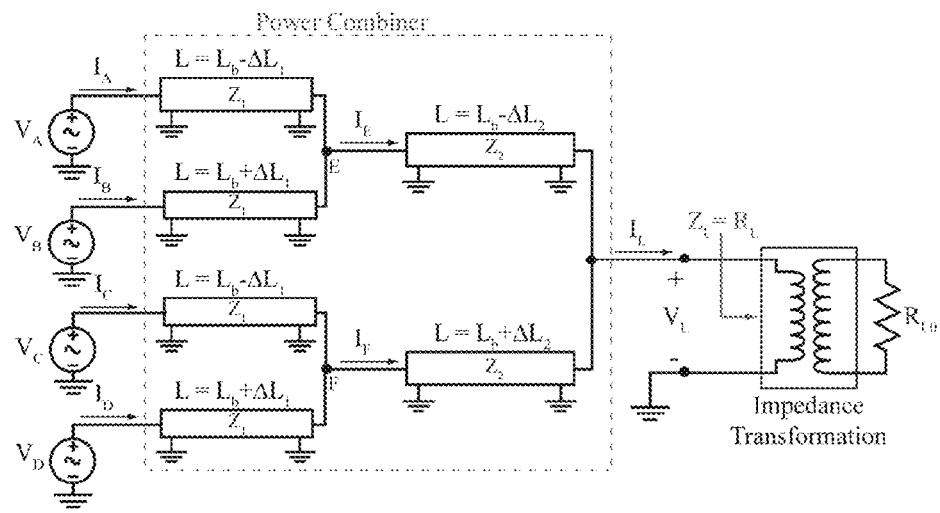
FIG. 48 is a schematic diagram of a transmission-line implementation of the four-way combiner of FIG. 39 using transmission lines having characteristic impedance values of $Z_1$ and $Z_2$ and having transmission line lengths defined as ±Δ$L_1$ and ±Δ$L_2$ increments to a particular transmission line base length $L_b$.
Figure 49:
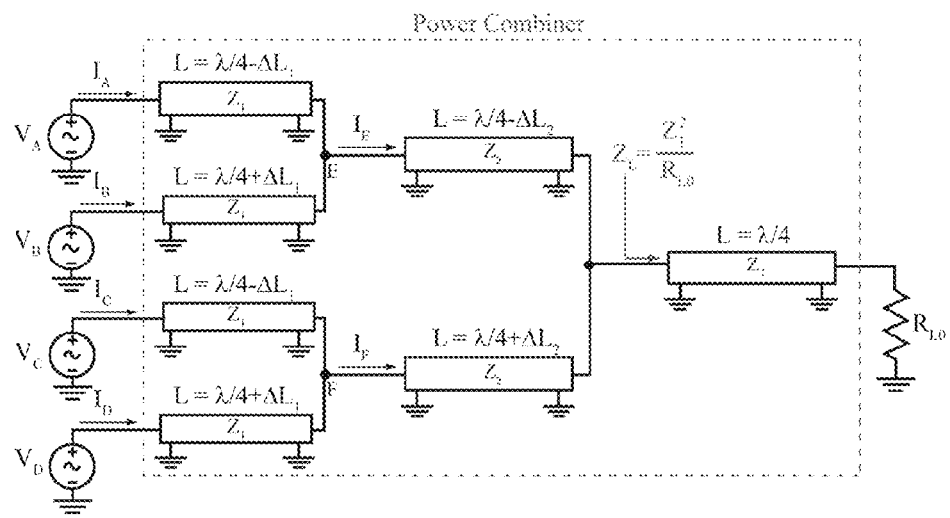
FIG. 49 is a schematic diagram of a λ/4 base-length transmission-line implementation of the four-way combiner of FIG. 48 including a λ/4 transmission line impedance stage.

As shown in FIGS. 40, 48, 49 for example, the power combiner the 2N-2 transmission-line segments may be coupled in a binary tree configuration. In some embodiments, the combiner may include an impedance transformation element. In some embodiments, impedance transformation element may be provided as a quarter-wave transmission line.

It should be appreciated that reference is sometimes made herein to combiners having "stages" and that such references are made to promote clarity in the description of the drawings and concepts described herein. It should be understood that use of the term "stage" (or variants thereof) is not intended to suggest that the stages function separately (e.g., a particular combiner stage combines certain pieces and a the next stage combines certain other pieces). It should be understood that ALL of the sections of a combiner operate together to provide a desired result and every power amplifier (PA) interacts with every other PA through the whole combiner network. That is, at a functional level the operation cannot be parsed in stages. Moreover, it should be appreciated that transformations can be performed on the structure of the combiner that yield the same or substantially the same result with no "staged" structural features to speak of (see, for example, the exemplary embodiment of FIG. 30B).

Referring now to FIG. 48, an exemplary combiner comprises transmission lines (TLs) having a base length $L_b$ corresponding to a quarter-wavelength ($L_b=\lambda/4$). The combiner of FIG. 48 corresponds to a transmission-line implementation of the four-way combiner of FIG. 39 using transmission lines having characteristic impedance values $Z_1$ and $Z_2$ and having transmission line lengths defined as $\pm\Delta L_1$ and $\pm\Delta L_2$ increments to a particular transmission line base length $L_b$.

The exemplary combiner of FIG. 48 still yields substantially identical combining characteristics to the $\lambda/2$ combiner. In this case, the TL lengths are defined as a particular increment/decrement $\Delta L_1$ and $\Delta L_2$ from a quarter-wavelength transmission line. A quarter-wavelength is the shortest possible TL base length that will allow for symmetric length increments $\pm\Delta L_{1,2}$. Similarly to the $\lambda/2$ combiner, half wavelength increments may be added to the base transmission line lengths without changing the operating characteristics, but shorter lengths are preferable when possible because of practical loss considerations.

Accordingly, described herein below are combining characteristics and the design methodology for a $\lambda/4$ combiner. It should be noted that although the combiner network is designed for a particular load resistance $R_L$, its output may be terminated with an impedance transformation stage (such as a matching network, or a transmission-line transformer) that converts the actual load impedance $R_{L0}$ to the impedance $R_L$ for which the combiner is designed, as illustrated in the exemplary embodiment of FIG. 48. Such impedance transformation introduces greater design flexibility and allows one to design the combiner network without the necessity for transmission lines with high characteristic impedances.

In the combiner of FIG. 49, for example, a $\lambda/4$ combiner which may be the same as or similar to that described in connection with FIG. 48, further comprises a quarter-wavelength transmission line impedance transformation stage coupled between an output of a combiner stage and the load $R_{L0}$. The exemplary combiner of FIG. 49 thus corresponds to a $\lambda/4$ base-length transmission-line implementation of a four-way combiner (e.g. such as that shown in FIG. 48) combined with a $\lambda/4$ transmission line impedance stage. The load $R_L$ seen by the combiner in this case (the load for which the combiner network is designed) is $Z_T^2/R_{L0}$, where $Z_T$ is the characteristic impedance of the transmission line used for the impedance transformation stage. Such an implementation of the impedance transformation stage is particularly convenient as it allows an all-transmission line combiner implementation, and can be easily implemented with microstrip lines.

Input-Port Admittance Characteristics

The approach described above to derive an effective input admittances of a $\lambda/2$ combiner can also be utilized in the case of the $\lambda/4$ combiner. It can be shown that the effective input admittance matrix $Y_{eff}$ relating the input-port currents ($I_A$-$I_D$) to the terminal voltages ($V_A$-$V_D$) of the λ/4 combiner of FIG. 49 is given by (81)-(84), where:

$$\sigma_1 = 2\pi\Delta L_1/\lambda,\; \sigma_2 = 2\pi\Delta L_2/\lambda,\; \gamma = R_L/Z_1,\; \text{and}\; \beta = Z_2/Z_1. \quad (81)$$

$$\begin{bmatrix} I_A \\ I_B \\ I_C \\ I_D \end{bmatrix} = Y_{eff} \begin{bmatrix} V_A \\ V_B \\ V_C \\ V_D \end{bmatrix} = \begin{bmatrix} M_1 & M_2 \\ M_2 & M_3 \end{bmatrix} \begin{bmatrix} V_A \\ V_B \\ V_C \\ V_D \end{bmatrix}$$

$$M_1 = \begin{bmatrix} \gamma csc^2(\sigma_2) + & \gamma csc^2(\sigma_2) + j\beta cot(\sigma_2) \\ j(-\cos(\sigma_1)\sin(\sigma_1) + \beta cot(\sigma_2)) & \\ \gamma csc^2(\sigma_2) + j\beta cot(\sigma_2) & \gamma csc^2(\sigma_2) + \\ & j(\cos(\sigma_1)\sin(\sigma_1) + \beta cot(\sigma_2)) \end{bmatrix} \quad (82)$$

$$M_3 = \begin{bmatrix} \gamma csc^2(\sigma_2) - & \gamma csc^2(\sigma_2) - j\beta cot(\sigma_2) \\ j(\cos(\sigma_1)\sin(\sigma_1) + \beta cot(\sigma_2)) & \\ \gamma csc^2(\sigma_2) - j\beta cot(\sigma_2) & \gamma csc^2(\sigma_2) - \\ & j(-\cos(\sigma_1)\sin(\sigma_1) + \beta cot(\sigma_2)) \end{bmatrix} \quad (83)$$

$$M_2 = \begin{bmatrix} -\gamma csc^2(\sigma_2) & -\gamma csc^2(\sigma_2) \\ -\gamma csc^2(\sigma_2) & -\gamma csc^2(\sigma_2) \end{bmatrix} \quad (84)$$

If one assumes similar PA outphasing pattern (FIG. 42) as in the case of the λ/2 combiner with the combiner terminal voltages $V_A$-$V_D$ given by Equation (67), then it can be shown that the effective combiner input admittances $Y_{eff,A}$-$Y_{eff,D}$ are given in terms of the outphasing angles θ and φ according to Equations (85a-85d).

$$Y_{eff,A} = \quad (85a)$$
$$\frac{csc^2(\sigma_2)sec^2(\sigma_1)}{Z_1}[\cos(\phi)(-\beta\sin(\phi)\sin(2\sigma_2) + 4\gamma\sin(\theta)\sin(\theta+\phi)) +$$
$$j(-4\gamma\cos(\phi)\cos(\theta+\phi)\sin(\theta) -$$
$$\cos(\sigma_1)\sin(\sigma_1)\sin^2(\sigma_2) + \beta\cos^2(\phi)\sin(2\sigma_2))]$$

$$Y_{eff,B} = \quad (85b)$$
$$\frac{csc^2(\sigma_2)sec^2(\sigma_1)}{Z_1}[\cos(\phi)(\beta\sin(\phi)\sin(2\sigma_2) + 4\gamma\sin(\theta)\sin(\theta-\phi)) +$$
$$j(-4\gamma\cos(\theta-\phi)\cos(\phi)\sin(\theta) +$$
$$\cos(\sigma_1)\sin(\sigma_1)\sin^2(\sigma_2) + \beta\cos^2(\phi)\sin(2\sigma_2))]$$

$$Y_{eff,C} = \quad (85c)$$
$$\frac{csc^2(\sigma_2)sec^2(\sigma_1)}{Z_1}[\cos(\phi)(\beta\sin(\phi)\sin(2\sigma_2) + 4\gamma\sin(\theta)\sin(\theta-\phi)) -$$
$$j(-4\gamma\cos(\theta-\phi)\cos(\phi)\sin(\theta) +$$
$$\cos(\sigma_1)\sin(\sigma_1)\sin^2(\sigma_2) + \beta\cos^2(\phi)\sin(2\sigma_2))]$$

$$Y_{eff,D} = \quad (85d)$$
$$\frac{csc^2(\sigma_2)sec^2(\sigma_1)}{Z_1}[\cos(\phi)(-\beta\sin(\phi)\sin(2\sigma_2) + 4\gamma\sin(\theta)\sin(\theta+\phi)) -$$
$$j(-4\gamma\cos(\phi)\cos(\theta+\phi)\sin(\theta) -$$
$$\cos(\sigma_1)\sin(\sigma_1)\sin^2(\sigma_2) + \beta\cos^2(\phi)\sin(2\sigma_2))]$$

As with the lumped and the λ/2 combiner implementations, it can be seen from Equations (85a-85d) that the input admittances at ports A/D and B/C are complex conjugate pairs. It is interesting to note that if the transmission line impedances $Z_1$ and $Z_2$ are selected to be respectively $X_1/\cos(\sigma_1)$ and $X_2/\cos(\sigma_2)$, where $X_1$ and $X_2$ are the branch reactances of the lumped combiner of FIG. 39, then in the limit of $\sigma_1$ and $\sigma_2$ being equal to π/2, Equations (81)-(85d) become identical to Equations (69)-(70d), i.e. the expressions for the lumped-element combiner of FIG. 39. In other words, by making $\sigma_1$ and $\sigma_2$ sufficiently close to π/2, and choosing $Z_1=X_1/\cos(\sigma_1)$ and $Z_2=X_2/\cos(\sigma_2)$, one can design the λ/4 TL combiner to approximately match the behavior of the lumped combiner. Of course, there is a practical limit to how close to π/2 one can pick $\sigma_1$ and $\sigma_2$ to be, as values that are too close result in extremely large transmission-line impedances which are hard to realize. It is also interesting to observe the similarity between the effective input admittances of the λ/2 and λ/4 TL combiners. Careful examination of Equations (81)-(85d) and (63)-(68d) reveals that essentially all the sin, cos, and tan functions in Equations (63)-(68d) are respectively replaced with cos, sin, and cot functions to obtain (81)-(85d). One way to gain insight into this transformation is to think of the λ/4 combiner as a λ/2 combiner with each TL line shortened by a λ/4. In the phasor domain, λ/4 TL length change corresponds to a 90° rotation, and hence the trigonometric transformations.

Output Power Control

Using an analogical approach to the case of the λ/2 combiner, it can be shown that the output power $P_{out}$ of the λ/4 combiner of FIG. 48 (assuming that PAs are outphased according to FIG. 42) is given by Equation (86) with the maximum possible output power (the saturation power level) $P_{out,sat}$ given by Equation (87).

$$P_{out} = \frac{8R_L V_S^2}{Z_1^2 \cos^2(\sigma_1)\sin^2(\sigma_2)} \cos^2(\phi)\sin^2(\theta) \quad (86)$$

$$P_{out,sat} = \frac{8R_L V_S^2}{Z_1^2 \cos^2(\sigma_1)\sin^2(\sigma_2)}. \quad (87)$$

Outphasing Control

It can be seen from Equation (86) that, just as in the case of the lumped combiner and the λ/2 TL combiner implementations, the output power $P_{out}$ depends on both θ and φ. All of the above-described outphasing control methodologies are directly applicable to the λ/4 combiner. Next described are techniques for adapting the optimal-susceptance (OS) control methodology to the case of the λ/4 transmission-line combiner implementation.

Optimal-susceptance control entails the selection of the control angle pair [θ, φ] so that the combiner will deliver the desired output power level while minimizing the peak susceptive loading of the PAs over the entire output power operating range. The OS control angles can be calculated by employing the output power relation Equation (86), and further imposing identical susceptive components (by magnitude) of the λ/4 TL combiner effective input admittances Equation (85), i.e. $|Im(Y_{eff,A})|=|Im(Y_{eff,B})|=|Im(Y_{eff,C})|=Im(Y_{eff,D})|$. Equations (88) and (89) give the OS control angles in terms of the desired output power $P_{out}$. Note that both Equations (88) and (89) are nearly identical to the equations derived for the λ/2 combiner after the above described trigonometric transformation.

$$\phi = \cot^{-1}\left(\frac{Z_1 \cot(\sigma_1) P_{out}}{2V_S^2}\right) \quad (88)$$

$$\theta = \sin^{-1}\left(\sin(\sigma_2)\sin(\sigma_1)\sqrt{\frac{4V_S^4 + P_{out}^2 Z_1^2 \cot^2(\sigma_1)}{8R_L V_S^2 P_{out}}}\right) \quad (89)$$

Referring now to FIG. 50, a plot of control angles (in degrees) vs. output power $P_{out}$ (in dB) for outphasing control angles $\theta$ and $\phi$ for the Optimal Phase (OS) control method for the four-way $\lambda/2$-combiner of FIG. 40 ($Z_1=Z_2=567\Omega$, $\sigma_1=0.0628$, $\sigma_2=0.0861$, $R_L=50\Omega$) and the $\lambda/4$-combiner of FIG. 49 ($Z_1=Z_2=567\Omega$, $\sigma_1=1.5080$, $\sigma_2=1.4847$, $R_L=50\Omega$) is shown. Both of the $\lambda/4$ and $\lambda/2$ TL combiners are designed to operate over an approximately 10 dB output power range, while driving a $50\Omega$ load, and having substantially identical transmission line characteristic impedances of $567\Omega$. The obvious symmetry in the angles is a manifestation of the described above trigonometric transformation.

Referring now to FIGS. 51A, 51B, 51C plots of effective input conductance (FIG. 51A), susceptance (FIG. 51B), and phase (FIG. 51C) seen by each of the power amplifiers (A-D) driving the four-way $\lambda/4$ TL combiner of FIG. 48 with $Z_1=Z_2=567\Omega$, $\sigma_1=1.5080$, $\sigma_2=1.4847$, and $R_L=50\Omega$ as a result of the OS outphasing control are shown.

FIGS. 51A, 51B, 51C illustrate the input admittance characteristics of an example design of the $\lambda/4$ TL combiner of FIG. 48 with $Z_1=Z_2=567$ $\Omega$, $\sigma_1=0.0628$, $\sigma_2=0.0861$, and $R_L=50\Omega$ as a result of the OS outphasing control. The input conductance is modulated in accordance with output power, while peak susceptance variations are limited to less than 2.5 mS. It is easy to see from FIG. 51 and FIG. 43 that the admittance characteristics of the $\lambda/4$ and $\lambda/2$ TL combiners is substantially identical (when the combiners are designed for the same specifications).

Similarly to the $\lambda/2$ TL combiner, the higher the transmission-line characteristic impedance relative to the load impedance, the closer the TL combiner mimics the behavior of its lumped-element counterpart. On the other hand, smaller transmission-line impedances will result in slightly wider operating range at the expense of higher susceptance (and phase) variations in the input admittances of the combiner.

Design Methodology

The methodology for designing the $\lambda/4$ transmission-line combiner of FIG. 48 is identical to the one employed for designing the $\lambda/2$ combiner. The design begins with a specification on its operating output power range and its load $R_L$. A design parameter k is selected based on the intended combiner operating range. The reactance values $X_1$ and $X_2$ are then calculated according to Equations (90) and (91). Note that these reactances are equivalent to the branch reactances of the lumped-element combiner in FIG. 39; this is the starting point for converting the lumped-element implementation into the transmission-line implementation.

$$X_2 = \frac{2R_L}{k+1} \quad (90)$$

$$X_1 = \frac{X_2}{k + \sqrt{k^2 - 1}} \quad (91)$$

For given transmission-line characteristic impedances $Z_1$ and $Z_2$, the transmission-line length increments $\Delta L_1$ and $\Delta L_2$ can then be computed according to (92) and (93). The higher the values of $Z_1$ and $Z_2$, are selected, the closer is the behavior of the TL combiner to that of its lumped-element counterpart. The trigonometric transformation relating the $\lambda/2$ and $\lambda/4$ combiners is again evident by comparing Equations (92)-(93) to Equations (79)-(80).

$$\Delta L_1 = \frac{\lambda}{2\pi}\cos^{-1}\left(\frac{X_1}{Z_1}\right) \quad (92)$$

$$\Delta L_2 = \frac{\lambda}{2\pi}\cos^{-1}\left(\frac{X_2}{Z_2}\right) \quad (93)$$

In the set of design curves shown and described above in conjunction with FIG. 47 for the TL combiner for various transmission-line characteristic impedances ranging from $2R_L$ to $10R_L\Omega$, it should be noted that the design curves for the $\lambda/2$ and $\lambda/4$ combiners are identical. To determine an appropriate design factor for a particular TL combiner operating output power range ratio (PRR), start from the left Zero-Point Power Ratio axis and trace the desired PRR to a black curve corresponding to the selected transmission-line characteristic impedances $Z_1$ and $Z_2$. Tracing then vertically down to the k-value axis yields the appropriate value of k. The resultant peak susceptive PA loading (normalized to $1/R_L$) for the chosen value of k is then given by tracing the k value vertically up to a red curve corresponding to the values of $Z_1$ and $Z_2$, and then tracing horizontally (right) to the Susceptance axis. It is interesting to note that although higher $Z_1$ and $Z_2$ values result in a TL combiner whose behavior closely mimics that of the lumped-element combiner, smaller $Z_1$ and $Z_2$ values yield wider output power operating range at the expense of larger peak susceptance variations. The design curves in FIG. 47 are generated for transmission lines having identical characteristic impedances, which may result in certain simplifications to the constriction of the combiner. However, similar design curves can be generated for any arbitrary combination of $Z_1$ and $Z_2$ values.

It should be appreciated that there are also numerous other variations of the concepts, systems and techniques both described and claimed herein. For example, these include one or more of: (a) outphasing groups of this type of combined PA using a conventional isolating combiner (with or without energy recovery); (b) operation of power amplifiers with the proposed combining and outphasing, additionally using drain voltage modulation or power amplifier supply voltage modulation (adaptive bias, polar modulation, discrete drain switching, asymmetric multilevel outphasing, multi-level LINO etc.); (c) application of gate-width switching of the power amplifiers to reduce losses at small output powers; (d) operation of power amplifiers with the proposed combining and outphasing hybridized with other control strategies. This would include using class AB, class B or Doherty-type or other types of PAs in saturation under outphasing over part of the power range and backing into linear operation over part of the range, use of adaptive bias of the power amplifiers over the operating range, hybridizing with duty cycle control or discrete pulse modulation, etc.; (e) adaptively modulating subsets of the amplifiers on and off as an additional form of power control.

FIGS. 53-56 illustrate a multi-way outphasing amplification system and related structures for directly synthesizing phase modulated RF signals to drive branch amplifiers from a modulated RF input signal.

Figure 52:
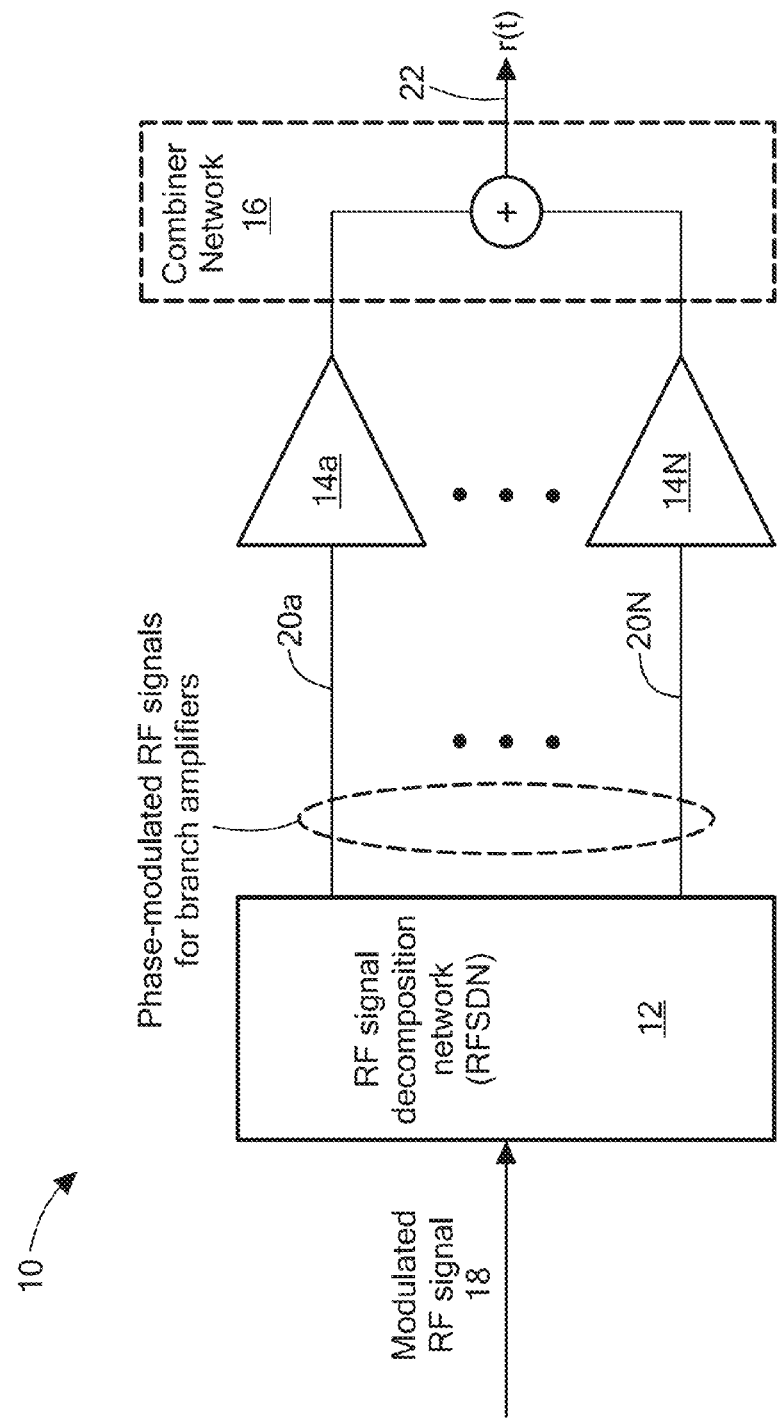
FIG. 52 is a block diagram of an RF-input/RF-output outphasing amplifier.

Referring to FIG. 52, an illustrative RF-input/RF-output outphasing amplification system 10 includes an RF signal decomposition network (RFSDN) 12, a plurality of branch amplifiers 14a-14N (generally denoted 14), and a combiner network 16. The RFSDN 12, which may also be referred to as an "RF outphasing splitter," includes an input port coupled to receive a modulated RF input signal 18 and a plurality of output ports coupled to provide a plurality of phase- and/or amplitude-modulated RF signals 20a-20N (generally referred to herein as "branch" or "drive" signals 20).

For simplicity of explanation, signal paths and corresponding signals carried on those signal paths are shown using common reference designators in FIGS. 52-55. Thus, for example, the modulated RF input signal may be carried on a corresponding signal path 18, as shown.

Each of the branch amplifiers 14 is coupled to receive a branch signal 20 from a corresponding output port of the RFSDN 12. Each of the branch amplifiers 14 includes an input port and an output port, with the input port coupled to an RFSDN output port via a respective one of the branch signal paths 20. The combiner network 16 includes a plurality of input ports, each of which may be coupled to a respective branch amplifier output port, and output port to provide an amplified RF output signal 22.

In certain embodiments, at least one of the branch amplifiers 14 is provided as a power amplifier (PA).

In general, the system 10 includes N branches, where N is an integer greater than equal to 2, wherein a branch corresponds to a branch signal path 20 coupled to a respective branch amplifier 14. In various embodiments, a system 10 has $N=2^M$ branches, where M is an integer greater than or equal to one. Factors for choosing N may include the desired output power level, tolerance for overall system size, complexity and cost, and power loss in the combiner (when N is large). For cases using a reactive combiner with $N=2^M$ branches, a larger M results in the power combiner input impedances have lower reactive variation over the operating range of output power. In general, loading conditions improve as M increases (e.g., from M=1 to M=2, or N=2 to N=4).

The RFSDN 12 may include a plurality of nonlinear components (not shown in FIG. 52). In some embodiments, each of the nonlinear components may be coupled to a respective one of the branch signal paths 20. In this arrangement, the RFSDN 12 can be used to decompose a modulated RF input signal 18 into multiple phase- and amplitude-modulated RF signals 20 to drive the branch amplifiers 14. Various types and arrangements of nonlinear components can be used, with one example being shown in FIG. 54 and described below in conjunction therewith.

As discussed above, RFSDN 12 receives a single modulated RF input signal 18 and generates a plurality of branch signals 20 suitable for amplification by branch amplifiers 14. With this approach, the outphasing system 10 can amplify input signals 18 that are modulated (e.g., phase- and/or amplitude-modulated) and that have amplitudes ranging from zero to a maximum value. In some embodiments, the RFSDN 12 is comprised of passive elements, and thus is provided as a passive RF signal decomposition network. In other embodiments, the RFSDN 12 includes active components.

Figure 53:
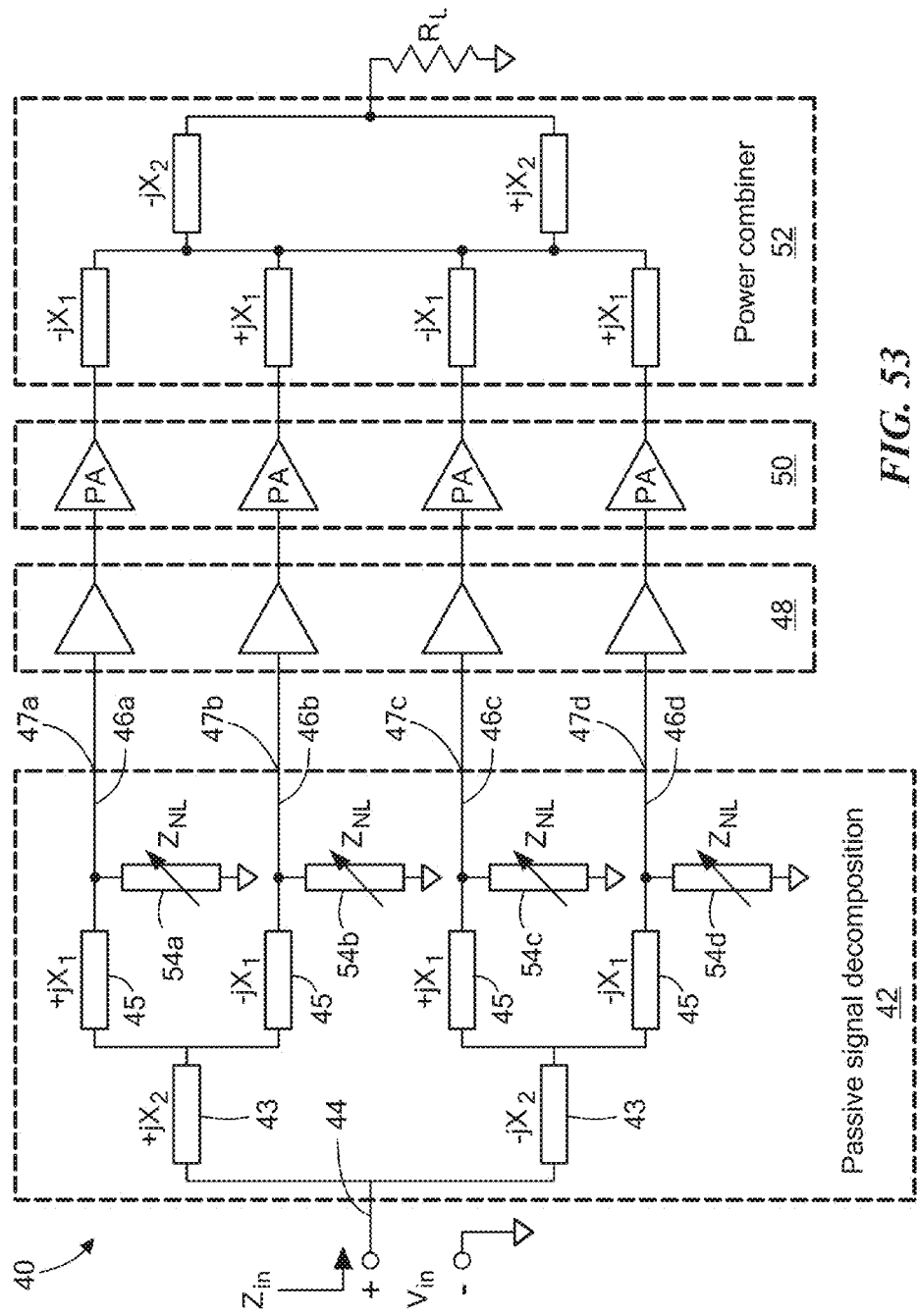
FIG. 53 is a circuit diagram of an RF-input/RF-output outphasing amplifier utilizing lumped reactive elements.
Figure 54:
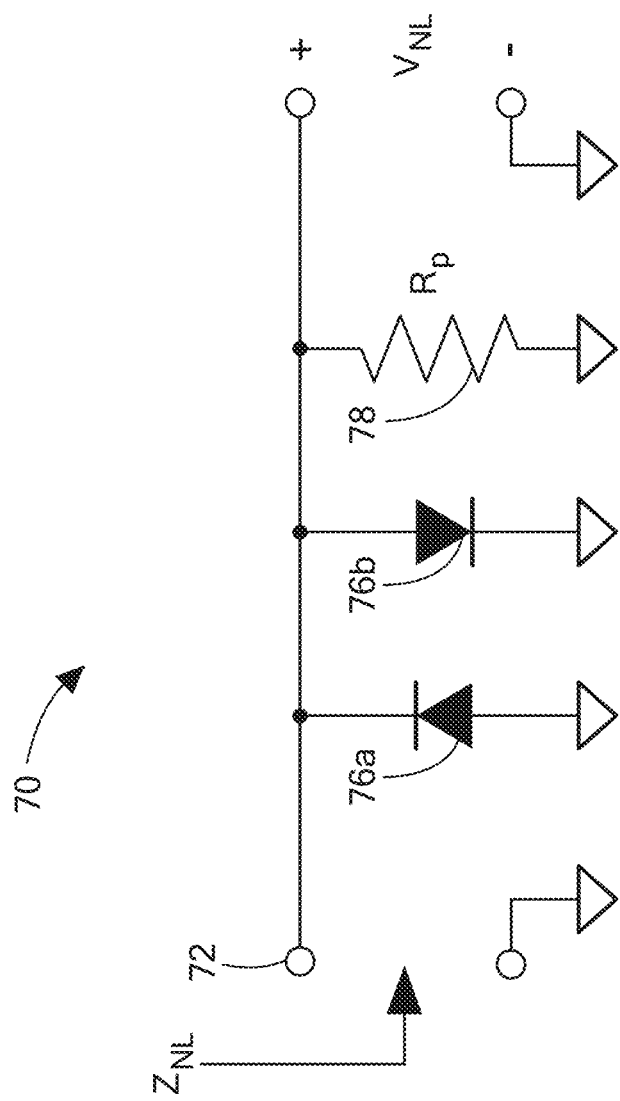
FIG. 54 is a circuit diagram of an illustrative nonlinear component for use within an RF-input/RF-output outphasing amplifier.
Figure 55:
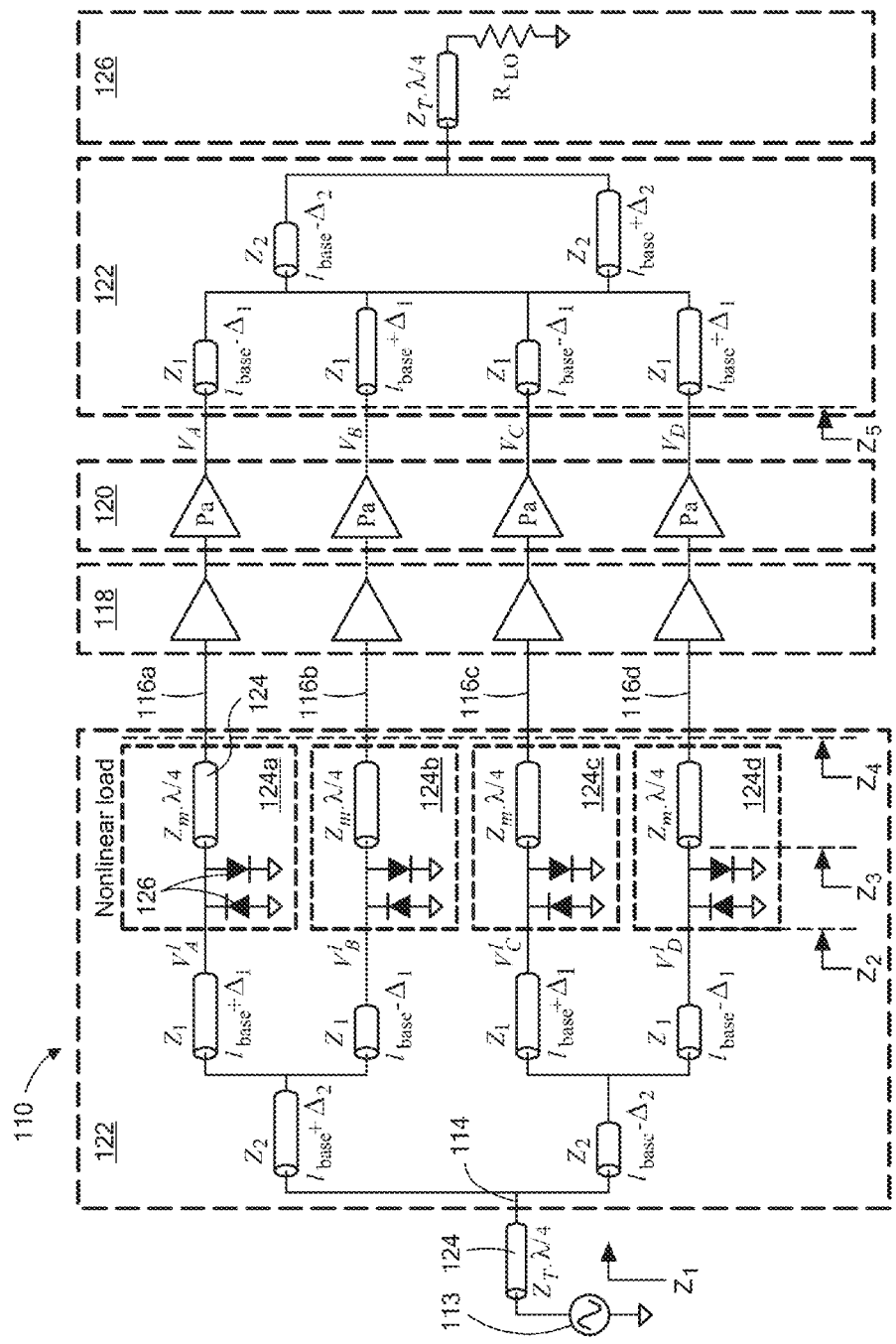
FIG. 55 is a circuit diagram of an RF-input/RF-output outphasing amplifier utilizing transmission line elements.

FIGS. 53-55 and the following disclosure allow a person skilled in the art to design and build an RFSDN 12 based on nonlinear loading of a passive network, such that both phase and amplitude modulation of RFSDN output signals is provided. Such designs are appropriate for driving branch amplifiers in an outphasing amplification system. Although the RF signal decomposition technique sought to be protected herein is described in the context of a multi-way lossless outphasing amplifier system (e.g., system 10), it should be recognized that the same approach can be taken in other systems, such as a two-way system with a Chireix power combiner.

Referring to FIG. 53, an RF-input/RF-output outphasing amplification system 40 includes an RFSDN 42 having an input port 44 to receive a modulated RF input signal and a plurality of output ports 47a-47d (generally denoted 47) coupled to respective ones of a plurality of branch signal paths 46a-46d (generally denoted 46). The branch signal paths 46 carry respective branch signals, which may be phase- and amplitude-modulated. In the embodiment shown, the system 40 includes a plurality of driver amplifiers 48, each having an input port coupled to a respective one of the RFSDN output ports 47 via a respective branch signal path 46, and an output port coupled to a respective one of a plurality of branch amplifiers 50. Driver amplifiers 48 can be used to provide additional gain, as required. In other embodiments, the branch amplifiers 50 may be coupled directly to the RFSDN output ports 47. The illustrative outphasing system 40 further includes a combiner network 52 having a plurality of inputs ports, each of which may be coupled to an output port of a respective branch amplifier 50, as shown.

The illustrative RFSDN 42 is comprised of a first set of reactive elements 43 having impedances $Z=-jX_2$ and $Z=+jX_2$ and a second set of reactive elements 45 having impedances $Z=-jX_1$ and $Z=+jX_1$. The reactive elements 43, 45 are each provided having specified reactance values which may be selected based upon a desired operating frequency. After reading the description provided herein, those of ordinary skill in the art will appreciate how to select values for $X_1$ and $X_2$. Factors that may be considered include operating frequency, desired range of power control though outphasing operation, and range of effective impedances for the nonlinear termination ($Z_{NL}$). In a particular embodiment, $X_1$ is approximately 35.6Ω and $X_2$ is approximately 48.781Ω.

Each of the branch signal paths 46 has coupled thereto a respective nonlinear component 54, with four branch signals 46a-46d and four nonlinear component 54a-54d shown in this example (i.e., M=2). The RFSDN 42 may be constructed of passive elements selected such that, when a modulated RF input signal is provided at input port 44, the voltages across the nonlinear component 54 provides the desired phases (and, for some implementations, amplitudes) for driving the branch amplifiers 50. It will be appreciated that this approach has several advantages, including providing both phase and amplitude modulation of the branch amplifiers 50 directly from a single modulated RF input signal without requiring an active control system, thereby avoiding cost and bandwidth limitations associated with active control.

A nonlinear component 54 may comprise any active or passive electrical component/element/device that provides a nonlinear relation between the voltage across it and the current through it. In some embodiments, at least one of the nonlinear components 54 corresponds to one or more lumped reactive and/or resistive elements, such as diodes, transistors, and varactors. In various embodiments, the nonlinear elements may be single-port or multi-port elements.

The RFSDN 12 is based on a resistance compression network (RCN), a network related to the multi-way outphasing system as described in D. J. Perreault, "A New Power Combining and Outphasing Modulation System for High-Efficiency Power Amplification," Circuits and Systems I: Regular Papers, IEEE Transactions on, vol. 58, no. 8, pp. 1713-1726, August 2011. The RFSDN 12 can exploit the relationship between the RCN and outphasing power combiner by synthesizing the inverse resistance compression network (IRCN) control law described in A. S. Jurkov and D. J. Perreault, "Design and control of lossless multi-way power combining and outphasing systems," in Midwest Symp. Circuits Syst., August 2011, pp. 1-4. This is also described in A. S. Jurkov, L. Roslaniec, and D. J. Perreault, "Lossless Multi-Way Power Combining and Outphasing for High-Frequency Resonant Inverters," IEEE Transactions on Power Electronics, Vol. 29, No. 4, pp. 1894-1908, April 2014. This control law is derived based on the relationship between RCNs and the power combining network, and provides branch PA loading conditions as indicated in A. S. Jurkov and D. J. Perreault, "Design and control of lossless multi-way power combining and outphasing systems," in Midwest Symp. Circuits Syst., August 2011, pp. 1-4 and in A. S. Jurkov, L. Roslaniec, and D. J. Perreault, "Lossless Multi-Way Power Combining and Outphasing for High-Frequency Resonant Inverters," IEEE Transactions on Power Electronics, Vol. 29, No. 4, pp. 1894-1908, Apr.il 2014. It is also appreciated that the RFSDN can be based on other network implementations, such as transmission-line resistance compression networks as described in T. W. Barton, J. M. Gordonson, and D. J. Perreault, "Transmission Line Resistance Compression Networks and Applications to Wireless Power Transfer," IEEE Journal of Emerging and Selected Topics in Power Electronics, Vol. 3, No. 1, pp. 252-260, March 2015.

The RFSDN 42 illustrated in FIG. 53 may be characterized as a four-way RCN structure having an input port ($V_{in}$) 44 and four output ports 47a-47d having coupled thereto generally identical loads $Z_{NL}$ (i.e., the loads provided by nonlinear components 54 in parallel with the loads at output ports 47). In various embodiments, input power is distributed equally to the four output ports 47 independent of input power level, so that the identical loads 54 are operated under identical input power conditions. This characteristic is important when the output ports 47 of the RCN are loaded with nonlinear elements (e.g., nonlinear component 54), as the equal output port powers ensures that the nonlinear elements have matched input characteristics. It will be appreciated that two-way (M=1) and higher-order (M>2) versions of an RFSDN 42 can be implemented based upon the concepts, techniques, and structures described herein.

Whereas the RFSDN 42 of FIG. 53 utilizes the IRON control law discussed above, it may be preferable to synthesize some other phase relationship such as one more related to the optimal susceptance control law (see, for example, A. S. Jurkov and D. J. Perreault, "Design and control of lossless multi-way power combining and outphasing systems," in Midwest Symp. Circuits Syst., August 2011, pp. 1-4). As long as the decomposition network is designed such that the input power is split evenly among the multiple nonlinear loads, the condition that these multiple nonlinear loads present identical input impedances to the decomposition network will be satisfied (otherwise the voltages across the nonlinear component can vary and the relative phases of the branch signals may become imbalanced).

FIG. 54 shows an example of a nonlinear component that may be used within an RF-input/RF-output outphasing amplifier. For example, the structure shown in FIG. 54 may correspond to one or more of the nonlinear components 54 of FIG. 53.

Referring to FIG. 54, a nonlinear component 70 may be provided as a network, as shown. In this example, the network comprises an input node 72, a resistor ($R_p$) 78 shunt coupled between the input node 72 and a reference potential (here shown as ground) and coupled in parallel with two opposing diodes 76a, 76b. The opposing diodes 76a, 76b are shunt coupled between the input node 72 and the reference potential. Due to its arrangement, the resistor ($R_p$) 78 is referred to herein as a "parallel resistor 78."

Although the nonlinear component 70 is shown as a one-port network, it should be appreciated that a two-port network having separate input and output ports could also be used in some applications.

It can be seen that when an input sinusoidal current has a magnitude sufficient to generate a voltage of at least the forward drop of a single diode 76, the voltage signal waveform will be a "clipped" version of the input current (i.e., a portion of the signal waveform will be truncated). As the input power is increased, the output voltage will remain clipped at the constant voltage of the forward drop of the diode, but the fundamental component of the current will increase with input power. As a result, for large input drives the effective input resistance $R_{NL}$ of this network will be approximately an inverse function of input power, with $R_{NL}$ approaching zero (or the series resistance of the biased diode in the non-ideal case) for large input signals. The effective input resistance of the opposing diode connection at the fundamental frequency as a function of the input voltage $V_{NL}$ can be found from a Fourier analysis and can be expressed as:

$$R_{diodes}(V_{NL}) = \frac{\pi r_{on}}{2}\left(\frac{\pi}{2} - a\sin\left(\frac{V_{ON}}{V_{NL}}\right) - \frac{V_{ON}}{V_{NL}}\sqrt{1 - \frac{V_{ON}^2}{V_{NL}^2}}\right)^{-1}, \quad (94)$$

$$|V_{NL}| > V_{ON}$$

assuming ideal diodes with turn-on voltage $V_{ON}$ and on-resistance $r_{on}$.

By including a parallel resistor 78 as shown, the network 70 is provided having an input impedance characteristic which appears as a constant resistance for low input amplitudes (when the input voltage is insufficient to turn on the diodes), and as a variable resistance at high input signal amplitudes (when the input resistance due to the diodes is small compared to the resistance of the parallel resistor 78), with a smooth transition in between the two extremes. The expression for input resistance to the network in FIG. 54 is then:

$$R_{NL}(V_{NL}) = \left(\frac{1}{R_p} + \frac{2}{\pi r_{on}}\left(\frac{\pi}{2} - a\sin\left(\frac{V_{ON}}{V_{NL}}\right) - \frac{V_{ON}}{V_{NL}}\sqrt{1 - \frac{V_{ON}^2}{V_{NL}^2}}\right)\right)^{-1}, \quad (95)$$

$$|V_{NL}| > V_{ON}.$$

When the network 70 is used as a termination for an RCN (e.g., four-way RFSDN 42 of FIG. 53), the RF signals at the output ports 47 are both phase and amplitude modulated as follows: for low input amplitudes insufficient to turn on the diodes, the load network 70 presents a constant input resistance, so that the phase relationship between the output ports 47 is constant. The four output port voltages 47a-47d are then proportional to the input voltage, and have a relationship which may be expressed as:

$$\begin{bmatrix} V_A \\ V_B \\ V_C \\ V_D \end{bmatrix} = v_{in} \frac{\sqrt{R_p^2 + X_1^2}}{2\sqrt{\left(\left(\frac{R_p^2 + X_1^2}{2R_p}\right)\right) + X_2^2}} \begin{bmatrix} e^{-j\phi} & e^{-j\theta} \\ e^{+j\phi} & e^{-j\theta} \\ e^{-j\phi} & e^{+j\theta} \\ e^{+j\phi} & e^{+j\theta} \end{bmatrix} \quad (96)$$

where $\theta = \operatorname{atan}\left(\frac{2R_p X_2}{R_p^2 + X_1^2}\right)$ and $\phi = \operatorname{atan}\left(\frac{X_1}{R_p}\right)$.

That is, the phases are constant and determined by the passive decomposition network design, and the magnitudes are proportional to the input voltage amplitude $V_{IN}$. The maximum input voltage for this operating condition can be found by solving for the input voltage amplitude for which the port voltage amplitudes equal the (ideal) diode threshold $V_{ON}$:

$$V_{in,threshold} = V_{ON} \frac{2\sqrt{(R_p^2 + X_1^2) + X_2^2}}{\sqrt{R_p^2 + X_1^2}}. \quad (97)$$

As the input to the RCN increases above this threshold level, the phase relationship of the four output ports 47a-47d varies with $V_{IN}$ through the relationship:

$$\begin{bmatrix} V_A \\ V_B \\ V \\ V_D \end{bmatrix} V_{in} \frac{\sqrt{R_{NL}^2 + X_1^2}}{2\sqrt{\left(\frac{R_{NL}^2 + X_1^2}{2R_{NL}}\right) + X_2^2}} \begin{bmatrix} e^{-j\phi} & e^{-j\theta} \\ e^{+j\phi} & e^{-j\theta} \\ e^{-j\phi} & e^{+j\theta} \\ e^{+j\phi} & e^{+j\theta} \end{bmatrix} \quad (98)$$

where $\theta = \operatorname{atan}\left(\frac{2R_{NL}X_2}{R_{NL}^2 + X_1^2}\right)$, $\phi = \operatorname{atan}\left(\frac{X_1}{R_{NL}}\right)$, and $R_{NA}$ is a function of the port voltage amplitudes as given in equation (95). The resulting phases of the four output ports can be found by simultaneously solving equations (95) and (98).

In a particular embodiment, $R_p$ is approximately 140Ω and $r_{on}$ is approximately 8Ω.

It should be appreciated that the type of nonlinearity useful for this sort of system is not limited to that which is achieved by the network shown in FIG. 54. A variety of nonlinearities can be used that shape the input resistance function of input amplitude in other manners, for example by including multiple diode paths that include series resistance. It is noted that while the implementation shown in FIG. 54 utilizes passive elements, it is possible to utilize active elements for the nonlinear components. It is likewise possible to realize alternative networks (including active networks) for the RCN function, such as using active circuits which emulate the function of the RCN and/or nonlinear resistive loads.

The outphasing amplifier of FIG. 53 utilizes power combining and passive signal decomposition networks comprised of lumped reactive elements. Alternatively, as illustrated in FIG. 55, signal decomposition networks can be implemented with distributed elements such as transmission line segments with lumped shunt reactive elements, or entirely distributed elements (e.g., all-microstrip implementations) similar to those described by T. W. Barton, J. L. Dawson, and D. J. Perreault in "Four-way lossless outphasing and power combining with hybrid microstrip/discrete combiner for microwave power amplification," IEEE MTT-S Int. Microw. Symp. Dig., June 2013, pp. 1-4 and/or by T. W. Barton, D. J. Perreault in "Four-way microstrip-based power combining for microwave outphasing power amplifiers," IEEE Trans. Circuits Syst.-I: Reg. Papers (Early Access) and/or by the transmission-line networks as described in T. W. Barton, J. M. Gordonson, and D. J. Perreault, "Transmission Line Resistance Compression Networks for Microwave Rectifiers," 2014 *International Microwave Symposium*, pp. 1-4, June 2014 and in T. W. Barton, J. M. Gordonson, and D. J. Perreault, "Transmission Line Resistance Compression Networks and Applications to Wireless Power Transfer," IEEE Journal of Emerging and Selected Topics in Power Electronics, Vol. 3, No. 1, pp. 252-260, March 2015. The lumped element version and the versions including transmission line segments with shunt reactive elements (whether lumped or microstrip) have nearly identical requirements for input phase relationships, with the exception of 90-degree offsets in certain branch signal paths (e.g., signal paths $V_A$ and $V_D$ in FIG. 55). It will be appreciated that a transmission-line network may be preferable for high carrier frequency applications.

FIG. 55 shows an alternative implementation of an RF-input/RF-output outphasing amplifier using transmission line segments. In this example, an outphasing amplification system 110 includes an RFSDN 112 having an input port 114 configured to receive a modulated RF input signal from a source 113 and a plurality of output ports coupled to respective ones of a plurality of branch signal paths 116. The branch signal paths 116 carry respective ones of phase-modulated (or phase- and amplitude-modulated) branch signals. In some embodiments, the system 110 includes a plurality of driver amplifiers 118, each having an input port coupled to a respective one of the RFSDN output ports and an output port coupled to a respective one of a plurality of branch amplifiers 120. In other embodiments, the branch amplifiers 120 are coupled directly to the RFSDN output ports. The illustrative outphasing system 110 further includes a combiner network 122 having a plurality of inputs ports, each of which may be coupled to an output port of a respective branch amplifier 120, as shown. Coupled along each of the branch signal paths 116 is a respective nonlinear component 124, with four branch signal paths 116a-116d and four nonlinear component 124a-124d shown in this example (i.e., M=2).

The RFSDN 112 and combiner network 122 may include a plurality of transmission-line segments arranged as shown or in any other suitable manner. The illustrative combiner network 122 may be matched to an all-transmission-line RFSDN 112 for an inverse-RCN-type control scheme.

Any suitable type of nonlinear component 124 may be used. In this example, as illustrated by component 124a, a nonlinear component is implemented as a network having a pair of opposing diodes 126 and a transmission-line segment 124 (e.g., a quarter wave transmission line) having a characteristic impedance $Z_m$, as shown. It will be appreciated that the illustrative nonlinear component 124a of FIG. 55 may be functionality similar to the nonlinear component 70 of FIG. 54, where the transmission-line segment 124 of FIG. 55 replaces the parallel resistor 78 of FIG. 53.

In some embodiments, the outphasing amplification system 110 includes an impedance-transforming element 124 coupled to the RFSDN input port 114 to provide impedance matching to an appropriate impedance, such as a complex impedance match to the impedance of the source 113. In this example, the impedance-transforming element 124 is provided as a quarter wave transmission-line.

The illustrative RFSDN 112 performs both ICRN control law-based outphasing of the branch amplifiers 120 (four branch amplifiers in this example) over a specified range and amplitude modulation below a nominal outphasing range. This combined behavior is achieved through nonlinear loading of an RCN—in this case, a transmission-line RCN (TLRCN). At the upper range of input powers, the nonlinear loads 124 behave as variable resistors, generating outphasing control angles correspond to the ICRN control law. Below a threshold level, the resistance is fixed and the four branch signals 116a-116d are amplitude-modulated with an input signal provided by the source 113.

The branch amplifiers 120 produce RF amplified signals $V_A$, $V_B$, $V_C$, and $V_D$, which have relative phase offsets to each other. In some embodiments, the relative phase offsets of amplified RF signals $V_A$, $V_B$, $V_C$, and $V_D$ are shown by the phasor diagram of FIG. 42.

After reading the description provided herein, one of ordinary skill in the art will now appreciate that the concepts, systems and techniques described herein overcome the limitations of previous outphasing power amplifier circuits and systems. In particular, the power combining and outphasing circuits, system and techniques described herein overcome the loss and reactive loading problems of prior art outphasing approaches. The power combining and outphasing circuits, system and techniques described herein provide ideally lossless power combining, along with substantially resistive loading of individual power amplifiers over a very wide output power range, enabling high average efficiency to be achieved even for large peak-to-average power ratios (PAPR). In addition, the disclosure provides for RF-input/RF-output amplification systems, overcoming the inability of prior outphasing systems to operate directly on a modulated RF input.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

The invention claimed is:

1. An outphasing amplification system comprising:
   a radio-frequency signal decomposition network (RFSDN) having:
      an input port coupled to receive an RF input signal;
      N branch signal paths, where N is an integer greater than or equal to two;
      at least one nonlinear component, each of the at least one nonlinear components coupled to a respective one of the branch signal paths; and
      N output ports, each of the output ports coupled to a respective one of the branch signal paths; and
   N branch amplifiers, each of the branch amplifiers having an input port coupled to receive a respective one of the RFSDN output ports and having an output port; and
   a combiner network having N inputs ports, each of the combiner network inputs port coupled to an respective one of the branch amplifier output ports.

2. The outphasing amplification system of claim 1 wherein the at least one nonlinear component is provided as a one-port device having a nonlinear impedance characteristic to radio-frequency (RF) signals provided thereto.

3. The outphasing amplification system of claim 1 wherein $N=2^M$, M is an integer greater than or equal to one, and wherein the RFSDN has at least N nonlinear components.

4. The outphasing amplification system of claim 1 wherein the at least one nonlinear component is configured to provide phase modulation at the output ports in response to amplitude modulation at the input port.

5. The outphasing amplification system of claim 1 wherein the at least one nonlinear component is configured such that, if an amplitude of the RF input signal is below a given threshold, relative phases at the output ports to remain fixed.

6. The outphasing amplification system of claim 1 wherein the RFSDN further comprises a resistance compression network (RCN).

7. The outphasing amplification system of claim 6 wherein the RFSDN has at least N nonlinear components and wherein the RCN is provided as an N-way RCN coupled to the at least N nonlinear components.

8. The outphasing amplification system of claim 1 wherein the RFSDN is configured to perform amplitude modulation for operation below a nominal outphasing range.

9. The outphasing amplification system of claim 1 wherein the RFSDN and the combiner network have a substantially inverse structural relationship.

10. The outphasing amplification system of claim 1 further comprising N driver amplifiers, each of the driver amplifiers having an input port coupled a to receive a respective one of the RFSDN output ports and having an output port coupled to a respective one of the branch amplifiers.

11. The outphasing amplification system of claim 1 wherein the at least one nonlinear component comprises an input node, a parallel resistor coupled between the input node and a ground, and two opposing diodes coupled between the input node and the ground.

12. An outphasing amplification system comprising:
   a radio-frequency signal decomposition network (RFSDN) having an input port, N branch signal paths, and N output ports, wherein in response to amplitude modulation of a signal at the input port, said RFSDN causes relative phase modulation in signals appearing at each of the N output ports, where N is an integer greater than or equal to two;
   N branch amplifiers, each of the branch amplifiers having an input port coupled to a respective one of the N RFSDN output ports and each one of the branch amplifiers having a branch amplifier output port with each output port of the N branch amplifiers coupled to a respective one of the branch signal paths;
   a combiner network having N inputs ports, each of the combiner network inputs port coupled to a respective one of the N branch amplifier output ports; and
   at least one nonlinear component, each of the at least one nonlinear components coupled to a respective one of the branch signal paths.

13. The outphasing amplification system of claim 12 wherein, in response to a signal at the RFSDN input port having an amplitude below a predetermined amplitude level, relative phases at the N RFSDN output ports remain fixed.

14. The outphasing amplification system of claim 12 wherein the at least one nonlinear component is provided as a one-port device.

15. The outphasing amplification system of claim 12 wherein $N=2^M$, M is an integer greater than or equal to one, and wherein the RFSDN has at least N nonlinear components.

16. The outphasing amplification system of claim 12 wherein the at least one nonlinear component comprises an input node, a resistor coupled between the input node and a ground, and two opposing diodes coupled between the input node and the ground.

17. The outphasing amplification system of claim 12 wherein the at least one nonlinear component is provided as a two-port device.

18. An outphasing amplification system comprising a radio-frequency signal decomposition network (RFSDN) having an input port and N output ports, wherein in response to amplitude modulation of a signal at the input port, said RFSDN causes relative phase modulation in signals appearing at each of the N output ports, where N is an integer greater than or equal to two; and wherein the RFSDN further comprises a resistance compression network (RCN).

19. The outphasing amplification system of claim 18 wherein the RFSDN has N nonlinear components and wherein the RCN is provided as an N-way RCN coupled to N nonlinear components.

* * * * *